(12) United States Patent
Park et al.

(10) Patent No.: US 10,020,424 B2
(45) Date of Patent: Jul. 10, 2018

(54) DISPLAY SUBSTRATE HAVING IMPROVED MANUFACTURABILITY

(71) Applicant: Samsung Display Co., Ltd., Yongin-Si, Gyeonggi-Do (KR)

(72) Inventors: Seung Hyun Park, Seoul (KR); Jun Ho Song, Seongnam-si (KR); Jean Ho Song, Yongin-si (KR); Jae Hak Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/452,407

(22) Filed: Mar. 7, 2017

(65) Prior Publication Data

US 2017/0336680 A1 Nov. 23, 2017

(30) Foreign Application Priority Data

May 19, 2016 (KR) ........................ 10-2016-0061401

(51) Int. Cl.
*H01L 33/38* (2010.01)
*H01L 33/36* (2010.01)
(Continued)

(52) U.S. Cl.
CPC .......... *H01L 33/38* (2013.01); *G02F 1/13306* (2013.01); *G02F 1/13439* (2013.01);
(Continued)

(58) Field of Classification Search
CPC ................. H01L 21/702; H01L 21/707; H01L 27/14692; H01L 29/4908; H01L 26/4983; H01L 29/51; H01L 29/66742; H01L 29/7394; H01L 29/786; H01L 29/78618; H01L 33/36; H01L 33/38; H01L 51/50; H01L 51/52; H01L 51/5203; H01L 51/5206; H01L 51/5209
See application file for complete search history.

(56) References Cited

U.S. PATENT DOCUMENTS 9,666,689 B2 * 5/2017 Kuwabara ......... H01L 29/66742
2002/0085157 A1 * 7/2002 Tanaka ................ G02F 1/13458
349/147

(Continued)

FOREIGN PATENT DOCUMENTS

KR 10-0750454 B1 8/2007

*Primary Examiner* — Eduardo A Rodela
(74) *Attorney, Agent, or Firm* — Innovation Counsel LLP

(57) ABSTRACT

A display substrate is provided. The display substrate includes a gate electrode disposed on a base; a gate insulating layer disposed on the base and covering the gate electrode; a semiconductor layer disposed on the gate insulating layer and overlapping the gate electrode; a source electrode and a drain electrode disposed on the semiconductor layer and connected to the semiconductor layer; a pixel electrode disposed on the gate insulating layer, connected to the drain electrode, and extending from the drain electrode; a common electrode insulated from the pixel electrode and overlapping the pixel electrode; and a semiconductor pattern disposed between the gate insulating layer and the pixel electrode, the semiconductor pattern overlapping the pixel electrode. The semiconductor pattern comprises a same material as the semiconductor layer and extends from the semiconductor layer.

29 Claims, 73 Drawing Sheets

(51) Int. Cl.
  *H01L 29/739* (2006.01)
  *H01L 51/52* (2006.01)
  *H01L 29/786* (2006.01)
  *H01L 27/146* (2006.01)
  *H01L 29/66* (2006.01)
  *G02F 1/133* (2006.01)
  *G02F 1/1333* (2006.01)
  *G02F 1/1337* (2006.01)
  *G02F 1/1343* (2006.01)
  *G02F 1/1362* (2006.01)

(52) U.S. Cl.
  CPC .. *G02F 1/133345* (2013.01); *G02F 1/133707* (2013.01); *G02F 1/134309* (2013.01); *G02F 1/136286* (2013.01); *H01L 27/14692* (2013.01); *H01L 29/66742* (2013.01); *H01L 29/7394* (2013.01); *H01L 29/786* (2013.01); *H01L 29/78618* (2013.01); *H01L 33/36* (2013.01); *H01L 51/5203* (2013.01); *H01L 51/5209* (2013.01); *G02F 2001/134345* (2013.01); *G02F 2201/121* (2013.01); *G02F 2201/123* (2013.01)

(56) References Cited

U.S. PATENT DOCUMENTS

| | | | |
|---|---|---|---|
| 2003/0213956 A1* | 11/2003 | Hioki | G02F 1/133305 257/59 |
| 2009/0152550 A1* | 6/2009 | Ohnuma | H01L 21/3105 257/57 |
| 2011/0031491 A1* | 2/2011 | Yamazaki | G02F 1/136227 257/43 |
| 2012/0104404 A1* | 5/2012 | Kwack | H01L 27/1288 257/72 |
| 2014/0132875 A1* | 5/2014 | Yun | H01L 29/66742 349/46 |

* cited by examiner

DISPLAY SUBSTRATE HAVING IMPROVED MANUFACTURABILITY

This application claims priority to Korean Patent Application No. 10-2016-0061401 filed on May 19, 2016 in the Korean Intellectual Property Office, the disclosure of which is incorporated herein by reference in its entirety.

BACKGROUND

1. Field of the Invention

The present disclosure relates generally to flat panel displays. More specifically, the present disclosure relates to display substrates having improved manufacturability.

2. Description of the Related Art

A liquid crystal display device, which is one of the most widely used flat panel display devices, applies a voltage to electrodes so as to realign liquid crystal molecules in a liquid crystal layer and thus to adjust the amount of light transmitted therethrough. The liquid crystal display device may include field-generating electrodes such as a pixel electrode and a common electrode, as well as a liquid crystal layer. The liquid crystal display device generates an electric field by applying voltages to the field-generating electrodes, and displays an image by controlling the alignment of liquid crystal molecules in the liquid crystal layer using the electric field.

The liquid crystal display device lends itself to fabrication as a thin display device, but has poorer side visibility than front visibility. To overcome this and other shortcomings of the liquid crystal display device, various methods for the alignment and driving of liquid crystal molecules have been developed. Particularly, to realize a wide viewing angle, a liquid crystal display device has been developed in which a pixel electrode and a common electrode are formed on a single substrate.

In this type of liquid crystal display device, at least one of two types of field-generating electrodes, i.e., a pixel electrode and a common electrode, is provided with a plurality of slits and a plurality of branch electrodes defined by the plurality of slits.

However, in a case in which two types of field-generating electrodes are provided in a liquid crystal display device, different photomasks are needed, and thus, the manufacturing cost of a liquid crystal display device increases.

SUMMARY

Exemplary embodiments of the present disclosure provide a display substrate capable of allowing two types of field-generating electrodes to be formed thereon in a cost-effective manner.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided a display substrate. The display substrate includes: a base; a gate electrode disposed on the base; a gate insulating layer disposed on the base and covering the gate electrode; a semiconductor layer disposed on the gate insulating layer and overlapping the gate electrode; a source electrode and a drain electrode disposed on the semiconductor layer and connected to the semiconductor layer; a pixel electrode disposed on the gate insulating layer, connected to the drain electrode, and extending from the drain electrode; a common electrode insulated from the pixel electrode and overlapping the pixel electrode; and a semiconductor pattern disposed between the gate insulating layer and the pixel electrode, the semiconductor pattern overlapping the pixel electrode. The semiconductor pattern comprises a same material as the semiconductor layer and extends from the semiconductor layer.

According to another exemplary embodiment of the present disclosure, there is provided a display substrate. The display substrate includes: a base; a semiconductor layer disposed on the base; a gate insulating layer disposed on the base and covering the semiconductor layer; a gate electrode disposed on the gate insulating layer and overlapping the semiconductor layer; a common electrode disposed on the gate insulating layer and comprising the same material as the gate electrode; an insulating layer disposed on the gate insulating layer and covering the gate electrode and the common electrode; a source electrode and a drain electrode disposed on the insulating layer and connected to the semiconductor layer; and a pixel electrode disposed on the insulating layer to overlap the common electrode, the pixel electrode being connected to the drain electrode so as to extend therefrom.

According to the exemplary embodiments, it is possible to form two types of field-generating electrodes on a single display substrate in a cost-effective manner.

Other features and aspects will be apparent from the following detailed description, the drawings, and the claims.

DETAILED DESCRIPTION OF THE EMBODIMENTS

Figure 1:
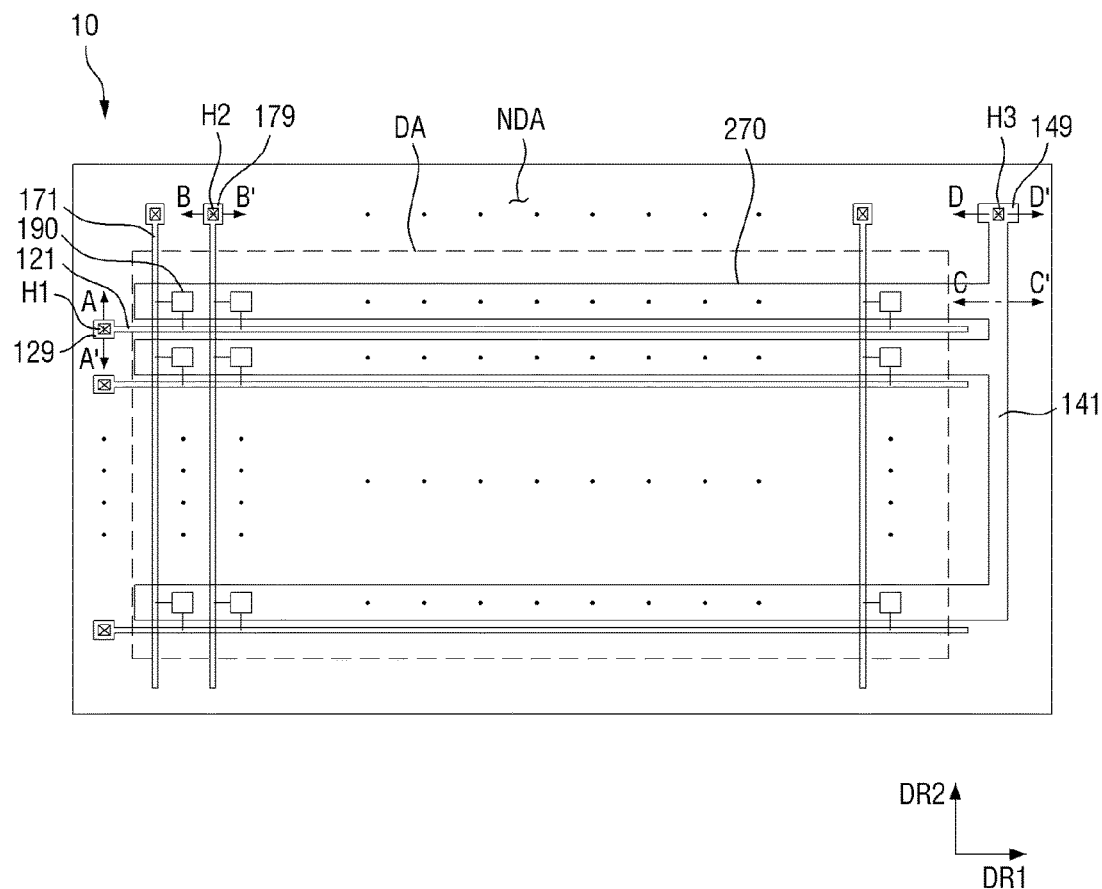
FIG. 1 is a schematic plan view of a display substrate according to an exemplary embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The various figures are not necessarily to scale. All numerical values are approximate, and may vary. All examples of specific materials and compositions are to be taken as nonlimiting and exemplary only. Other suitable materials and compositions may be used instead.

Hereinafter, embodiments of the present invention will be described with reference to the attached drawings.

FIG. 1 is a schematic plan view of a display substrate according to an exemplary embodiment of the present disclosure.

Referring to FIG. 1, a display substrate 10 may include a display area DA which displays an image, and a non-display area NDA which is disposed on the periphery of the display area DA. The non-display area NDA may be an area in which no image is displayed, and may account for an entire area except for the display area DA.

In the display area DA of the display substrate 10, a gate line 121 and a data line 171, which intersect each other and define a pixel region, may be provided.

The gate line 121, which transmits a gate signal, may extend substantially in a first direction DR1.

The data line 171, which transmits a data voltage, may be insulated from the gate line 121 and may extend in a second direction DR2 that crosses the first direction DR1.

In the display area DA of the display substrate 10, at least one switching device, which is connected to the gate line 121 and the data line 171, may be provided. In the pixel region, a pixel electrode 190 which is connected to the switching device, and a common electrode 270 which is disposed to overlap the pixel electrode 190, may be provided.

The common electrode 270 may be disposed on the same layer as the gate line 121. The common electrode 270 may be insulated from the gate line 121 and may be spaced apart from the gate line 121.

In a plan view, the common electrode 270 may extend substantially in the same direction as the gate line 121, i.e., in the first direction DR1, and may overlap the pixel electrode 190, but may not overlap the gate line 121.

In the non-display area NDA, a gate pad portion 129 and a data pad portion 179 may be provided.

The gate pad portion 129, which is connected to a first external driving circuit (for example, a gate driver) and transmits a gate signal to the gate line 121, may be connected to another layer or the first external driving circuit through a first hole H1. The gate pad portion 129 may be connected to the gate line 121. In some exemplary embodiments, the gate line 121 may partially extend into the non-display area NDA and may be connected to the gate pad portion 129. In some exemplary embodiments, the gate pad portion 129 may be disposed on a first side (for example, a left side) of the non-display area NDA of the display substrate 10.

The data pad portion 179, which is connected to another layer or a second external driving circuit (for example, a data driver) and transmits a data voltage to the data line 171, may be connected to another layer or the second external driving circuit through a second hole H2. The data pad portion 179 may be connected to the data line 171. In some exemplary embodiments, the data line 171 may partially extend into the non-display area NDA and may be connected to the data pad portion 179. In some exemplary embodiments, the data pad portion 179 may be disposed on a second side (for example, a top side) of the non-display area NDA of the display substrate 10, but the present disclosure is not limited thereto.

In the non-display area NDA, a common voltage line 141 and a common voltage pad portion 149 may be further provided.

The common voltage line 141 may be connected to the common electrode 270 in the display area DA. In some exemplary embodiments, the common voltage line 141 and the common electrode 270 may be disposed on the same layer, and the common electrode 270 may partially extend into the non-display area NDA and may be connected to the common voltage line 141. The common voltage line 141 may be disposed on an opposite side of the non-display area NDA to a side where the gate pad portion 129 is disposed. For example, the common voltage line 141 may be disposed on a third side (for example, a right side) of the display substrate 10.

In some exemplary embodiments, the common voltage line 141 may extend substantially in the second direction DR2 and may electrically connect the common electrode 270 and its neighboring common electrode(s) 270 in the second direction DR2.

The common voltage pad portion 149 is connected to another layer or a third external driving circuit (for example, a common voltage providing portion) and transmits a common voltage to the common electrodes 270. The common voltage pad portion 149 may be connected to another layer or to a third external driving circuit such as a common voltage providing portion, through a third hole H3. The common voltage pad portion 149 may be electrically connected to the common electrode 270. In some exemplary embodiments, the common voltage pad portion 149 may be physically connected to the common voltage line 141, but the present disclosure is not limited thereto. In some other exemplary embodiments, the common voltage pad portion 149 may be physically connected to the common electrode 270.

The display substrate 10 will hereinafter be described in further detail with reference to FIGS. 2 through 5.

Figure 2:
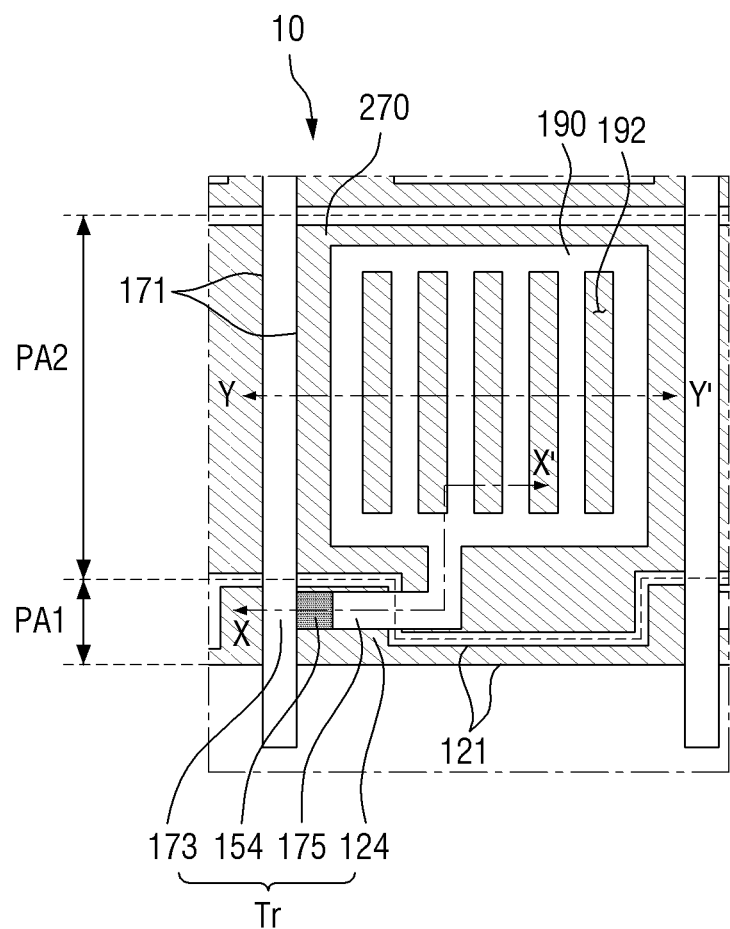
FIG. 2 is a schematic plan view of a pixel of the display substrate according to the exemplary embodiment of FIG. 1.
Figure 3:
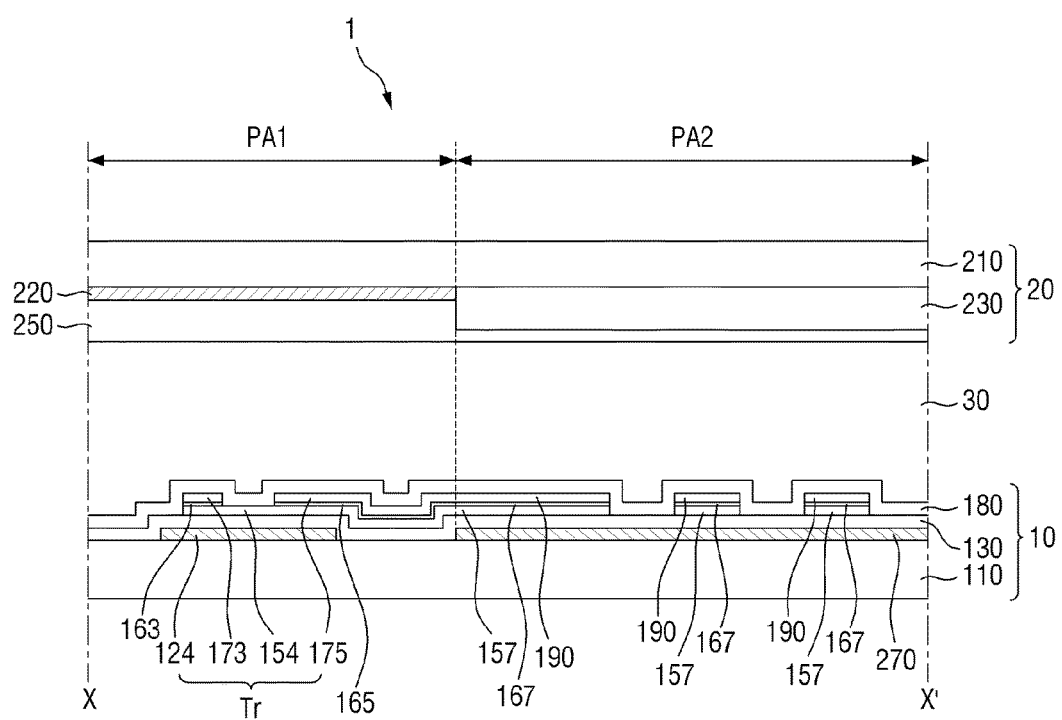
FIG. 3 is a cross-sectional view, taken along line X-X' of FIG. 2, of a display device including the display substrate according to the exemplary embodiment of FIG. 1.
Figure 4:
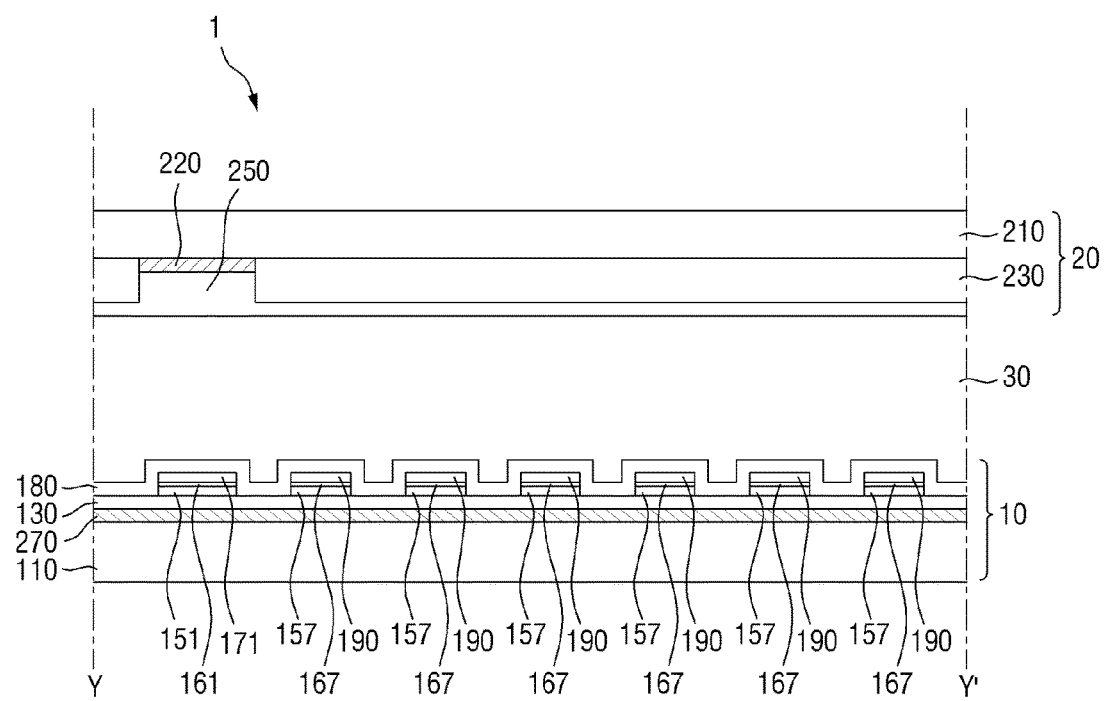
FIG. 4 is a cross-sectional view, taken along line Y-Y' of FIG. 2, of the display device including the display substrate according to the exemplary embodiment of FIG. 1.
Figure 5:
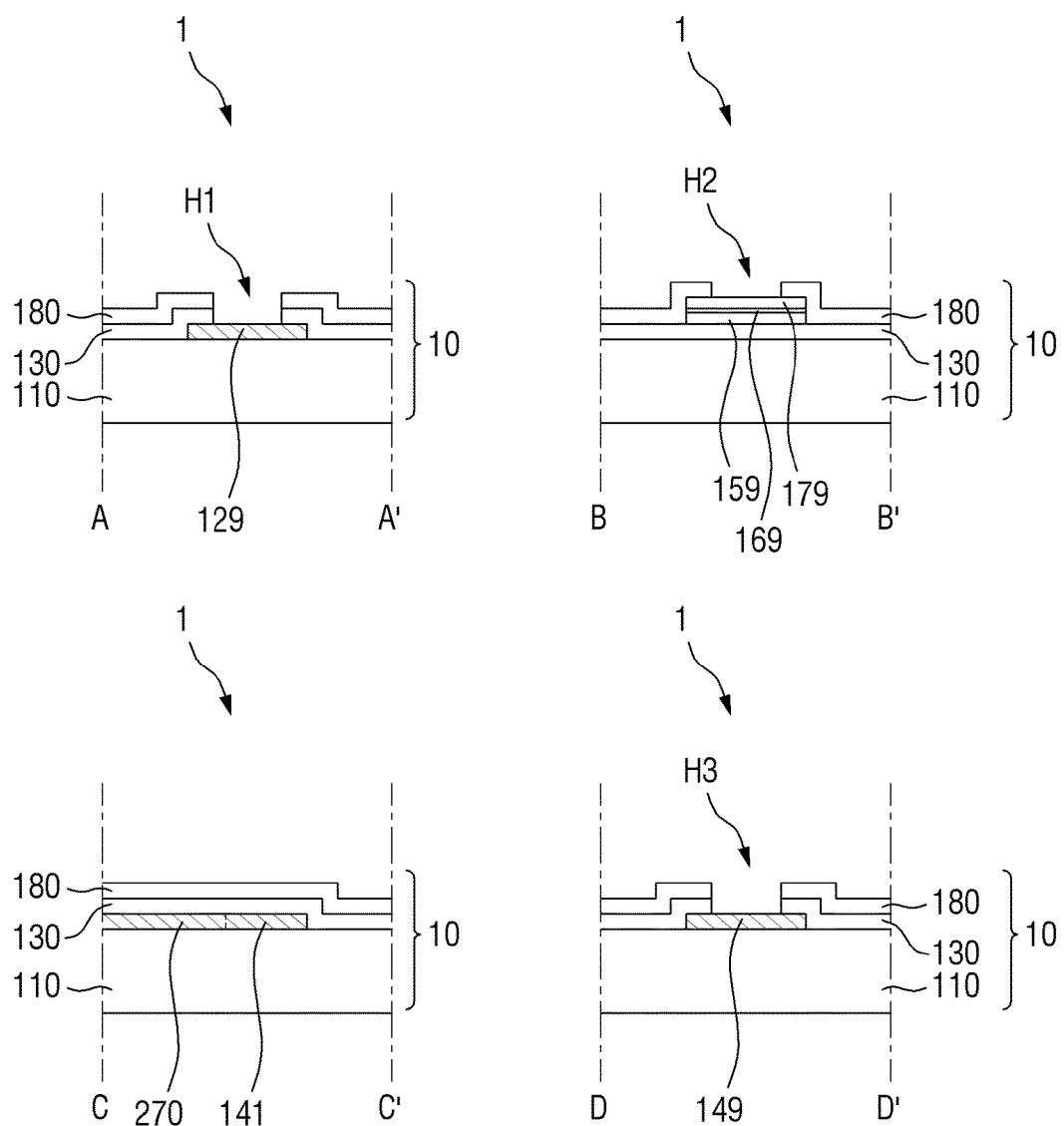
FIG. 5 is a cross-sectional view, taken along lines A-A', B-B', C-C', and D-D' of FIG. 1, of the display device including the display substrate according to the exemplary embodiment of FIG. 1.

FIG. 2 is a schematic plan view of a pixel of the display substrate according to the exemplary embodiment of FIG. 1; FIG. 3 is a cross-sectional view, taken along line X-X' of FIG. 2, of a display device including the display substrate according to the exemplary embodiment of FIG. 1; FIG. 4 is a cross-sectional view, taken along line Y-Y' of FIG. 2, of the display device including the display substrate according to the exemplary embodiment of FIG. 1; and FIG. 5 is a cross-sectional view, taken along lines A-A', B-B', C-C', and D-D' of FIG. 1, of the display device including the display substrate according to the exemplary embodiment of FIG. 1.

Referring to FIGS. 1 through 5, a display device 1 may include the display substrate 10, a counter substrate 20 which faces the display substrate 10, and a liquid crystal layer 30 which is disposed between the display substrate 10 and the counter substrate 20.

The display substrate 10 will hereinafter be described in further detail.

The display substrate 10 includes a first base 110 that may include an insulating substrate. For example, the first base 110 may include a glass substrate, a quartz substrate, or a transparent resin substrate. The first base 110 may comprise a polymer or plastic with high thermal resistance. In some exemplary embodiments, the first base 110 may be flexible. That is, the first base 110 may be a flexible insulating substrate that may be deformable through rolling, folding, or bending. The first base 110 may have a structure in which layers are deposited on an insulating substrate.

A gate conductor (121, 124, and 129) may be disposed on the first base 110. In some exemplary embodiments, the gate conductor (121, 124, and 129) may be disposed directly on the first base 110.

The gate conductor (121, 124, and 129) may include the gate line 121, the gate electrode 124, and the gate pad portion 129. As mentioned above, the gate line 121 and the gate electrode 124 may be disposed in the display area DA of the display substrate 10, and the gate pad portion 129 may be disposed in the non-display area NDA of the display substrate 10. The gate line 121 transmits a gate signal and may extend substantially in the first direction DR1. The gate electrode 124 may project from the gate line 121. The gate pad portion 129, which is connected to another layer or an external driving circuit such as a gate driver and transmits a gate signal to the gate line 121, may be connected to the gate line 121.

The gate conductor (121, 124, and 129) may comprise a conductive material. In some exemplary embodiments, the gate conductor (121, 124, and 129) may comprise a metal material with desirable reflectivity, i.e., a reflective metal. For example, the reflective metal may be aluminum (Al), an Al-based metal such as an Al alloy, silver (Ag), or an Ag-based metal such as an Ag alloy. The gate conductor (121, 124, and 129) may have a single-layer structure, but the present disclosure is not limited thereto. Alternatively, the gate conductor (121, 124, and 129) may have a multilayer structure consisting of at least two conductive layers having different physical properties.

Part of the display area DA in and around which the gate line 121 and the gate electrode 124 are disposed will hereinafter be referred to as a first area PA1, and part of the display area DA that differs from the first area PA1 will hereinafter be referred to as a second area PA2, as shown for example in FIG. 2.

A common conductor (270, 141, and 149) may be disposed on the first base 110. The common conductor (270, 141, and 149) may be disposed on the same layer as the gate conductor (121, 124, and 129). For example, in a case in which the gate conductor (121, 124, and 129) is disposed directly on the first base 110, the common conductor (270, 141, and 149) may also be disposed directly on the first base 110.

The common conductor (270, 141, and 149) may include the common electrode 270, the common voltage line 141, and the common voltage pad portion 149. As mentioned above, the common electrode 270 may be disposed in the display area DA of the display substrate 10, and the common voltage line 141 and the common voltage pad portion 149 may be disposed in the non-display area NDA of the display substrate 10.

The common electrode 270, which has a flat planar shape, may be disposed in the second area PA2 of the display substrate 10, but not in the first area PA1. The common electrode 270 may be spaced apart from the gate line 121 and the gate electrode 124, and may be insulated from the gate line 121 and the gate electrode 124.

The common voltage line 141, which transmits a common voltage to the common electrode 270, may be connected to the common electrode 270. The common electrode 270 and its neighboring common electrode(s) 270 in the second direction DR2 may be electrically connected by the common voltage line 141.

The common voltage pad portion 149 may be connected to another layer or to an external driving circuit such as a common voltage providing portion, and may thus be provided with a common voltage. The common voltage provided to the common voltage portion 149 may be transmitted to the common electrode 270 through the common voltage line 141.

The common conductor (270, 141, and 149) may comprise a conductive material. In some exemplary embodiments, the common conductor (270, 141, and 149) may comprise a metal material with desirable reflectivity, i.e., a reflective metal. For example, the reflective metal may be Al, an Al-based metal such as an Al alloy, Ag, or an Ag-based metal such as an Ag alloy. That is, the common electrode 270 may be a reflective electrode, and the display device 1 may be a reflective liquid crystal display (LCD) device. The common conductor (270, 141, and 149) and the gate conductor (121, 124, and 129) may be formed at the same time using the same material.

The common conductor (270, 141, and 149) may, although need not necessarily, have the same stack structure as the gate conductor (121, 124, and 129). For example, in a case in which the gate conductor (121, 124, and 129) has a single-layer structure, the common conductor (270, 141, and 149) may also have a single-layer structure. Alternatively, in a case in which the gate conductor (121, 124, and 129) has a multilayer structure, the common conductor (270, 141, and 149) may also have a multilayer structure.

A gate insulating layer 130 may be disposed on the gate conductor (121, 124, and 129) and the common conductor (270, 141, and 149). The gate insulating layer 130 may be formed on the first base 110 to cover the gate conductor (121, 124, and 129) and the common conductor (270, 141, and 149), and the gate conductor (121, 124, and 129) and the common conductor (270, 141, and 149) may be insulated from each other by the gate insulating layer 130. The gate insulating layer 130 may be formed of an insulating material. For example, the gate insulating layer 130 may be formed of silicon nitride (SiNx), silicon oxide (SiOx), or silicon oxynitride (SiOxNy). The gate insulating layer 130 may have a single-layer structure or may have a multilayer structure consisting of at least two insulating layers having different physical properties.

A semiconductor layer 154 may be disposed on the gate insulating layer 130. The semiconductor layer 154 may be disposed in the first area PA1 and may overlap the gate electrode 124. The semiconductor layer 154 may comprise amorphous silicon, polycrystalline silicon, or an oxide semiconductor.

A plurality of ohmic contacts (163 and 165) may be disposed on the semiconductor layer 154. The ohmic contacts (163 and 165) may include a source ohmic contact 163 which is disposed below a source electrode 173 that will be described later, and a drain ohmic contact 165 which is disposed below a drain electrode 175 that will be described later. The ohmic contacts 163 and 165 may be formed of, for example, silicide or n+ hydrogenated amorphous silicon doped with a high concentration of n-type impurities.

A data conductor (171, 173, 175, and 179) may be disposed on the gate insulating layer 130. The data conductor (171, 173, 175, and 179) may include a data line 171, the source electrode 173, the drain electrode 175, and a data pad portion 179.

The data line 171, the source electrode 173, and the drain electrode 175 may be disposed in the display area DA of the display substrate 10, and the data pad portion 179 may be disposed in the non-display area NDA of the display substrate 10. The source electrode 173 and the drain electrode 175 may be disposed in the first area PA1 of the display area DA.

The source electrode 173 may be disposed on the source ohmic contact 163, and the pattern shape of the source electrode 173 may be substantially the same as the pattern shape of the source ohmic contact 163. The expression "two elements having substantially the same pattern shape", as used herein, denotes that the two elements have almost the same shape in a plan view or the sides of the two elements are disposed on the same line in a cross-sectional view. The source electrode 173 may be connected to the data line 171 and may overlap the gate electrode 124. In some exemplary embodiments, as illustrated in FIG. 2, the source electrode 173 may not project from the data line 171 but may be disposed substantially on the same line as the data line 171, however the present disclosure is not limited thereto. That is, alternatively, the source electrode 173 may project or extend from the data line 171 to the top of the gate electrode 124.

The drain electrode 175 may be disposed on the drain ohmic contact 165, and the pattern shape of the drain electrode 175 may be substantially the same as the pattern shape of the drain ohmic contact 165. The drain electrode 175 may be spaced apart from the source electrode 173 over the gate electrode 124, and may be disposed to face the source electrode 173.

The data line 171 transmits a data signal and may extend substantially in the second direction DR2 to intersect the gate line 121.

In some exemplary embodiments, a first semiconductor pattern 151 and a data ohmic contact 161 may be further provided between the data line 171 and the gate insulating layer 130, and the data ohmic contact 161 may be disposed between the first semiconductor pattern 151 and the data line 171. The data line 171, the first semiconductor pattern 151, and the data ohmic contact 161 may all have substantially the same pattern shape. The first semiconductor pattern 151 may comprise the same material as the semiconductor layer 154 and may be connected to the semiconductor layer 154. The data ohmic contact 161 may comprise the same material as the source ohmic contact 163 and the drain ohmic contact 165, and may be connected to the source ohmic contact 163.

Similarly, a second semiconductor pattern 159 and a data pad ohmic contact 169 may be further provided between the data pad portion 179 and the gate insulating layer 130, and the data pad ohmic contact 169 may be disposed between the second semiconductor pattern 159 and the data pad portion 179. The data pad portion 179, the second semiconductor pattern 159, and the data pad ohmic contact 169 may all have substantially the same pattern shape. The second semiconductor pattern 159 may comprise the same material as the first semiconductor pattern 151 and the semiconductor layer 154 and may be connected to the first semiconductor pattern 151. The data pad ohmic contact 169 may comprise the same material as the data ohmic contact 161, the source ohmic contact 163, and the drain ohmic contact 165 and may be connected to the data ohmic contact 161.

The data conductor (171, 173, 175, and 179) may comprise a conductive material such as Al, copper (Cu), Ag, molybdenum (Mo), chromium (Cr), titanium (Ti), tantalum (Ta), or an alloy thereof. Alternatively, the data conductor (171, 173, 175, and 179) may comprise a transparent conductive material such as indium tin oxide (ITO), indium zinc oxide (IZO), zinc oxide (ZO), carbon nanotube, graphene, or Ag nanowire (AgNW). For example, the data conductor (171, 173, 175, and 179) may have a single-layer structure, but the present disclosure is not limited thereto. Alternatively, the data conductor (171, 173, 175, and 179) may have a multilayer structure.

The gate electrode 124, the source electrode 173, and the drain electrode 175 may form a switching device, for example, a thin-film transistor (TFT) Tr, together with the semiconductor layer 154. The TFT Tr may be disposed in the first area PA1 of the display area DA.

A pixel electrode 190 with a plurality of slits 192 may be disposed on the gate insulating layer 130. The pixel electrode 190 may be disposed in the second area PA2 and may be overlapped by the common electrode 270, which is a flat planar structure. The pixel electrode 190 may be formed on the same layer as the data conductor (171, 173, 175, and 179) and may comprise the same material as the data conductor (171, 173, 175, and 179). For example, the pixel electrode 190 may comprise a conductive material such as Al, Cu, Ag, Mo, Cr, Ti, Ta, or an alloy thereof or a transparent conductive material such as ITO, IZO, ZO, carbon nanotube, graphene, or AgNW.

The pixel electrode 190 may extend from the drain electrode 175 and may be connected to the drain electrode 175. In other words, the pixel electrode 190 may be formed as one body with the drain electrode 175.

The pixel electrode 190 may have the same stack structure as the data conductor (171, 173, 175, and 179). For example, in a case in which the data conductor (171, 173, 175, and 179) has a single-layer structure, the pixel electrode 190 may also have a single-layer structure. Alternatively, in a case in which the data conductor (171, 173, 175, and 179) has a multilayer structure, the pixel electrode 190 may also have a multilayer structure.

A third semiconductor pattern 157 and a pixel ohmic contact 167 may be further provided between the pixel electrode 190 and the gate insulating layer 130, and the pixel ohmic contact 167 may be disposed between the third semiconductor pattern 157 and the pixel electrode 190. The pixel electrode 190, the third semiconductor pattern 157, and the pixel ohmic contact 167 may all have substantially the same pattern shape. The third semiconductor pattern 157 may comprise the same material as the semiconductor layer 154 and may be connected to the semiconductor layer 154. The pixel ohmic contact 167 may comprise the same material as the source ohmic contact 163 and the drain ohmic contact 165, and may be connected to the drain ohmic contact 165.

In some exemplary embodiments, in a case in which the semiconductor layer 154, the first semiconductor pattern 151, the second semiconductor pattern 159, and the third semiconductor pattern 157 comprise an oxide semiconductor, the source ohmic contact 163, the drain ohmic contact 165, the data ohmic contact 161, the data pad ohmic contact 169, and the pixel ohmic contact 167 may not be provided.

An insulating layer 180 may be disposed on the gate insulating layer 130, the TFT Tr, the data conductor (171, 173, 175, and 179), and the pixel electrode 190. The insulating layer 180 may comprise an insulating material. In some exemplary embodiments, the insulating layer 180 may comprise an inorganic insulating material such as silicon oxide, silicon nitride, or silicon oxynitride. The insulating layer 180 may protect the TFT Tr and may also protect the data conductor (171, 173, 175, and 179) and the pixel electrode 190.

A first hole H1 which exposes part of the gate pad portion 129, and a third hole H3 which exposes part of the common voltage pad portion 149, may be formed in the gate insulating layer 130 and the insulating layer 180. A second hole H2, which exposes part of the data pad portion 179, may be formed in the insulating layer 180.

Although not illustrated in FIGS. 1 through 5, a first alignment layer may be disposed on the insulating layer 180. The first alignment layer may be a horizontal alignment layer and may be rubbed in a uniform direction, but the present disclosure is not limited thereto. The first alignment layer may comprise a photoreactive material and may be photo-aligned. In a case in which the first alignment layer is disposed on the insulating layer 180, portions of the first alignment layer corresponding to the first hole H1, the second hole H2, and the third hole H3 may be removed.

The counter substrate 20 will hereinafter be described.

The counter substrate 20 may include a second base 210, a light-blocking member 220, and a color filter 230, and may further include an overcoat layer 250.

The second base 210 may include an insulating substrate. For example, the second base 210 may include a glass substrate, a quartz substrate, or a transparent resin substrate. The second base 210 may comprise a polymer or plastic with high thermal resistance. In some exemplary embodiments, the second base 210 may be flexible.

The light-blocking member 220 may be disposed on the second base 210. The light-blocking member 220 is also referred to as a black matrix, and prevents light leakage. In some exemplary embodiments, the light-blocking member 220 may overlap the TFT Tr, the gate line 121, and the data line 171.

The color filter 230 may be disposed on the second base 210. The color filter 230 may overlap the pixel electrode 190. The color filter 230 may comprise a photosensitive organic composition having a pigment for realizing a color. For example, the color filter 230 may be formed of a photosensitive organic material having at least one of a red pigment, green pigment, and a blue pigment, but the present disclosure is not limited thereto.

The overcoat layer 250 may be disposed on the color filter 230 and the light-blocking member 220. In some exemplary embodiments, the overcoat layer 250 may be formed of an insulating material. The overcoat layer 250 may prevent the color filter 230 from being exposed to the liquid crystal layer 30 and may provide a flat surface, but the present disclosure is not limited thereto. In some exemplary embodiments, the overcoat layer 250 may not be provided.

Although not illustrated in FIGS. 1 through 5, a second alignment layer may be disposed on the overcoat layer 250. The second alignment layer may be a horizontal alignment layer and may be rubbed in a uniform direction. Alternatively, the second alignment layer may comprise a photoreactive material and may be photo-aligned.

The liquid crystal layer 30 may be disposed between the counter substrate 20 and the display substrate 10. The liquid crystal layer 30 may have positive or negative dielectric anisotropy. Liquid crystal molecules in the liquid crystal layer 30 may be aligned to be pretilted in a particular direction. The direction in which the liquid crystal molecules are pretilted may vary depending on the dielectric anisotropy of the liquid crystal layer 30. In some exemplary embodiments, the liquid crystal layer 30 may comprise a nematic liquid crystal material having positive dielectric anisotropy, and the liquid crystal molecules of the liquid crystal layer 30 may be aligned so as for their long axes to be in parallel to the display substrate 10 and the counter substrate 20.

In the present exemplary embodiment, the gate conductor (121, 124, and 129) and the common conductor (270, 141, and 149) may be formed using a single photomask. The data conductor (171, 173, 175, and 179), the pixel electrode 190, the semiconductor layer 154, the first semiconductor pattern 151, the second semiconductor pattern 159, and the third semiconductor pattern 157 may be formed using a single mask. Accordingly, the number of masks used in the fabrication of a display substrate or a display device may be reduced.

Figure 6:
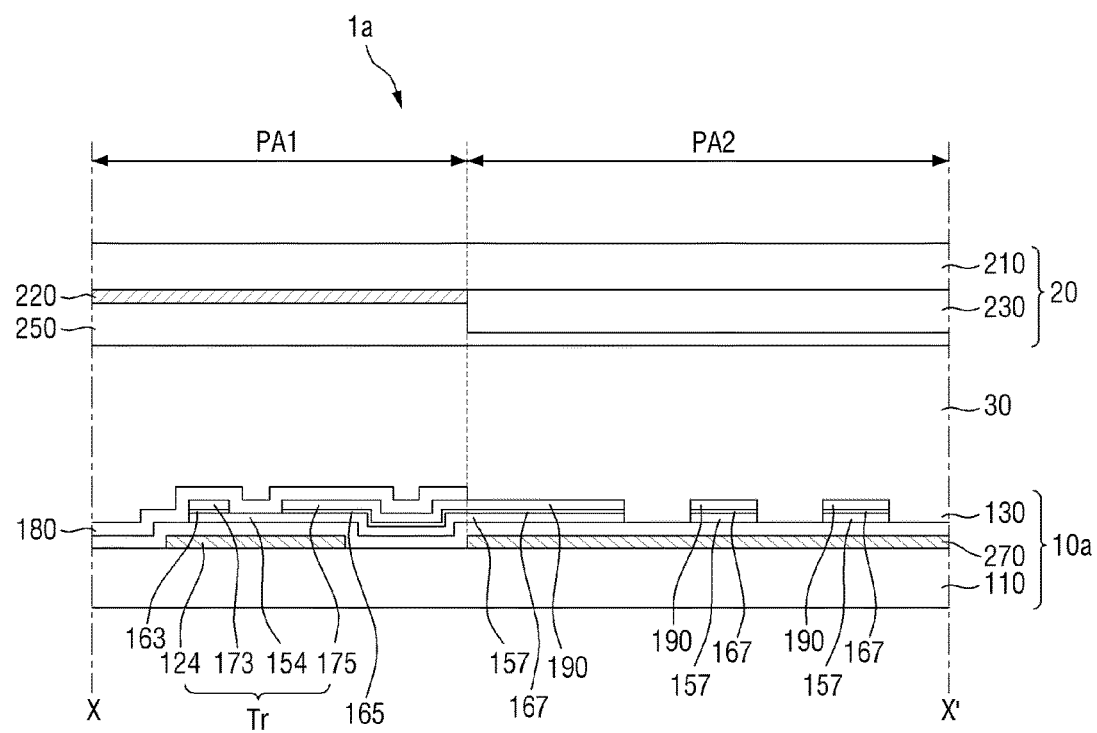
FIG. 6 is a cross-sectional view, taken along line X-X' of FIG. 2, of a display device including a display substrate according to another exemplary embodiment of the present disclosure.
Figure 7:
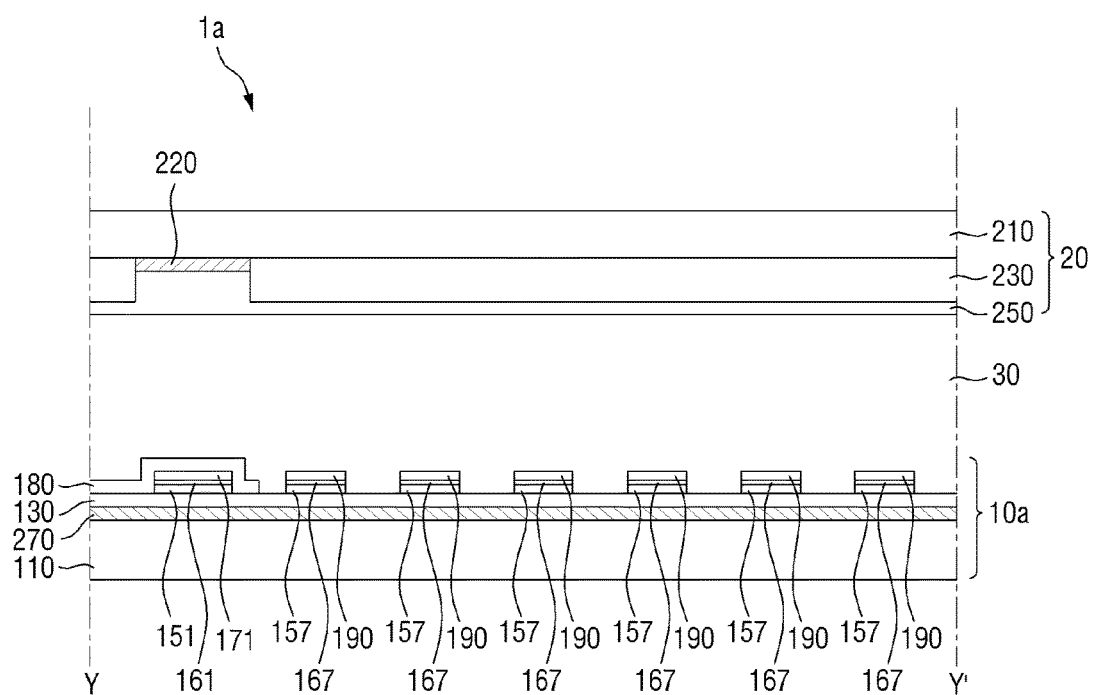
FIG. 7 is a cross-sectional view, taken along line Y-Y' of FIG. 2, of the display device including the display substrate according to the exemplary embodiment of FIG. 6.

FIG. 6 is a cross-sectional view, taken along line X-X' of FIG. 2, of a display device including a display substrate according to another exemplary embodiment of the present disclosure; FIG. 7 is a cross-sectional view, taken along line Y-Y' of FIG. 2, of the display device including the display substrate according to the exemplary embodiment of FIG. 6; and FIG. 8 is a cross-sectional view, taken along lines A-A', B-B', C-C', and D-D' of FIG. 1, of the display device including the display substrate according to the exemplary embodiment of FIG. 6.

Figure 8:
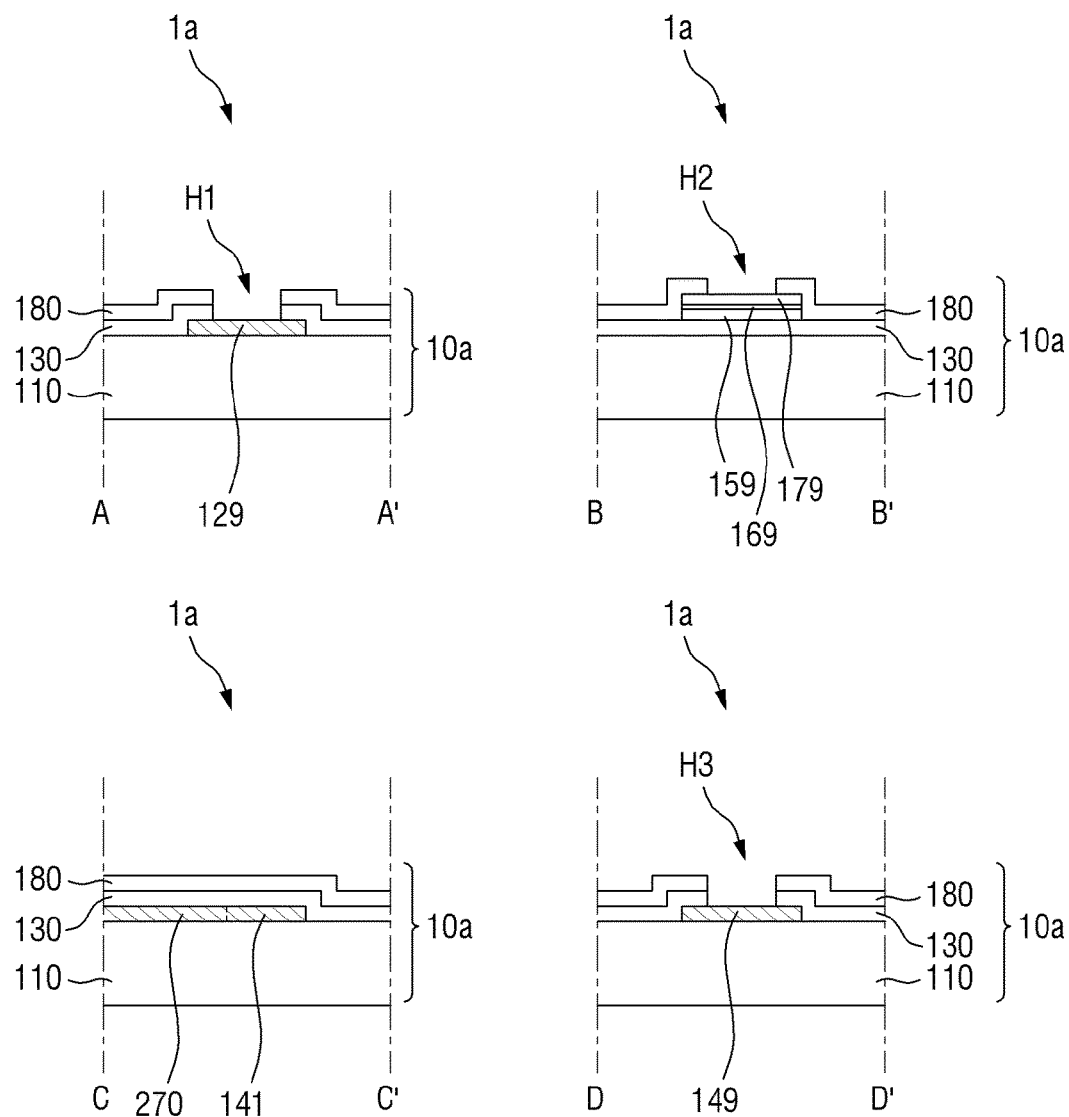
FIG. 8 is a cross-sectional view, taken along lines A-A', B-B', C-C', and D-D' of FIG. 1, of the display device including the display substrate according to the exemplary embodiment of FIG. 6.

Referring to FIGS. 6 through 8, a display device 1a may include a display substrate 10a, a counter substrate 20, and a liquid crystal layer 30.

The display substrate 10a of the display device 1a is substantially the same as the display substrate 10 of FIGS. 2 through 5 except that no insulating layer 180 is disposed on pixel electrode 190. Thus, a detailed description of the display substrate 10a will be omitted.

Figure 9:
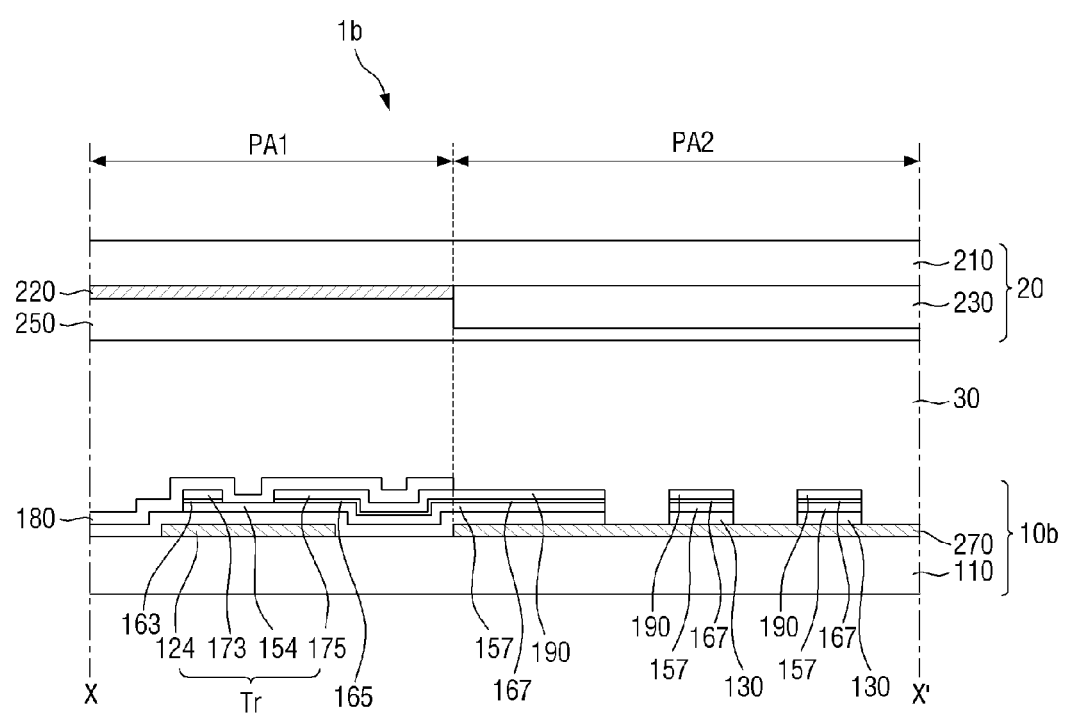
FIG. 9 is a cross-sectional view, taken along line X-X' of FIG. 2, of a display device including a display substrate according to another exemplary embodiment of the present disclosure.
Figure 10:
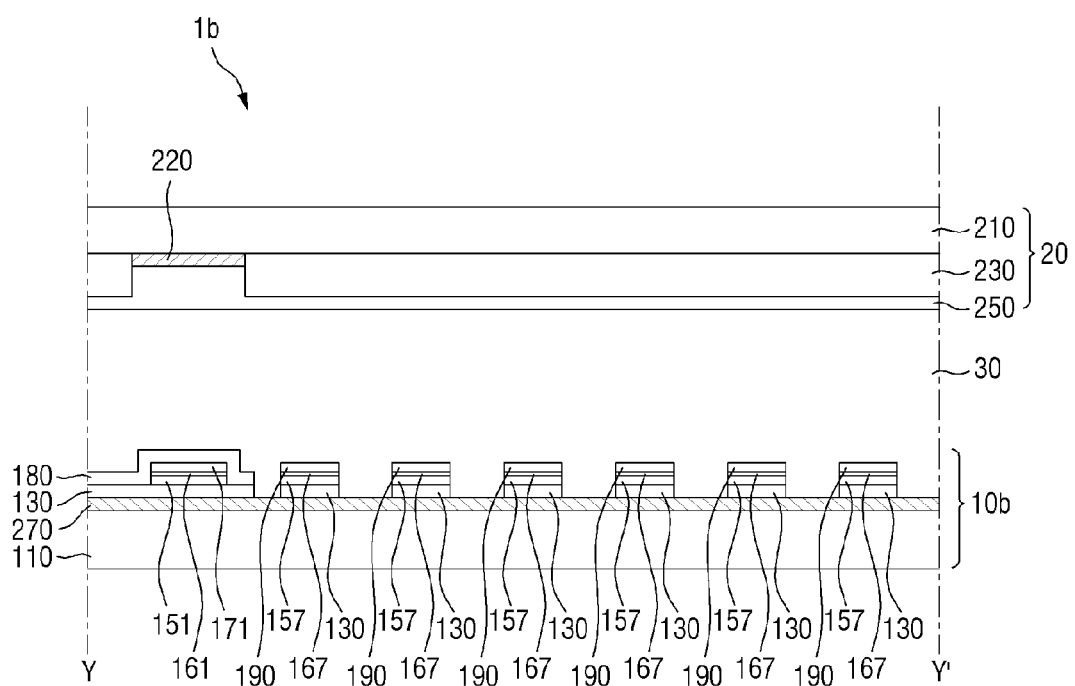
FIG. 10 is a cross-sectional view, taken along line Y-Y' of FIG. 2, of the display device including the display substrate according to the exemplary embodiment of FIG. 9.
Figure 11:
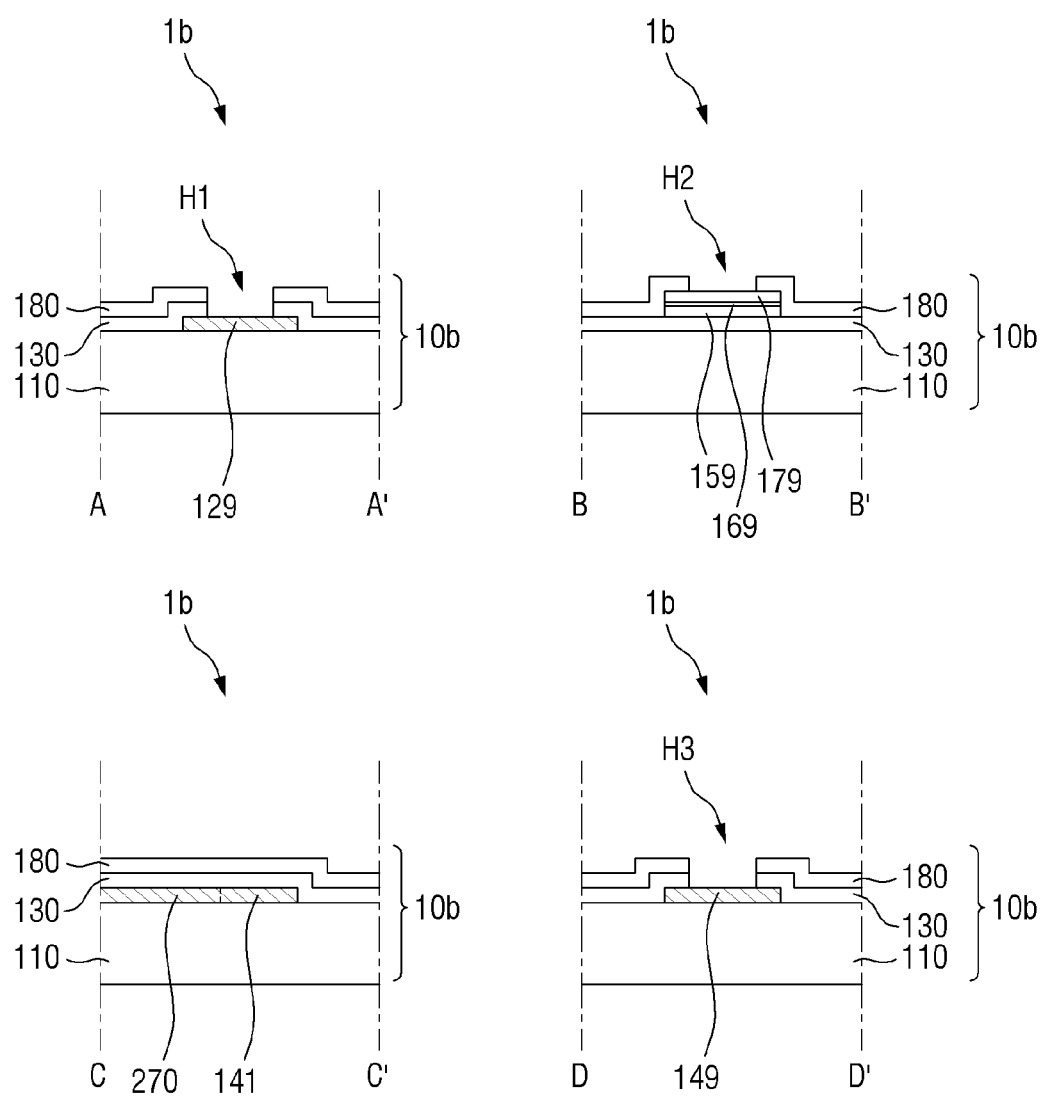
FIG. 11 is a cross-sectional view, taken along lines A-A', B-B', C-C', and D-D' of FIG. 1, of the display device including the display substrate according to the exemplary embodiment of FIG. 9.

FIG. 9 is a cross-sectional view, taken along line X-X' of FIG. 2, of a display device including a display substrate according to another exemplary embodiment of the present disclosure; FIG. 10 is a cross-sectional view, taken along line Y-Y' of FIG. 2, of the display device including the display substrate according to the exemplary embodiment of FIG. 9; and FIG. 11 is a cross-sectional view, taken along lines A-A', B-B', C-C', and D-D' of FIG. 1, of the display device including the display substrate according to the exemplary embodiment of FIG. 9.

Referring to FIGS. 9 through 12, a display device 1b may include a display substrate 10b, a counter substrate 20, and a liquid crystal layer 30.

The display substrate 10b of the display device 1b is substantially the same as the display substrate 10 of FIGS. 2 through 5 except that no insulating layer 180 is disposed on pixel electrode 190, that portions of gate insulating layer 130 corresponding to slits of the pixel electrode 190 are removed, and that the gate insulating layer 130 is formed into the same pattern shape as the pixel electrode 190. Thus, a detailed description of the display substrate 10b will be omitted.

A method of fabricating a display device according to an exemplary embodiment of the present disclosure will hereinafter be described with reference to FIGS. 1 through 5 and 12 through 47. In FIGS. 1 through 5 and 12 through 47, like reference numerals indicate like elements, and thus, detailed descriptions thereof will be omitted.

FIGS. 12 through 47 are cross-sectional views illustrating a method of fabricating the display substrate illustrated in FIGS. 3 through 5.

Figure 12:
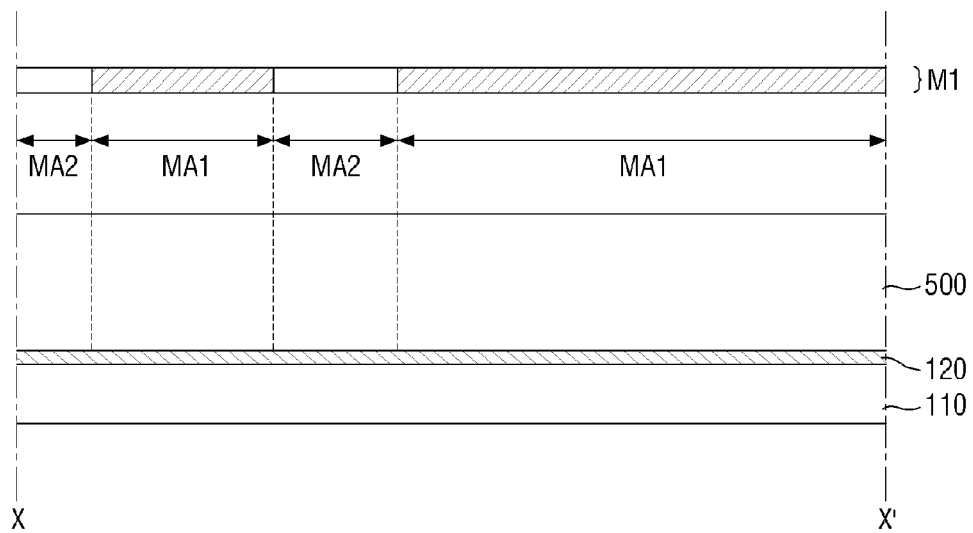
FIGS. 12 through 47 are cross-sectional views illustrating a method of fabricating the display substrate illustrated in FIGS. 3 through 5.
Figure 13:
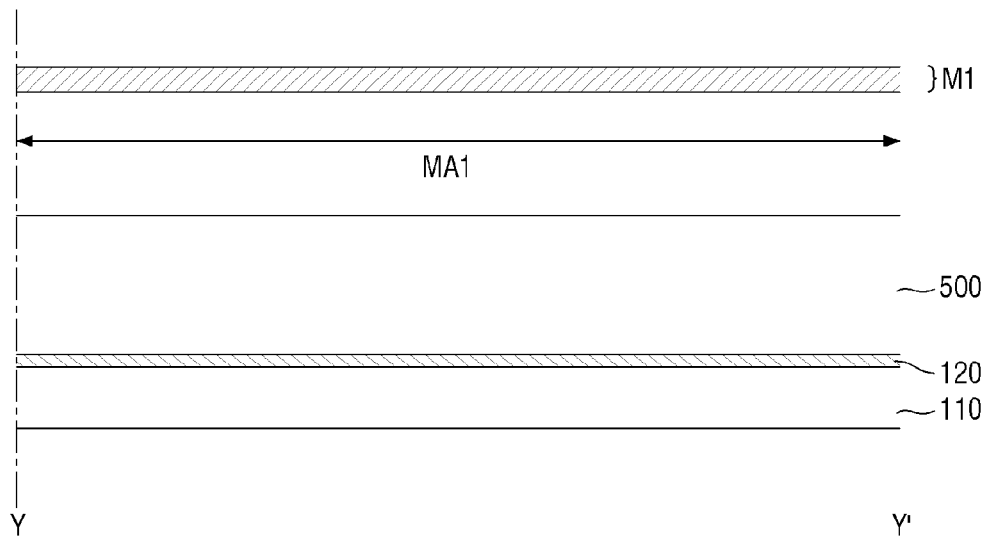
Figure 14:
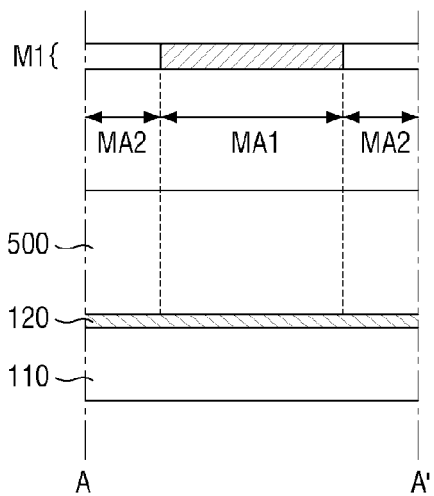
Figure 14:
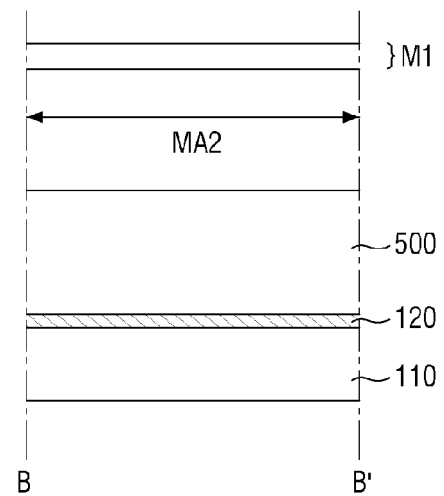
Figure 14:
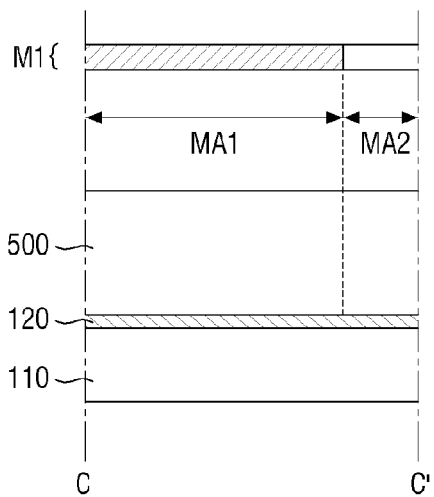
Figure 14:
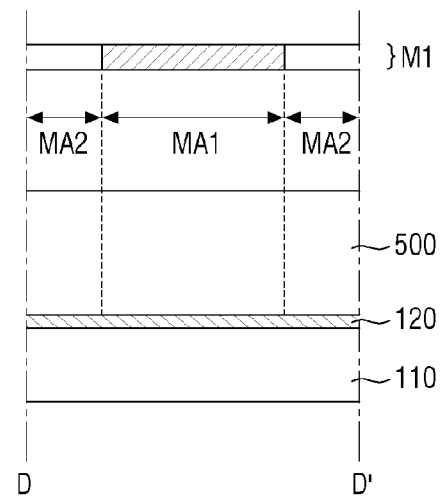

Referring to FIGS. 12 through 14, a gate conductive layer 120 is formed on a first base 110. The gate conductive layer 120 may comprise a conductive material. In some exemplary embodiments, the gate conductive layer 120 may comprise a metal material with excellent reflectivity, i.e., a reflective metal. For example, the reflective metal may be Al, an Al-based metal such as an Al alloy, Ag, or an Ag-based metal such as an Ag alloy.

Thereafter, a first photosensitive layer 500 is formed on the gate conductive layer 120. The first photosensitive layer 500 may be negative photoresist or positive photoresist. For convenience, it is assumed that the first photosensitive layer 500 is positive photoresist.

Figure 15:
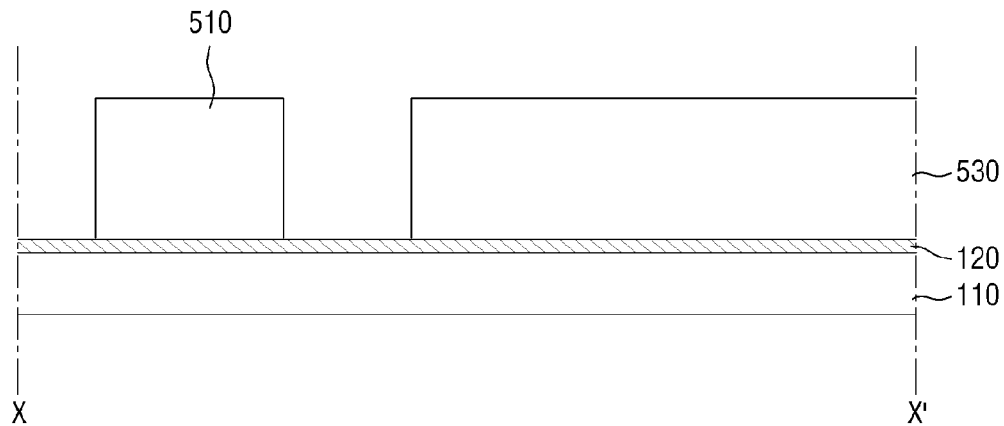
Figure 16:
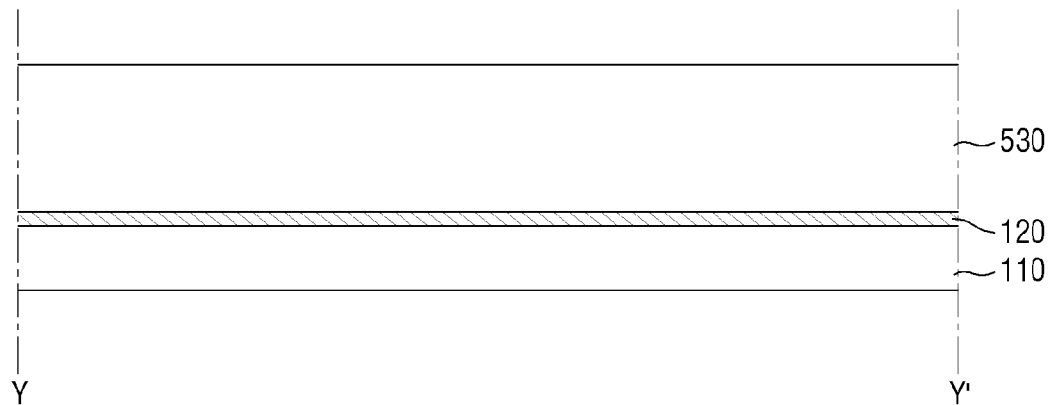
Figure 17:
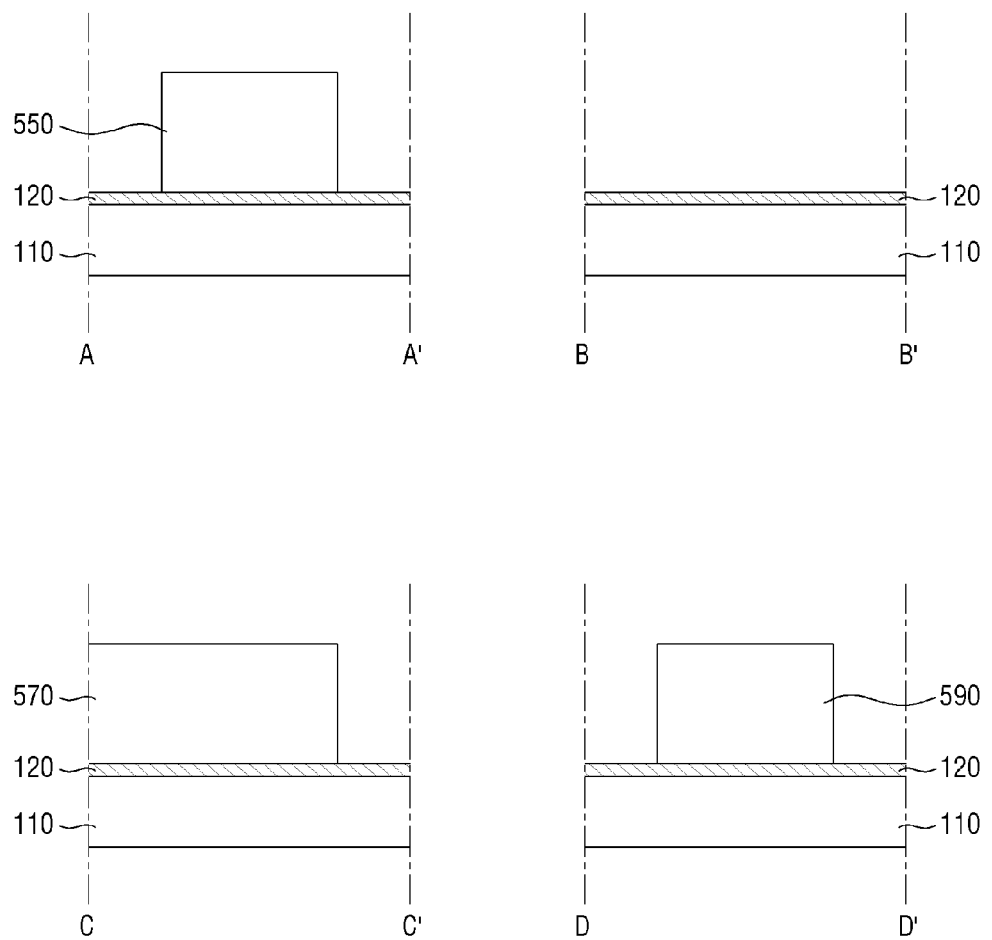

Light is selectively applied to the first photosensitive layer 500 using a first mask M1. The first mask M1 includes blocking areas MA1 which completely block the transmission of light therethrough, and transmissive areas MA2 which completely or substantially transmit light therethrough, and light transmitted through the first mask M1 is provided to the first photosensitive layer 500. Referring to FIGS. 15 through 17, by developing the first photosensitive layer 500 exposed by the first mask M1, a first photosensitive pattern 510, a second photosensitive pattern 530, a third photosensitive pattern 550, a fourth photosensitive pattern 570, and a fifth photosensitive pattern 590 are formed in areas corresponding to the blocking areas MA1, and the first photosensitive layer 500 is removed from areas corresponding to the transmissive areas MA2. The first photosensitive layer pattern 510 may be formed to correspond to an area in which a gate electrode and a gate line are to be formed, the second photosensitive layer pattern 530 may be formed to correspond to an area in which a common electrode in a display area is to be formed, the third photosensitive layer pattern 550 may be formed to correspond to an area in which a gate pad portion is to be formed, the fourth photosensitive layer pattern 570 may be formed to correspond to an area in which a common electrode in a non-display area and a common voltage line are to be formed, and the fifth photosensitive layer pattern 590 may be formed to correspond to an area in which a common voltage pad portion is to be formed.

Figure 18:
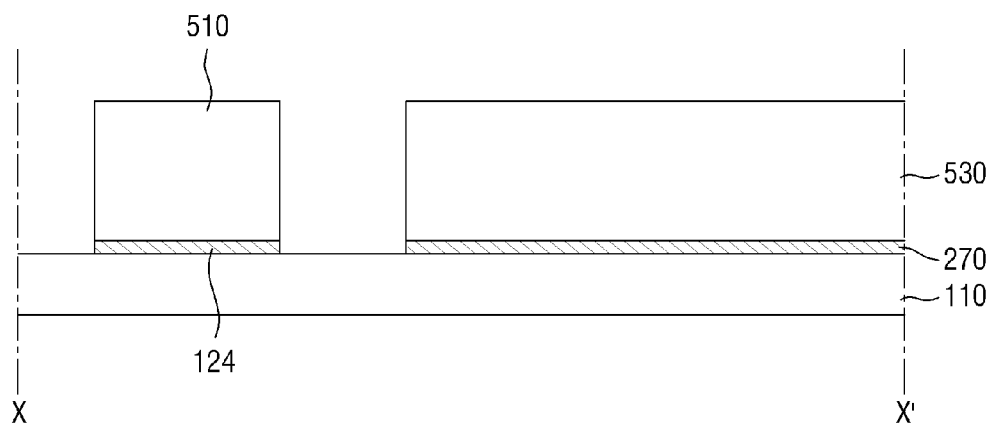
Figure 19:
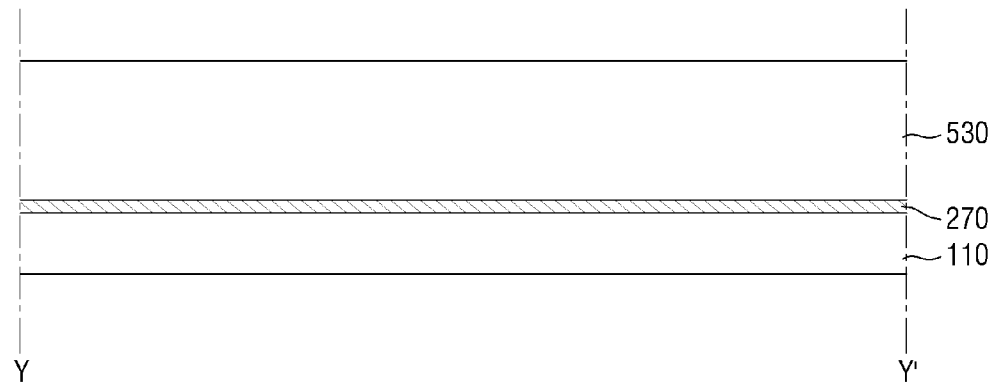
Figure 20:
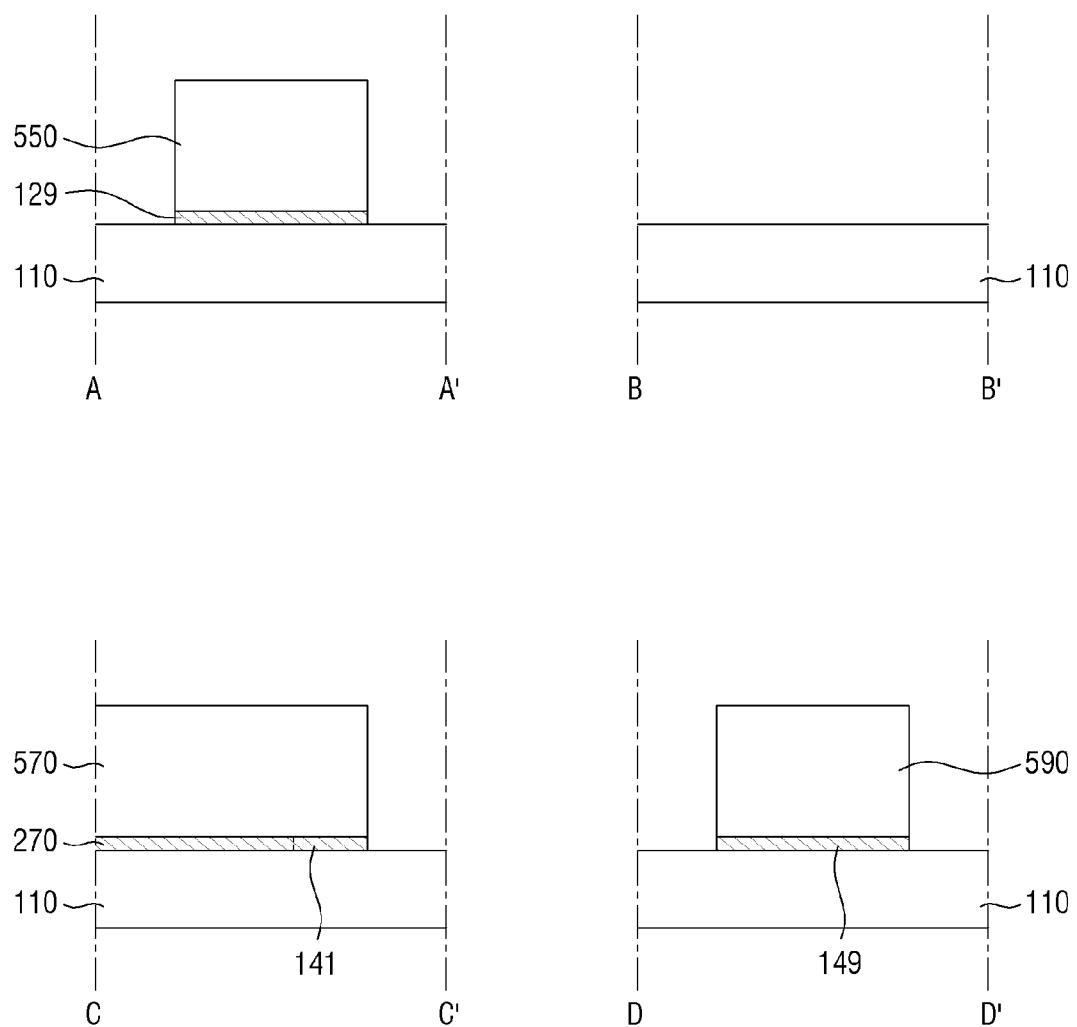

Thereafter, referring to FIGS. 18 through 20, a common electrode 270, a common voltage line 141, a common voltage pad portion 149, a gate line (not illustrated), a gate electrode 124, and a gate pad portion 129 are formed on the first base 110 by etching the gate conductive layer 120 using the first photosensitive layer pattern 510, the second photosensitive layer pattern 530, the third photosensitive layer pattern 550, the fourth photosensitive layer pattern 570, and the fifth photosensitive layer pattern 590 as masks.

Figure 21:
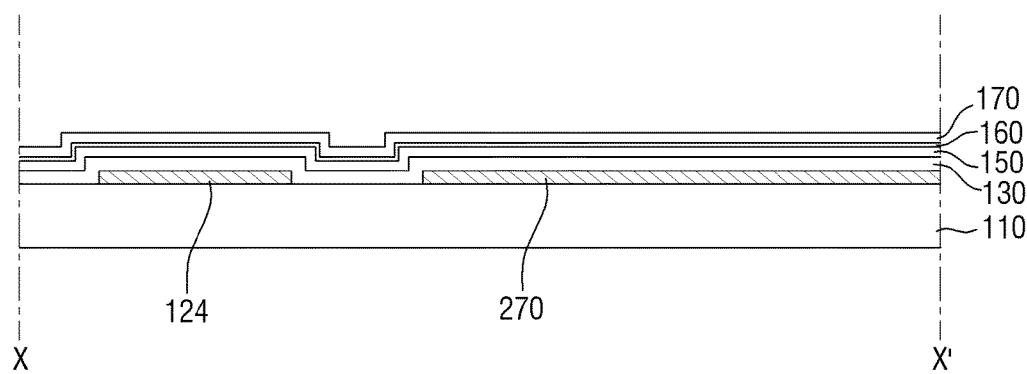
Figure 22:
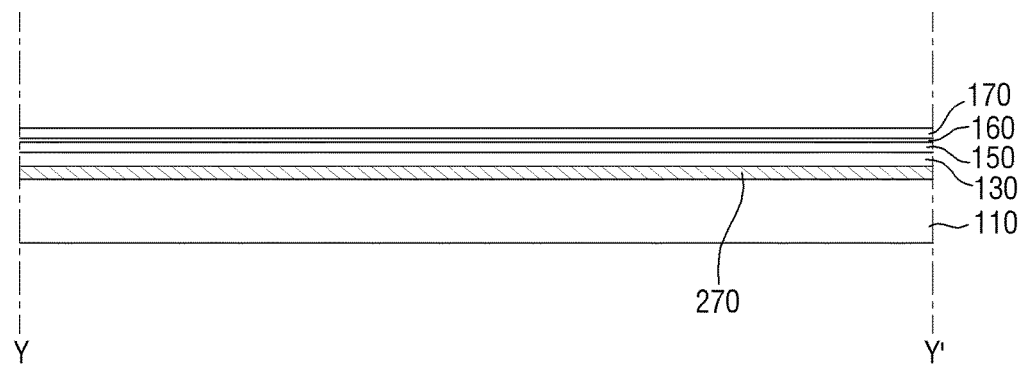
Figure 23:
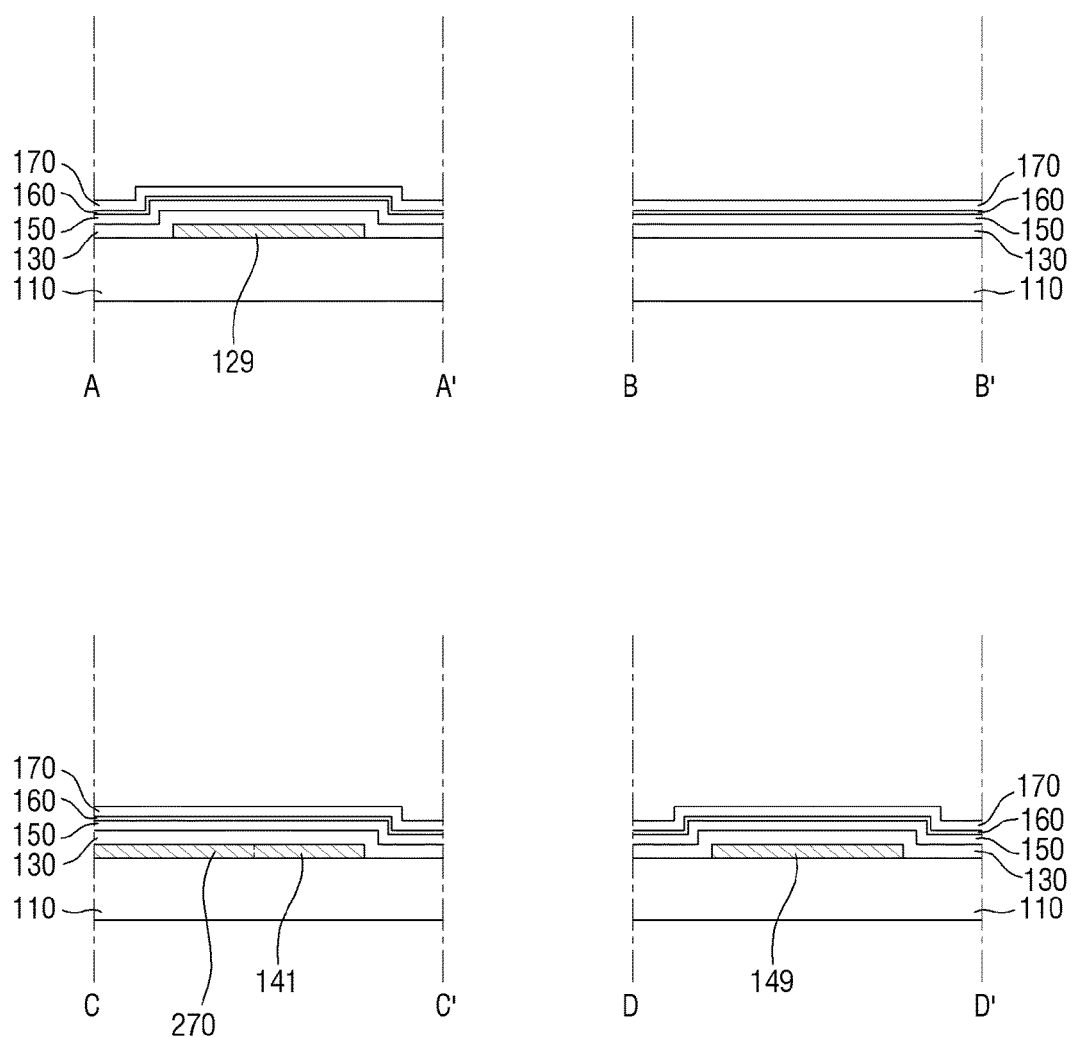

Thereafter, referring to FIGS. 21 through 23, the first photosensitive layer pattern 510, the second photosensitive layer pattern 530, the third photosensitive layer pattern 550, the fourth photosensitive layer pattern 570, and the fifth photosensitive layer pattern 590 are removed. Then, a gate insulating layer 130 is formed on the first base 110 where the common electrode 270, the common voltage line 141, the common voltage pad portion 149, the gate line (not illustrated), the gate electrode 124, and the gate pad portion 129 are formed, and a semiconductor material layer 150, an ohmic contact layer 160, and a data conductive layer 170 are sequentially formed on the gate insulating layer 130.

The semiconductor material layer 150 may comprise amorphous silicon, polycrystalline silicon, or an oxide semiconductor.

The ohmic contact layer 160 may comprise n+ hydrogenated amorphous silicon or silicide. In a case in which the semiconductor material layer 150 comprises an oxide semiconductor, the ohmic contact layer 160 may not be provided.

The data conductive layer 170 may comprise a conductive material such as Al, Cu, Ag, Mo, Cr, Ti, Ta, or an alloy thereof, and a data conductor (171, 173, 175, and 179) may comprise a transparent conductive material such as ITO, IZO, ZO, carbon nanotube, graphene, or AgNW.

Figure 24:
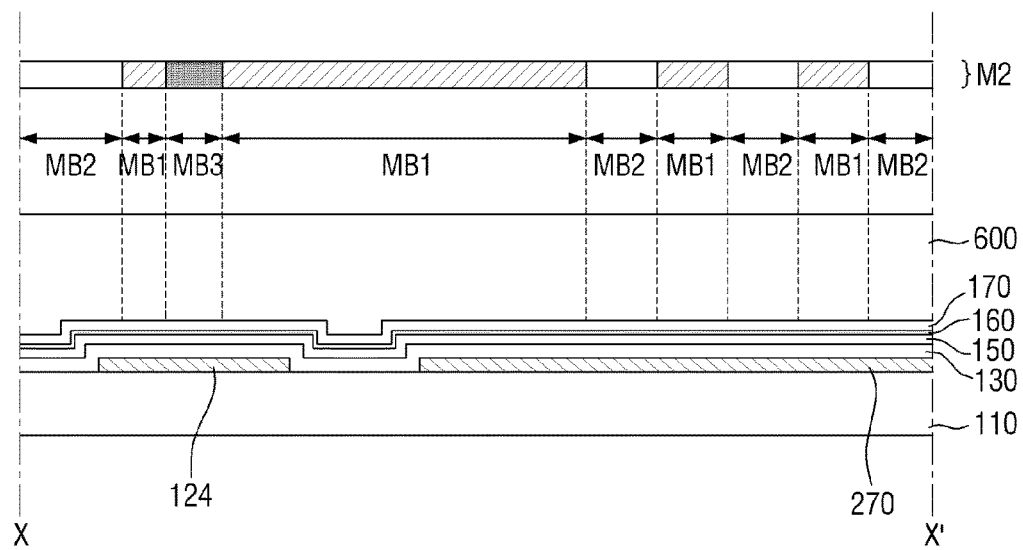
Figure 25:
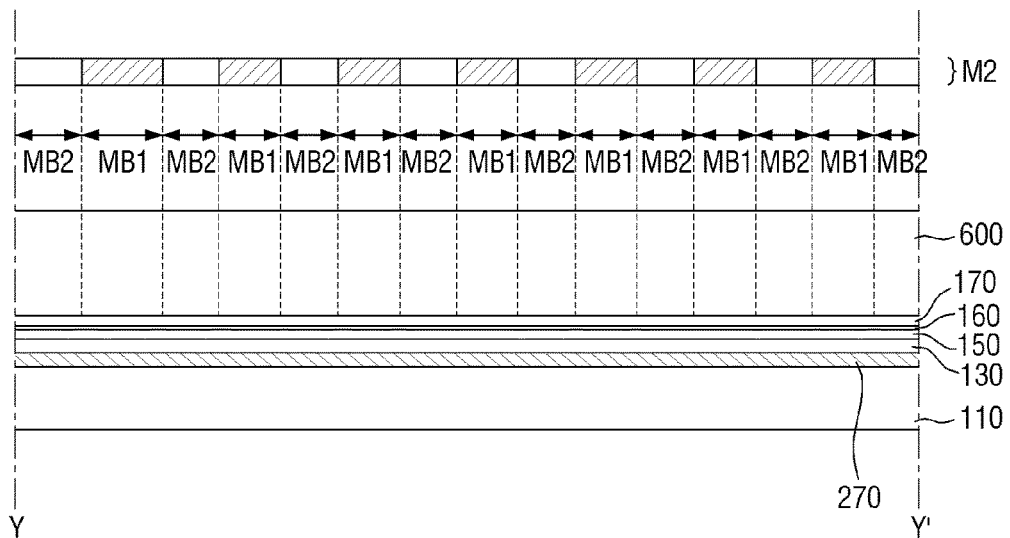
Figure 26:
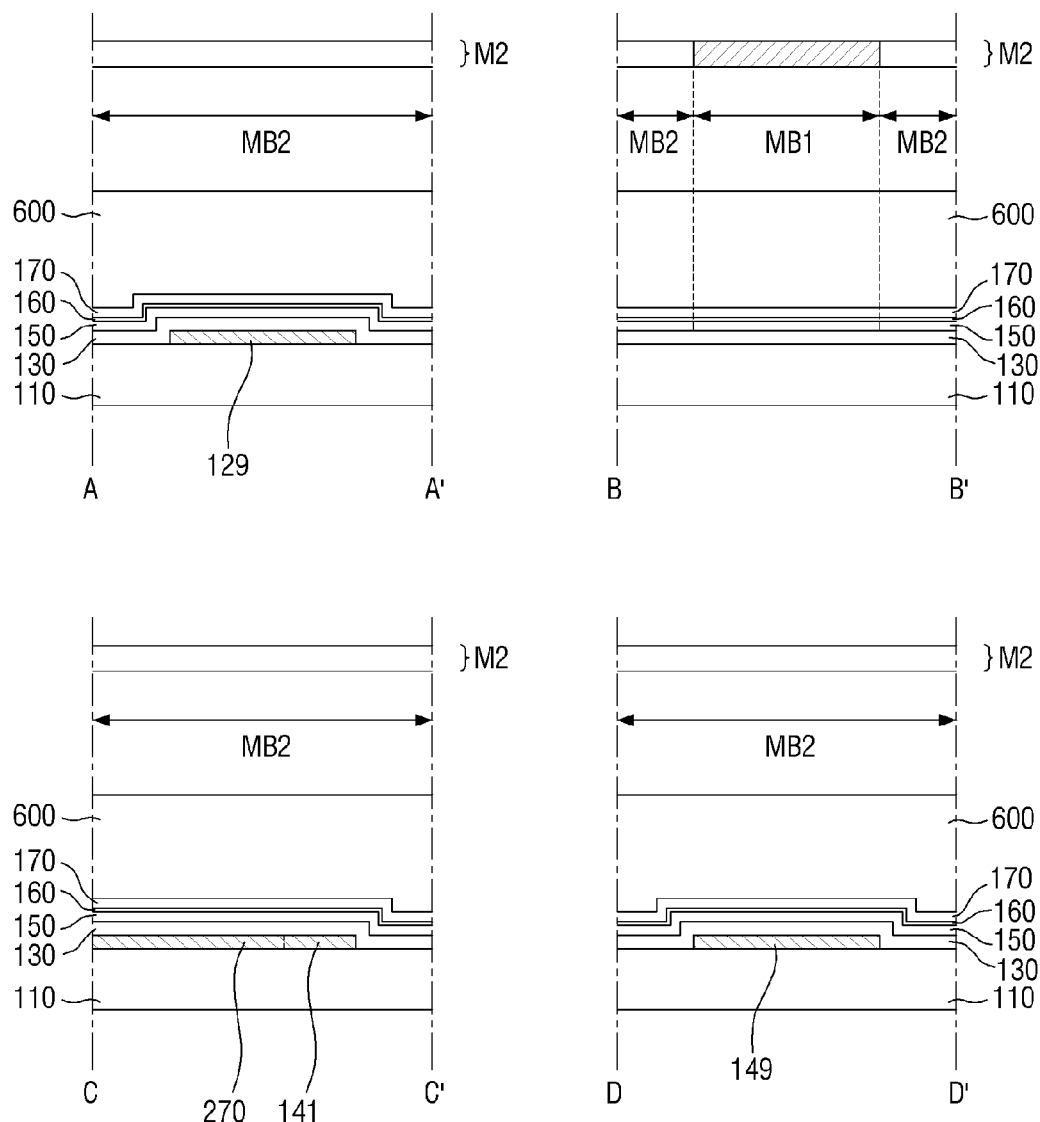

Thereafter, referring to FIGS. 24 through 26, a second photosensitive layer 600 is formed on the entire surface of the first base 110 where the data conductive layer 170 is formed, and light is selectively applied to the second photosensitive layer 600 using a second mask M2. The second photosensitive layer 600 may be negative photoresist or positive photoresist. For convenience, it is assumed that the second photosensitive layer 600 is positive photoresist.

The second mask M2 may include blocking areas MB1 which completely block the transmission of light therethrough, transmissive areas MB2 which completely transmit light therethrough, and transflective areas MB3 which allow the transmission of some light therethrough and block the transmission of some light therethrough. In this manner, light transmitted through the second mask M2 may be provided to the second photosensitive layer 600. The second mask M2 may be a multi-tone mask such as a halftone mask.

Figure 27:
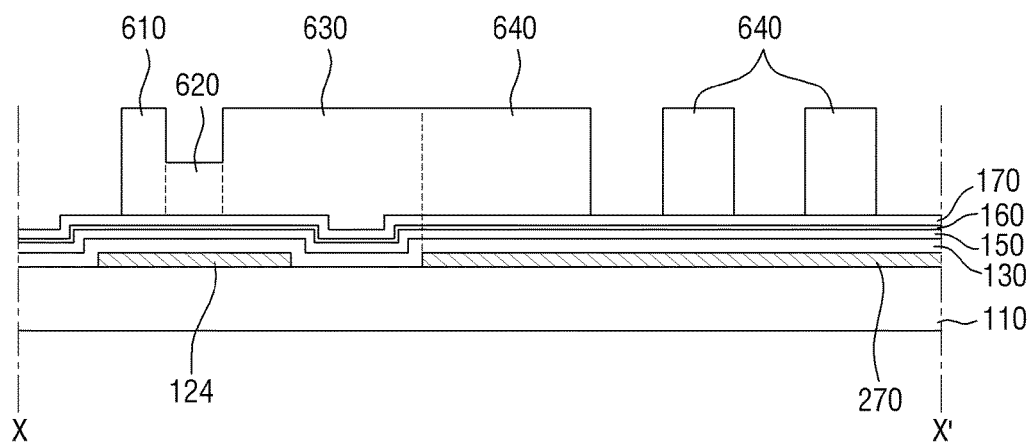
Figure 28:
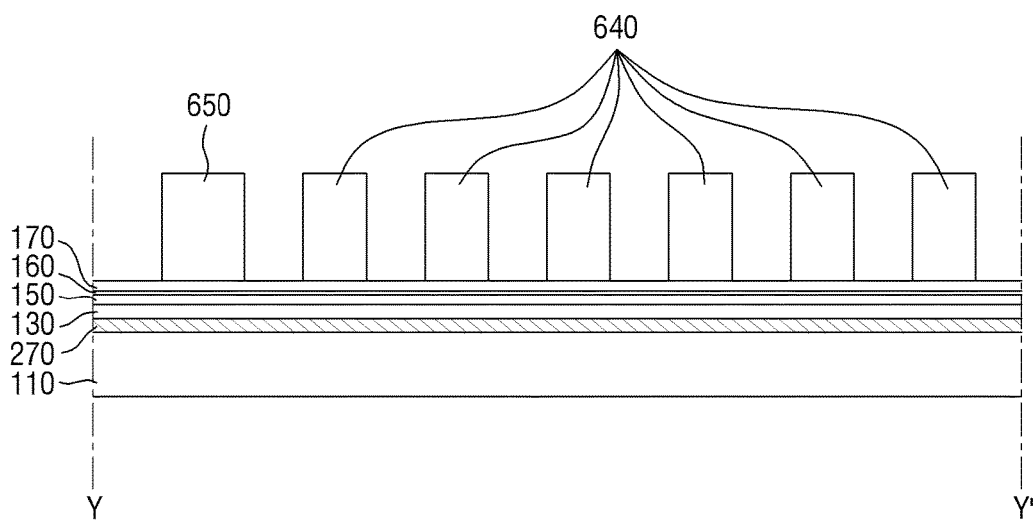
Figure 29:
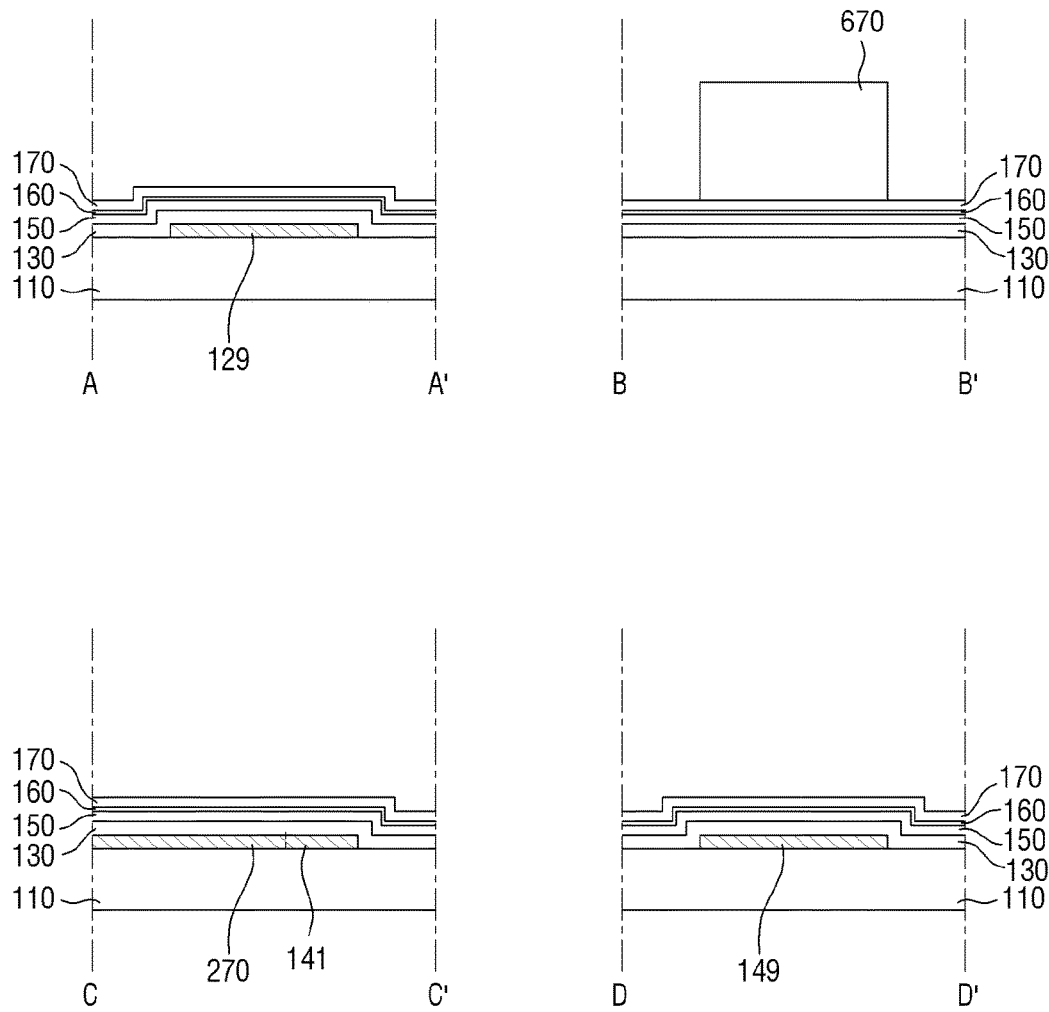

Thereafter, referring to FIGS. 27 through 29, by developing the second photosensitive layer 600 exposed by the second mask M2, a sixth photosensitive layer pattern 610, a seventh photosensitive layer pattern 620, an eighth photosensitive layer pattern 630, a ninth photosensitive layer pattern 640, a tenth photosensitive layer pattern 650, and an eleventh photosensitive layer pattern 670 are formed in areas corresponding to the blocking areas MB1 and the transflective areas MB3. The seventh photosensitive layer pattern 620, which is formed in the areas corresponding to the transflective areas MB3, may be thinner than the seventh photosensitive layer pattern 610, the eighth photosensitive layer pattern 630, the ninth photosensitive layer pattern 640, the tenth photosensitive layer pattern 650, and the eleventh photosensitive layer pattern 670, which are formed in the areas corresponding to the blocking areas MB1. The second photosensitive layer 600 is removed from the areas corresponding to the transmissive areas MB2, as illustrated in FIGS. 27 through 29.

The sixth photosensitive layer pattern 610 may be formed to correspond to an area in which a source electrode is to be formed, and the seventh photosensitive layer pattern 620 may be formed to correspond to an area in which a gap between the source electrode and a drain electrode is to be formed. The eighth photosensitive layer pattern 630 may be formed to correspond to an area in which the drain electrode is to be formed, the ninth photosensitive layer pattern 640 may be formed to correspond to an area in which a pixel electrode is to be formed, and the tenth photosensitive layer pattern 650 may be formed to correspond to an area in which a data line is to be formed. The eleventh photosensitive layer pattern 670 may be formed to correspond to an area in which a data pad portion is to be formed.

Figure 30:
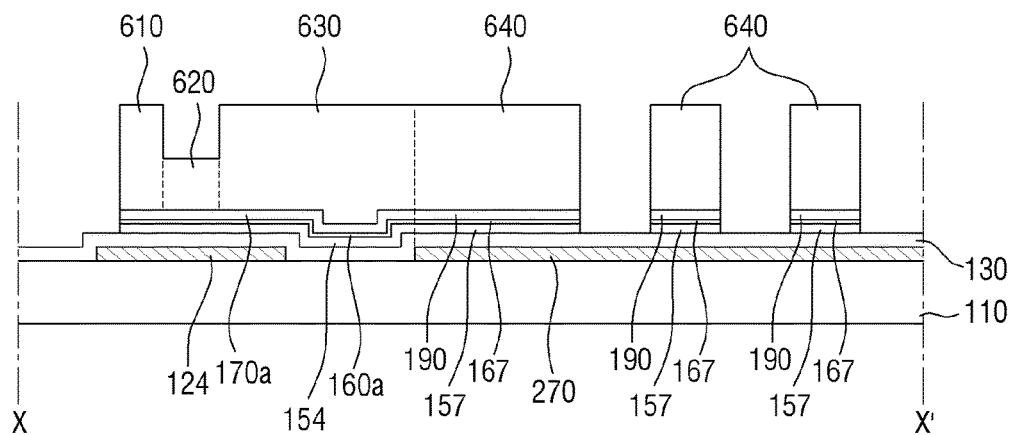
Figure 31:
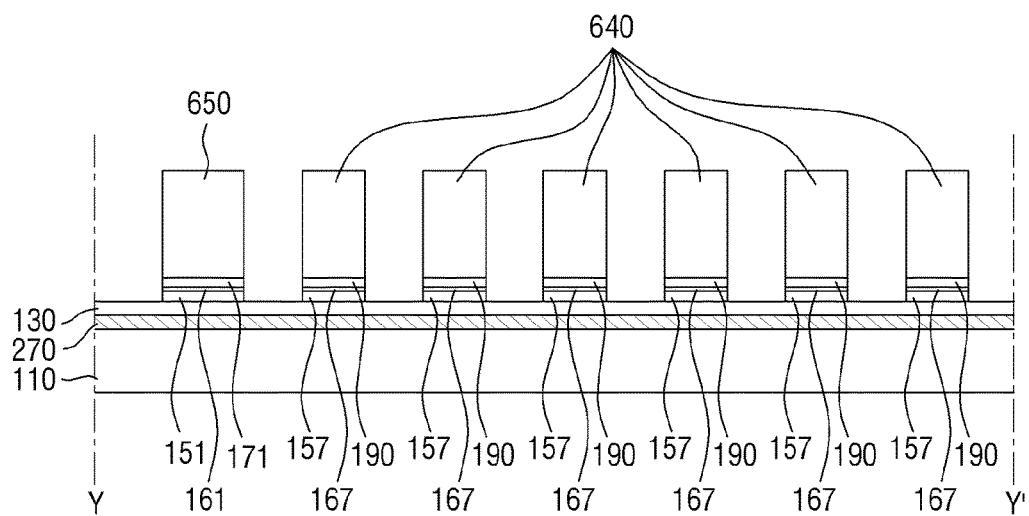
Figure 32:
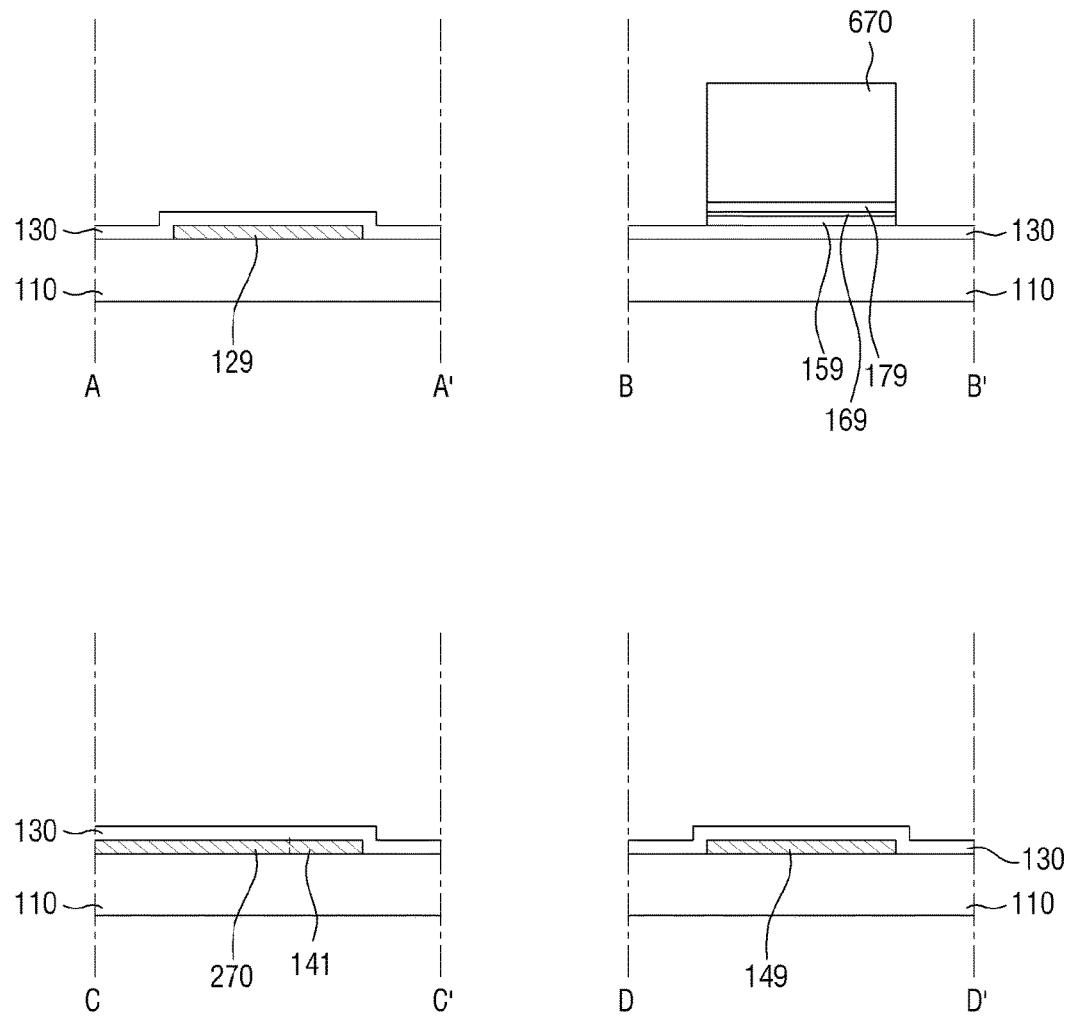
Figure 33:
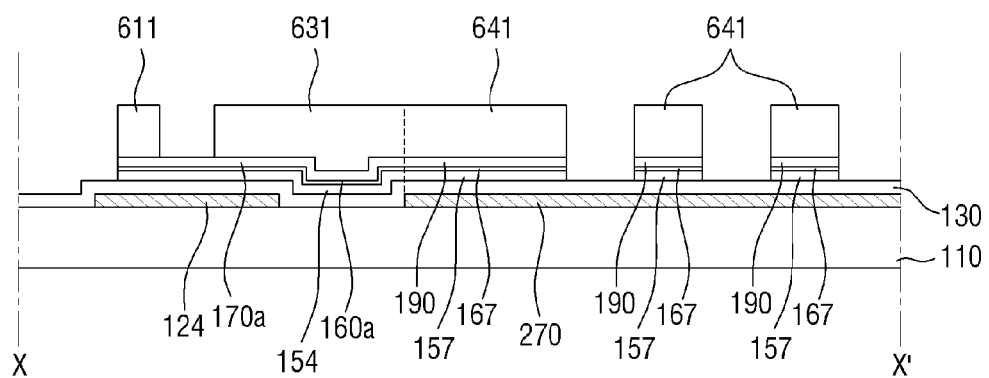
Figure 34:
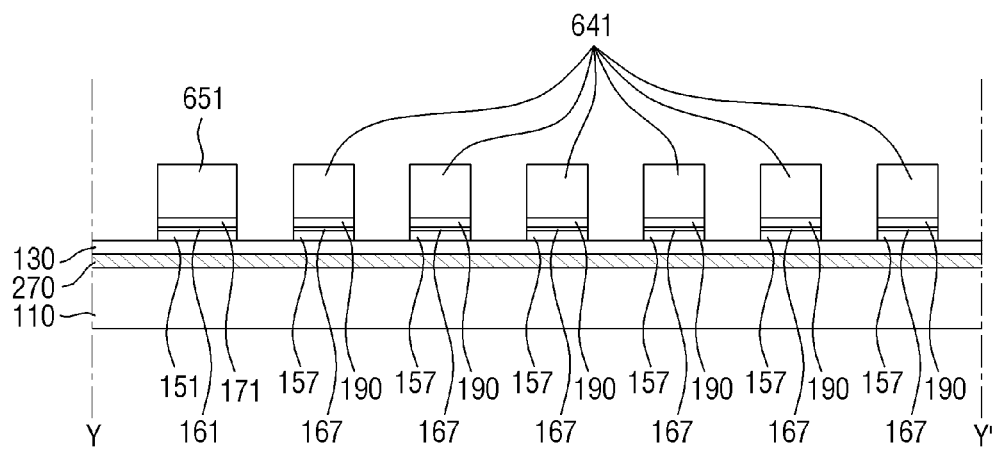
Figure 35:
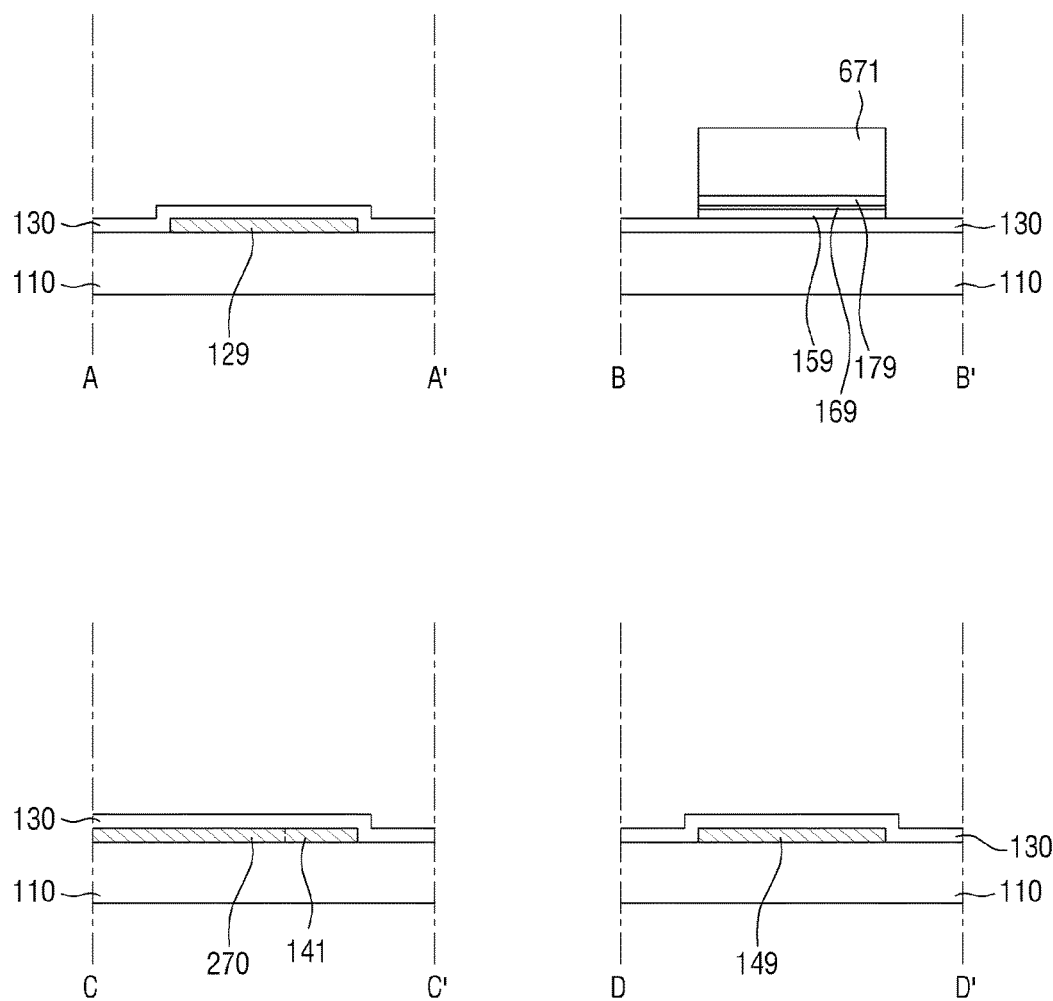

Thereafter, referring to FIGS. 30 through 32, a third semiconductor pattern 157, a pixel ohmic contact 167, and a pixel electrode 190 are formed below the ninth photosensitive layer pattern 640 by etching the semiconductor material layer 150, the ohmic contact layer 160, and the data conductive layer 170 using the sixth photosensitive layer pattern 610, the seventh photosensitive layer pattern 620, the eighth photosensitive layer pattern 630, the ninth photosensitive layer pattern 640, the tenth photosensitive layer pattern 650, and the eleventh photosensitive layer pattern 670 as masks. Also, a first semiconductor pattern 151, a data ohmic contact 161, and a data line 171 are formed below the tenth photosensitive layer pattern 650, and a second semiconductor pattern 159, a data pad ohmic contact 169, and a data pad portion 179 are formed below the eleventh photosensitive layer pattern 670. Also, a semiconductor layer 154, an ohmic contact layer remainder pattern 160a, and a data conductive layer remainder pattern 170a are formed below the sixth photosensitive layer pattern 610, the seventh photosensitive layer pattern 620, and the eighth photosensitive layer pattern 630.

Thereafter, the seventh photosensitive layer pattern 620 is removed by performing an ashing process. During the removal of the seventh photosensitive layer pattern 620, the thickness of the sixth photosensitive layer pattern 610 may be reduced by as much as the thickness of the seventh photosensitive layer pattern 620, and as a result, a sixth sub-photosensitive layer pattern 611 may be formed. Similarly, the eighth photosensitive layer pattern 630 may be transformed into an eighth sub-photosensitive layer pattern 631 having a smaller thickness than the eighth photosensitive layer pattern 630, and the ninth photosensitive layer pattern 640 may be transformed into a ninth sub-photosensitive layer pattern 641 having a smaller thickness than the ninth photosensitive layer pattern 640. Also, the tenth photosensitive layer pattern 650 may be transformed into a tenth sub-photosensitive layer pattern 651 having a smaller thickness than the tenth photosensitive layer pattern 650, and the eleventh photosensitive layer pattern 670 may be transformed into an eleventh sub-photosensitive layer pattern 671 having a smaller thickness than the eleventh photosensitive layer pattern 670.

Figure 36:
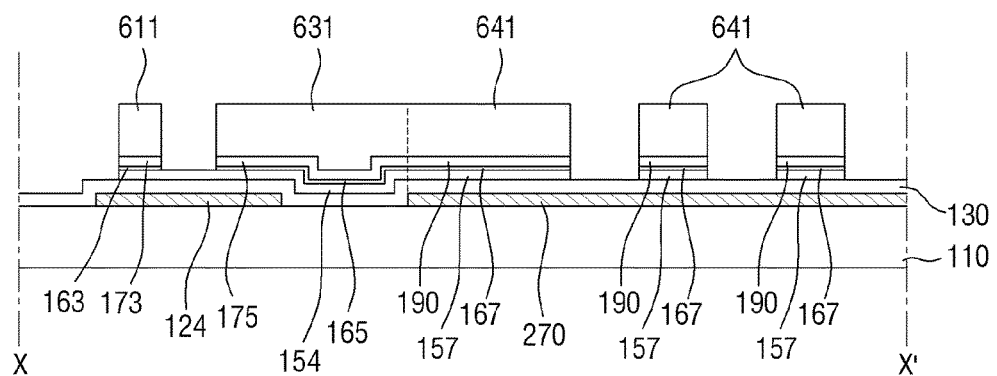
Figure 37:
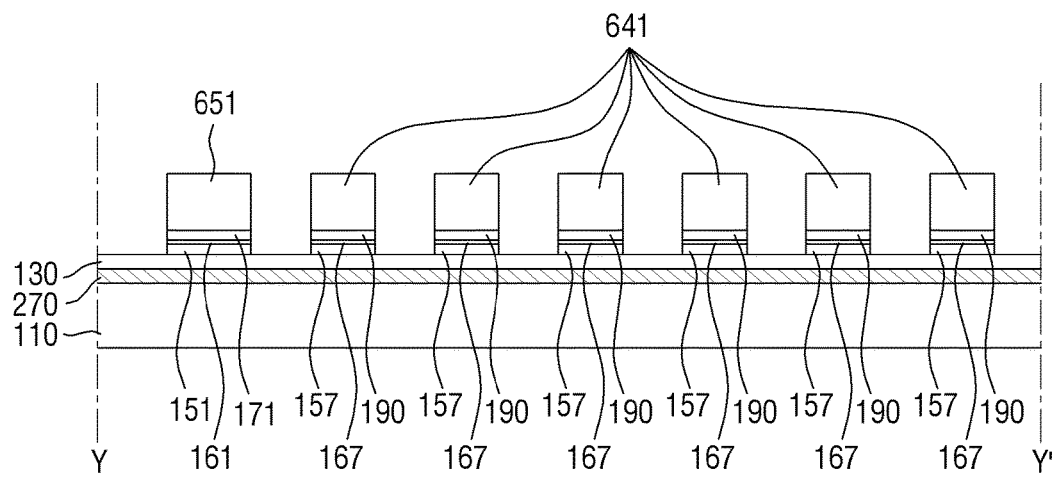
Figure 38:
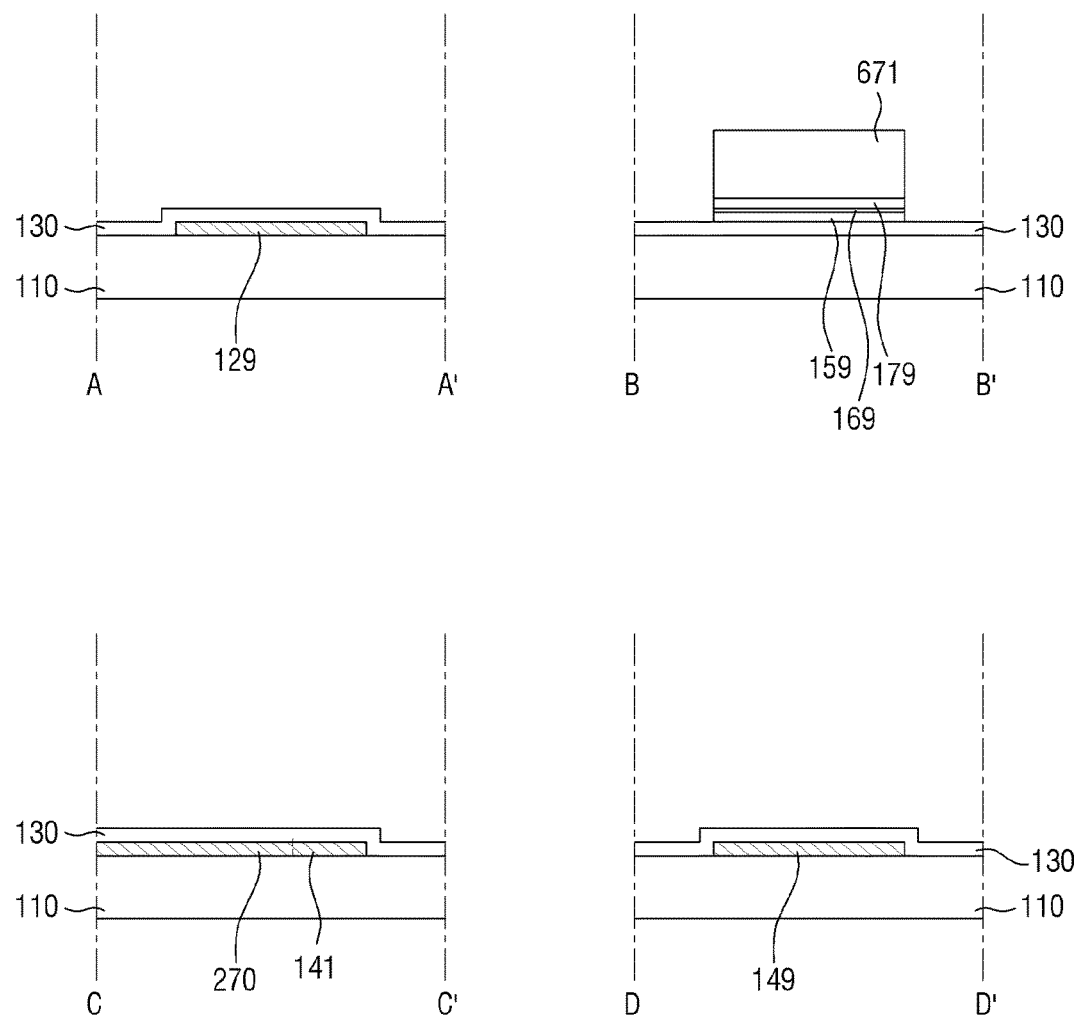
Figure 39:
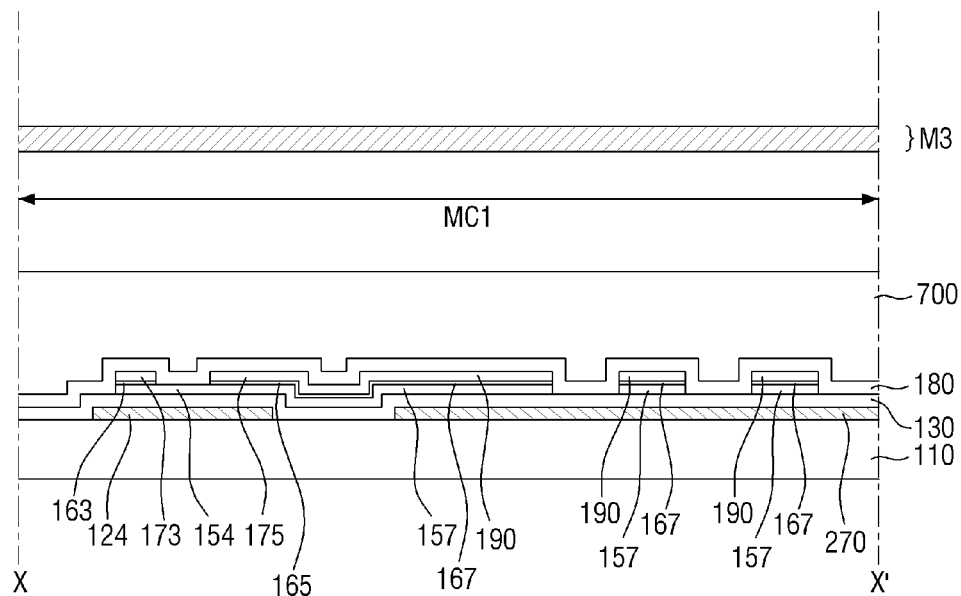
Figure 40:
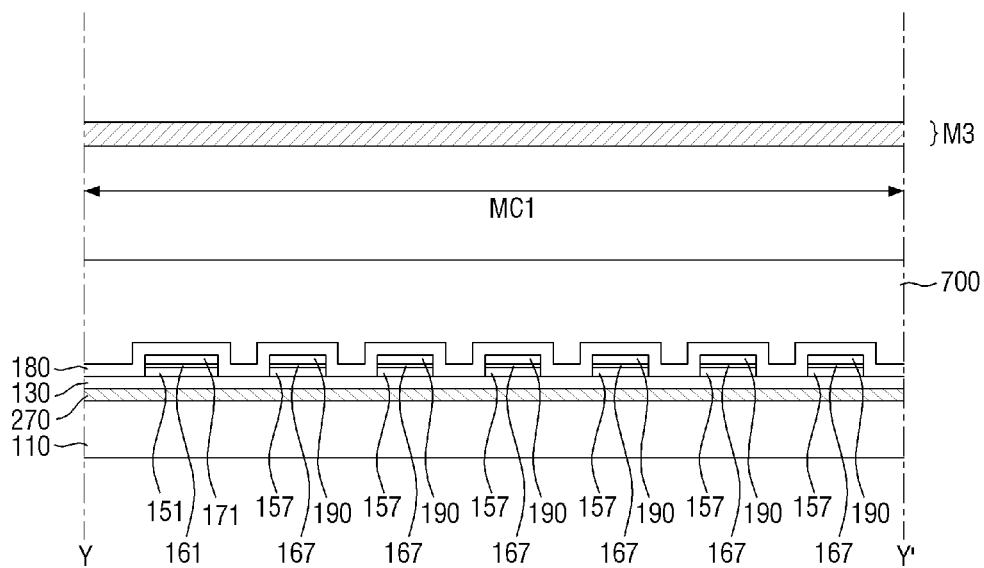
Figure 41:
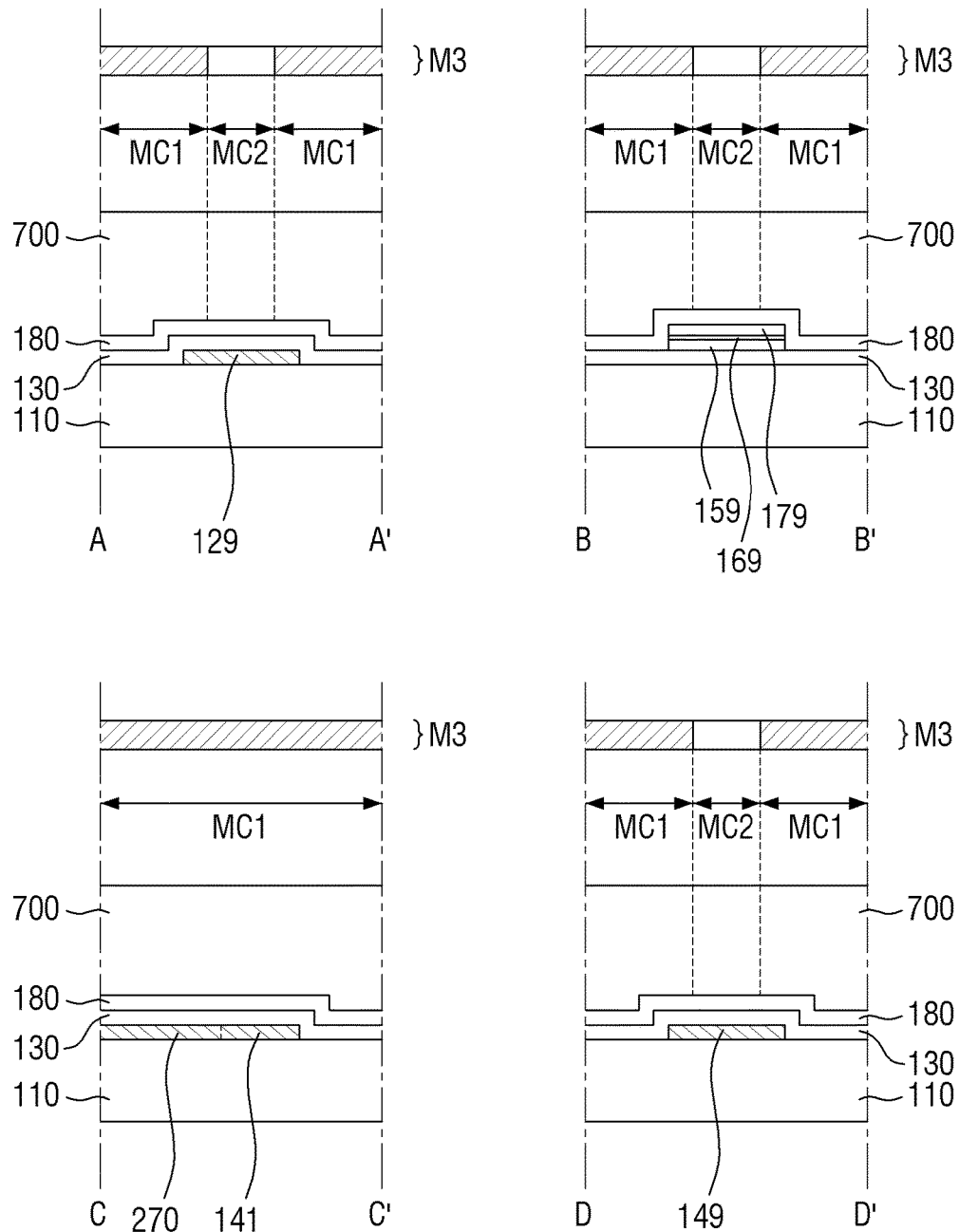
Figure 42:
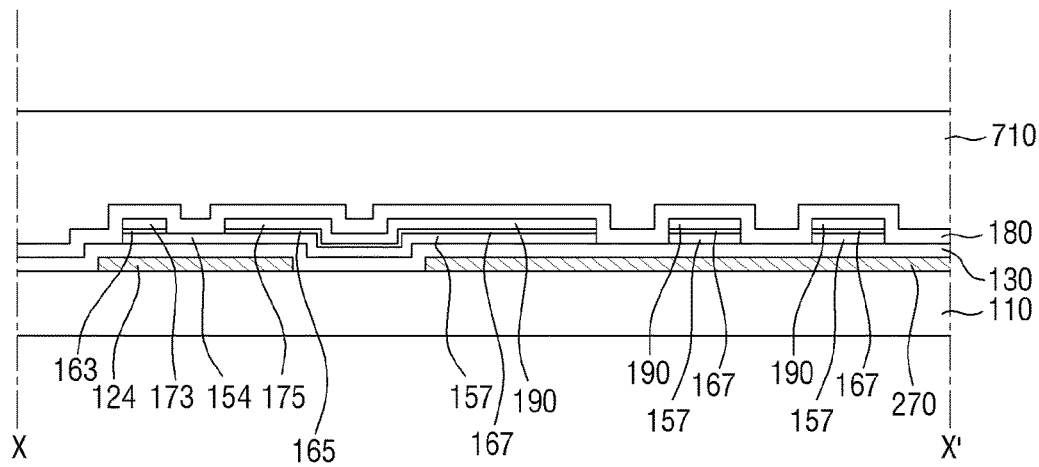
Figure 43:
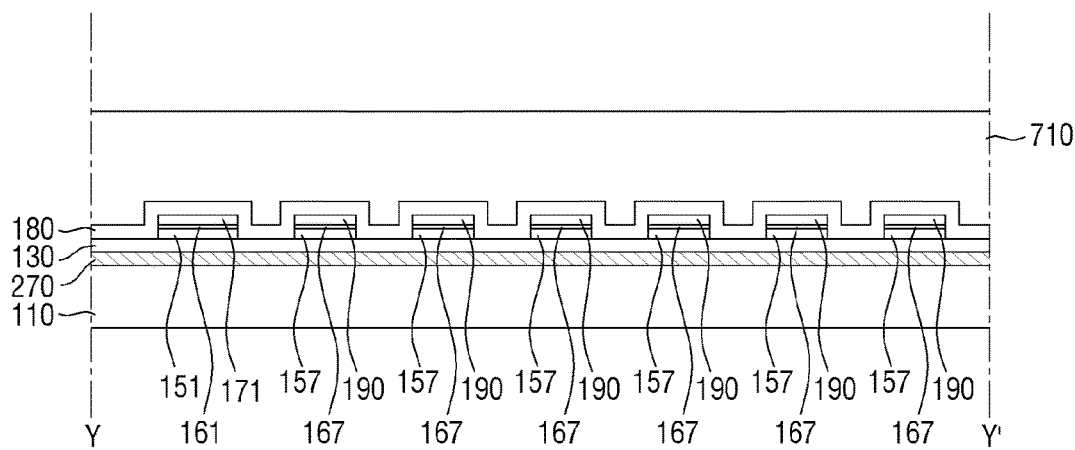
Figure 44:
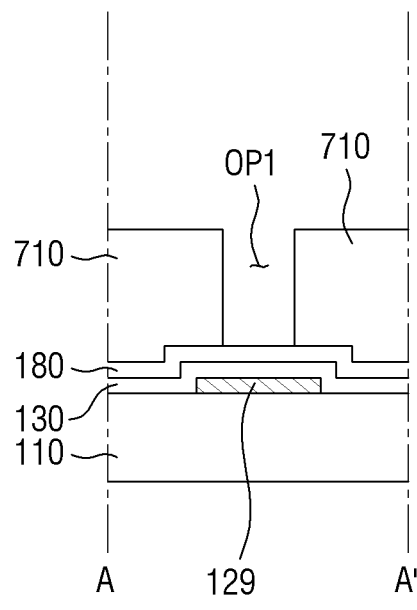
Figure 44:
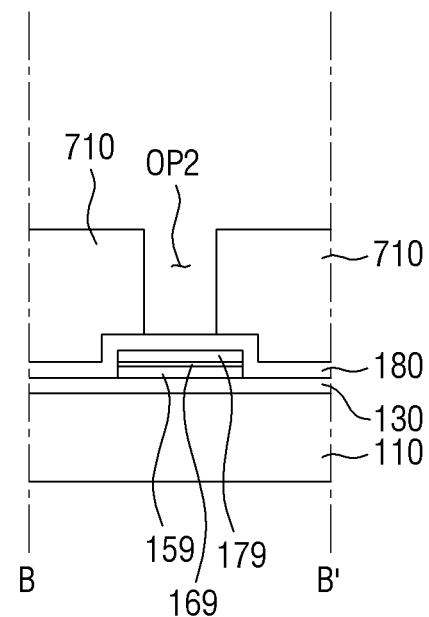
Figure 44:
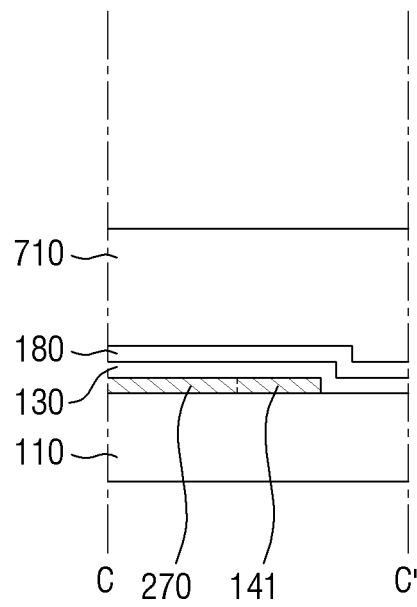
Figure 44:
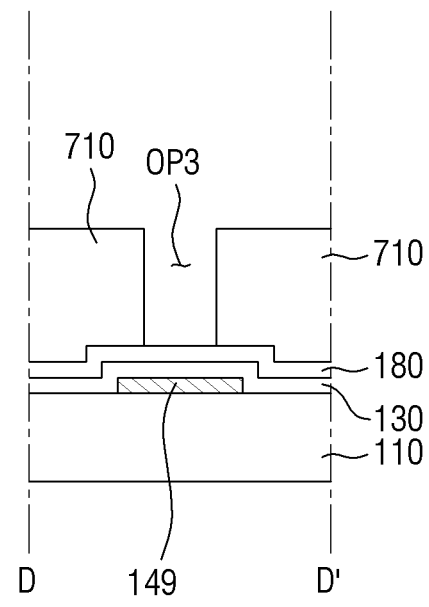

Thereafter, referring to FIGS. 36 through 38, a source ohmic contact 163 which is disposed on the semiconductor layer 154, and a source electrode 173 which is disposed on the source ohmic contact 163, may be formed below the sixth sub-photosensitive layer pattern 611 by etching the ohmic contact layer remainder patter 160a and the data conductive layer remainder pattern 170a using the sixth sub-photosensitive layer pattern 611, the eighth sub-photosensitive layer pattern 631, and the ninth sub-photosensitive layer pattern 641 as masks. Also, a drain ohmic contact 165 which is disposed on the semiconductor layer 154, and a drain electrode 175 which is disposed on the drain ohmic contact 165, may be formed below the eighth sub-photosensitive layer pattern 631.

Thereafter, the sixth sub-photosensitive layer pattern 611, the eighth sub-photosensitive layer pattern 631, the ninth sub-photosensitive layer pattern 641, the tenth sub-photosensitive layer pattern 651, and the eleventh sub-photosensitive layer pattern 671 are removed. Then, referring to FIGS. 39 through 41, an insulating layer 180 is formed on the first base 110 where the gate insulating layer 130, the data line 171, the source electrode 173, the drain electrode 175, the data pad portion 179, and the pixel electrode 190 are formed, and a third photosensitive layer 700 is formed on the insulating layer 180. Thereafter, light is selectively applied to the third photosensitive layer 700 using a third mask M3. The third photosensitive layer 700 may be negative photoresist or positive photoresist. For convenience, it is assumed that the third photosensitive layer 700 is positive photoresist.

The third mask M3 includes blocking areas MC1 which completely block the transmission of light therethrough, and transmissive areas MC2 which completely transmit light therethrough, and light transmitted through the third mask M3 is provided to the third photosensitive layer 700. Thereafter, referring to FIGS. 42 through 44, by developing the third photosensitive layer 700 exposed by the third mask M3, a twelfth photosensitive layer pattern 710 is formed in areas corresponding to the blocking areas MC1. Also, the third photosensitive layer 700 is removed from areas corresponding to the transmissive areas MC2, and as a result, a first opening OP1, a second opening OP2, and a third opening OP3, which partially expose the insulating layer 180, are formed. The first opening OP1 may be formed to correspond to a first hole which exposes the gate pad portion 129, the second opening OP2 may be formed to correspond to a second hole which exposes the data pad portion 179, and the third opening OP3 may be formed to correspond to a third hole which exposes the common voltage pad portion 149. The twelfth photosensitive layer pattern 710 may be formed to correspond to an entire area of the first base 110 except for the first opening OP1, the second opening OP2, and the third opening OP3.

Figure 45:
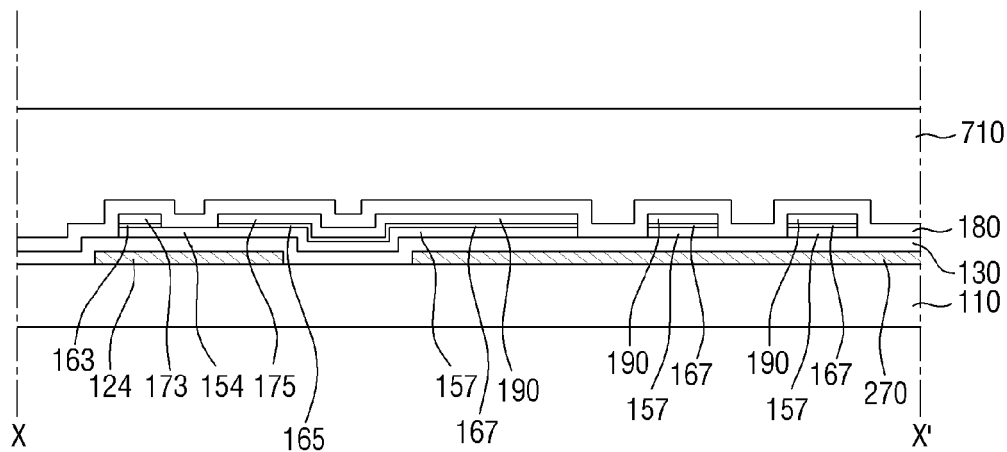
Figure 46:
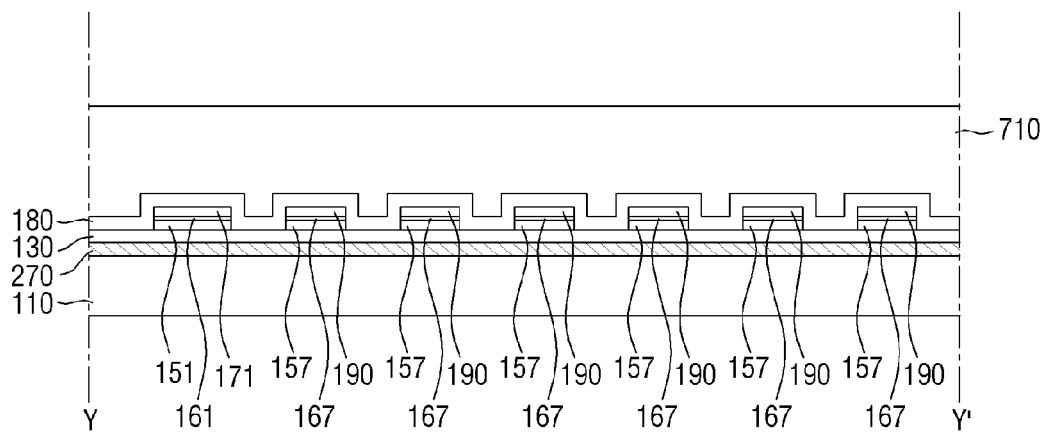
Figure 47:
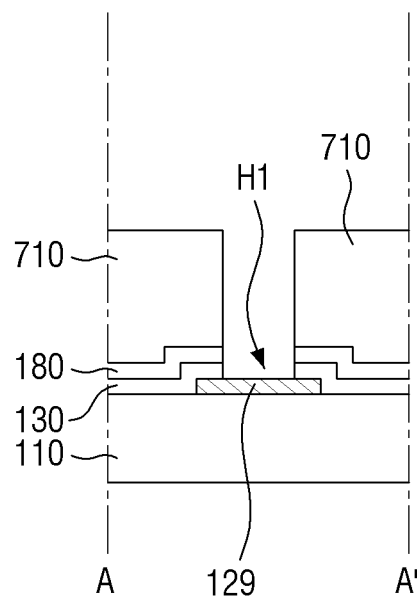
Figure 47:
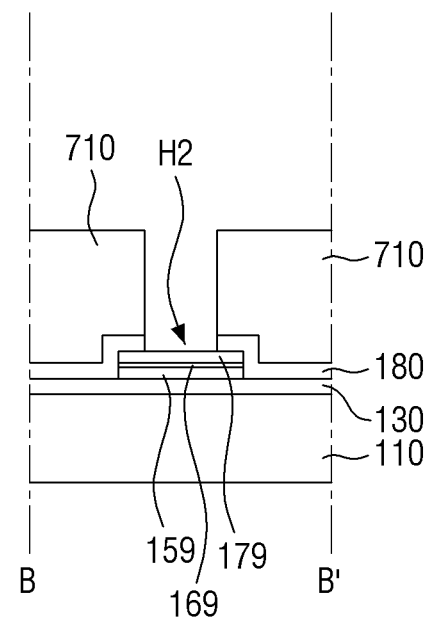
Figure 47:
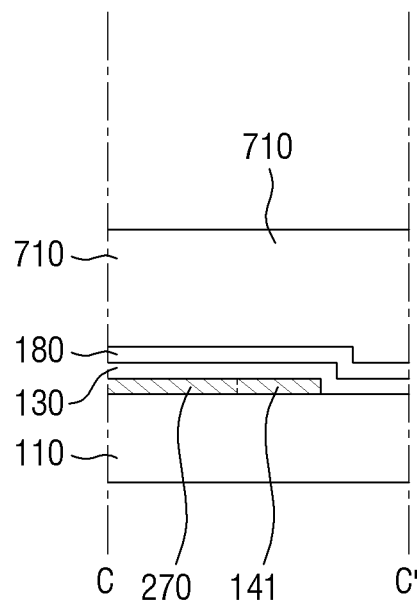
Figure 47:
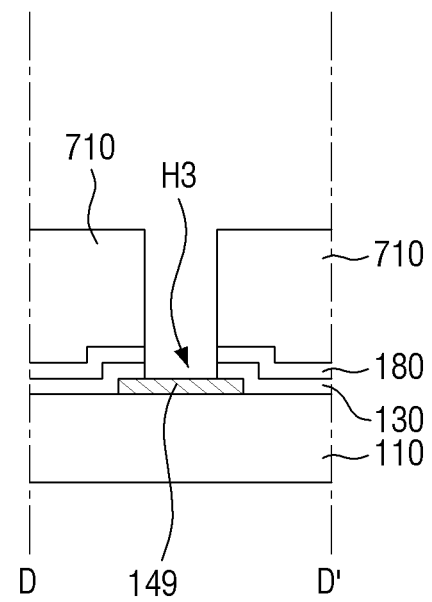

Thereafter, referring to FIGS. 45 through 47, by performing etching using the twelfth photosensitive layer pattern 710 as a mask, a first hole H1 which exposes part of the gate pad portion 129, and a third hole H3 which exposes part of the common voltage pad portion 149, may be formed in the gate insulating layer 130 and the insulating layer 180. Also, a second hole H2, which exposes part of the data pad portion 179, may be formed in the insulating layer 180.

Thereafter, by removing the twelfth photosensitive layer pattern 710, the display substrate 10 of FIGS. 3 through 5 may be obtained, and the display device 1 of FIGS. 3 through 5 may be fabricated by placing the counter substrate 20 of FIGS. 3 through 5 over the display substrate 10 and inserting the liquid crystal layer 30 of FIGS. 3 through 5 between the display substrate 10 and the counter substrate 20. Since the display substrate 10 can be fabricated using only three mask processes, the manufacture of a display device can be simplified, and the manufacturing cost of a display device can be reduced.

FIGS. 48 through 62 are cross-sectional views illustrating a method of fabricating the display substrate illustrated in FIGS. 6 through 8, and FIGS. 63 through 65 are cross-sectional views illustrating a method of fabricating the display substrate illustrated in FIGS. 9 through 11.

Figure 48:
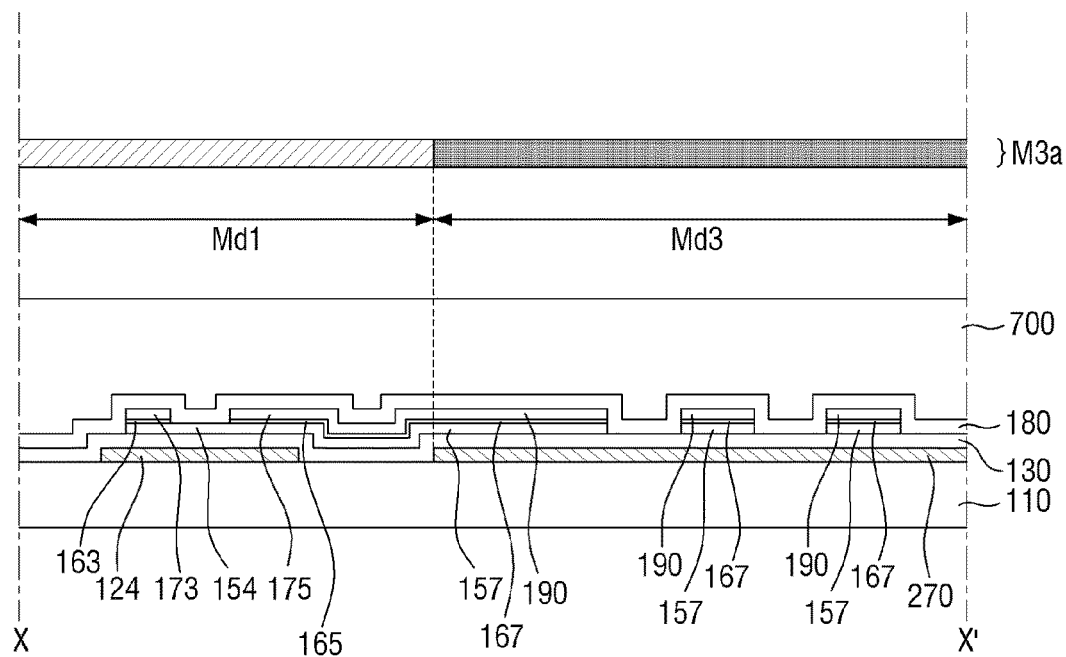
FIGS. 48 through 62 are cross-sectional views illustrating a method of fabricating the display substrate illustrated in FIGS. 6 through 8.
Figure 49:
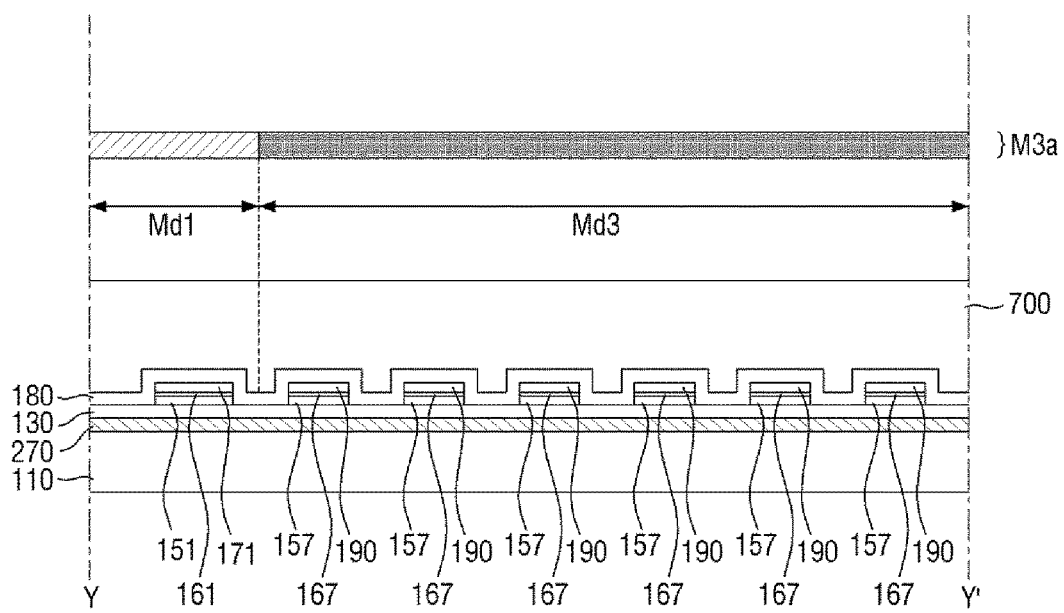
Figure 50:
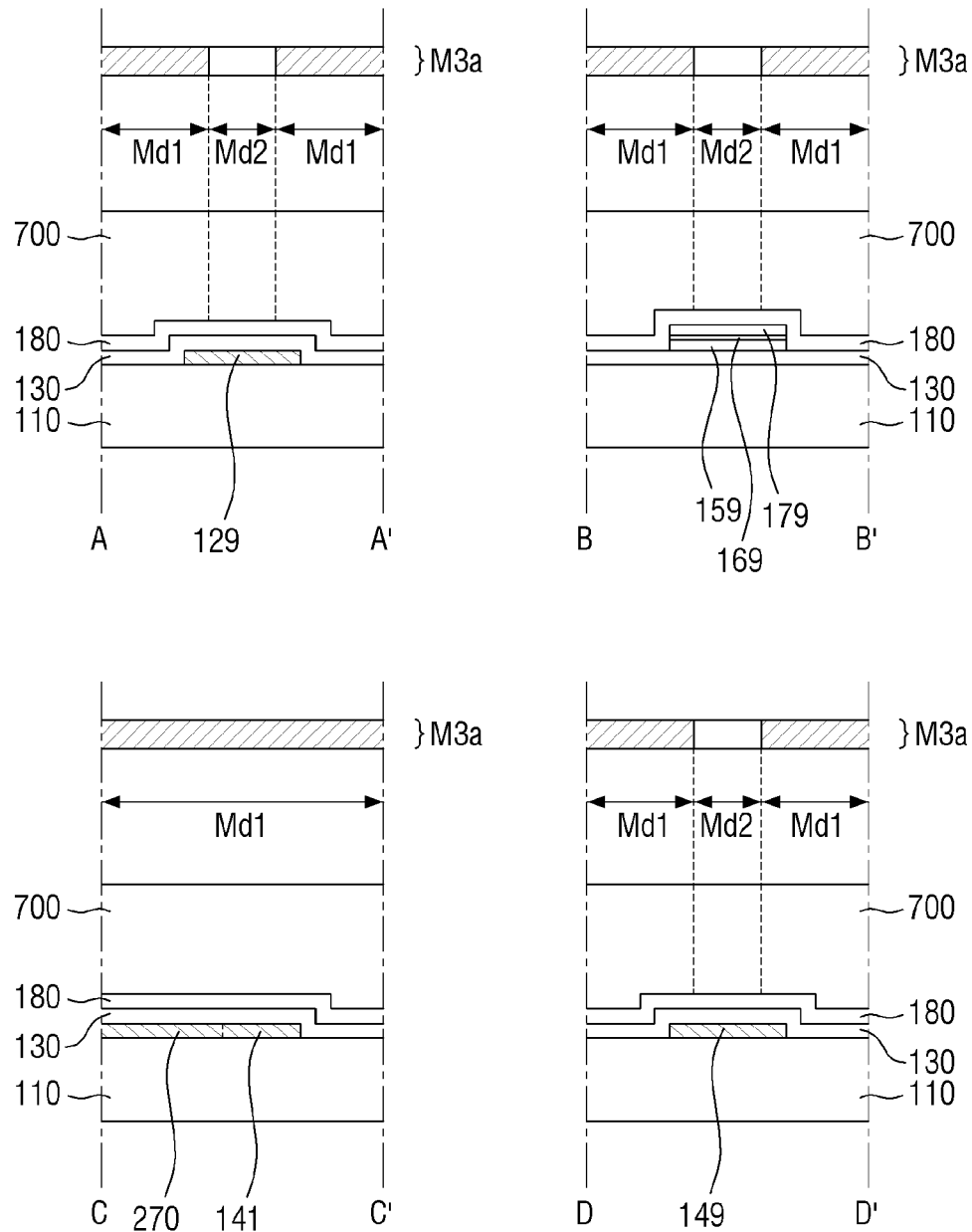

Referring to FIGS. 48 through 50, an insulating layer 180 is formed on a first base 110 where a gate line (not illustrated), a gate electrode 124, a gate pad portion 129, a common electrode 270, a common voltage line 141, a common voltage pad portion 149, a gate insulating layer 130, a data line 171, a source electrode 173, a drain electrode 175, a data pad portion 179, and a pixel electrode 190 are formed. The elements between the insulating layer 180 and the first base 110 are formed as described above with reference to FIGS. 12 through 38.

Thereafter, a third photosensitive layer 700 is formed on the insulating layer 180, and light is selectively applied to the third photosensitive layer 700 using a third mask M3a. The third mask M3a may include blocking areas Md1 which completely block the transmission of light therethrough, transmissive areas Md2 which completely transmit light therethrough, and transflective areas Md3 which allow the transmission of some light therethrough and block the transmission of some light therethrough. In this manner, light transmitted through the third mask M3a may be provided to the third photosensitive layer 700. That is, the third mask M3a may be a multi-tone mask such as a halftone mask.

Figure 51:
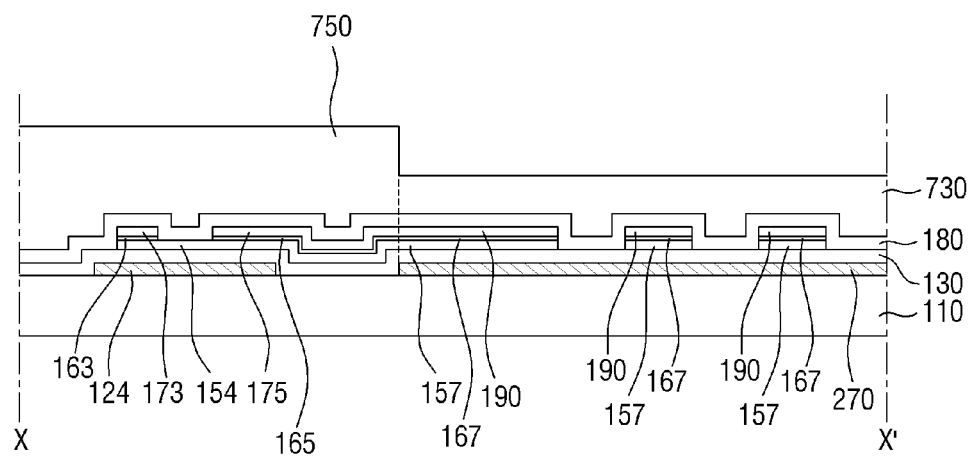
Figure 52:
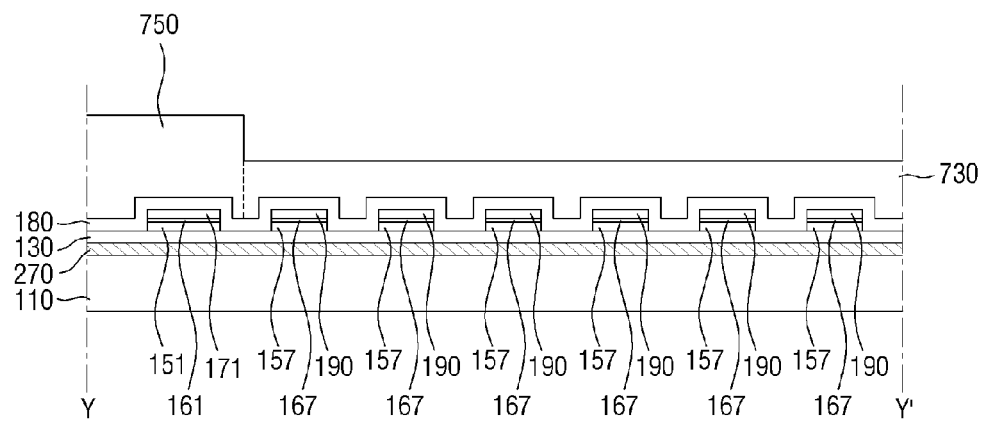
Figure 53:
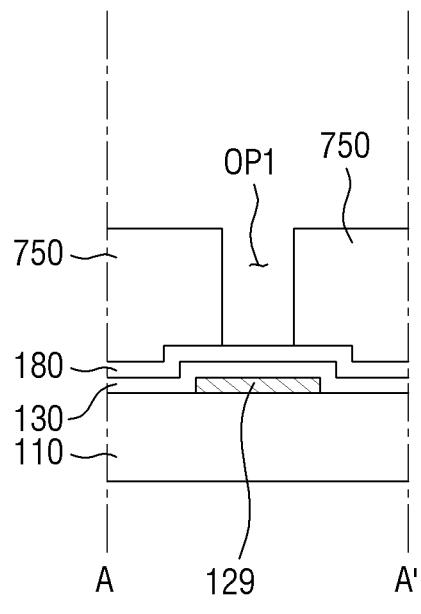
Figure 53:
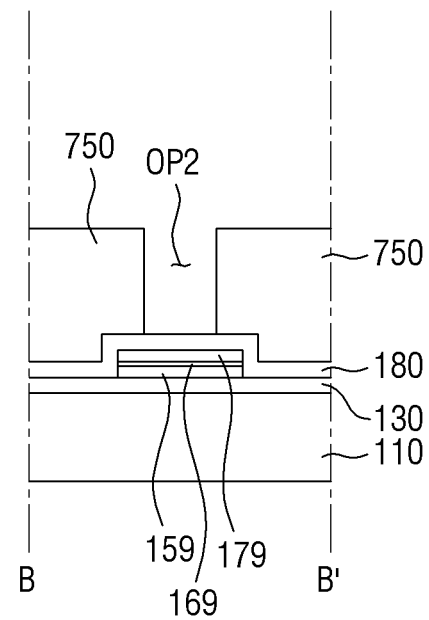
Figure 53:
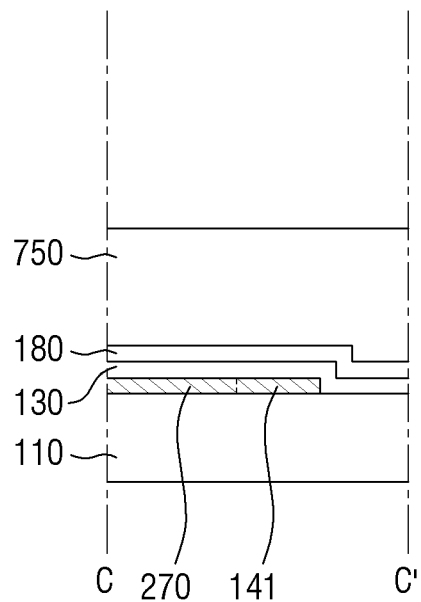
Figure 53:
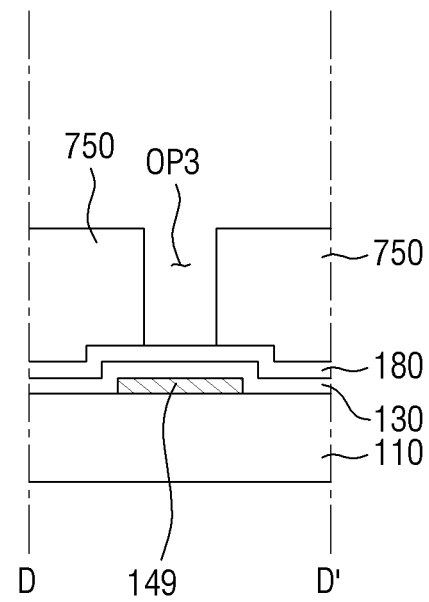

Thereafter, referring to FIGS. 51 through 53, by developing the third photosensitive layer 700 exposed by the third mask M3a, a thirteenth photosensitive layer pattern 730 is formed in areas corresponding to the transflective areas Md3, and a fourteenth photosensitive layer pattern 750, which is thicker than the thirteenth photosensitive layer pattern 730, is formed in areas corresponding to the blocking areas Md1. A first opening OP1, a second opening OP2, and a third opening OP3, which partially expose the insulating layer 180, are formed. The first opening OP1 may be formed to correspond to a first hole which exposes the gate pad portion 129, the second opening OP2 may be formed to correspond to a second hole which exposes the data pad portion 179, and the third opening OP3 may be formed to correspond to a third hole which exposes the common voltage pad portion 149. The thirteenth photosensitive layer pattern 730 is formed to correspond to an area in which the pixel electrode 190 is disposed or to a second area (PA2 of FIG. 6), and the fourteenth photosensitive layer pattern 750 is formed to correspond to an entire area of the first base 110 except for the thirteenth photosensitive layer pattern 730, the first opening OP1, the second opening OP2, and the third opening OP3.

Figure 54:
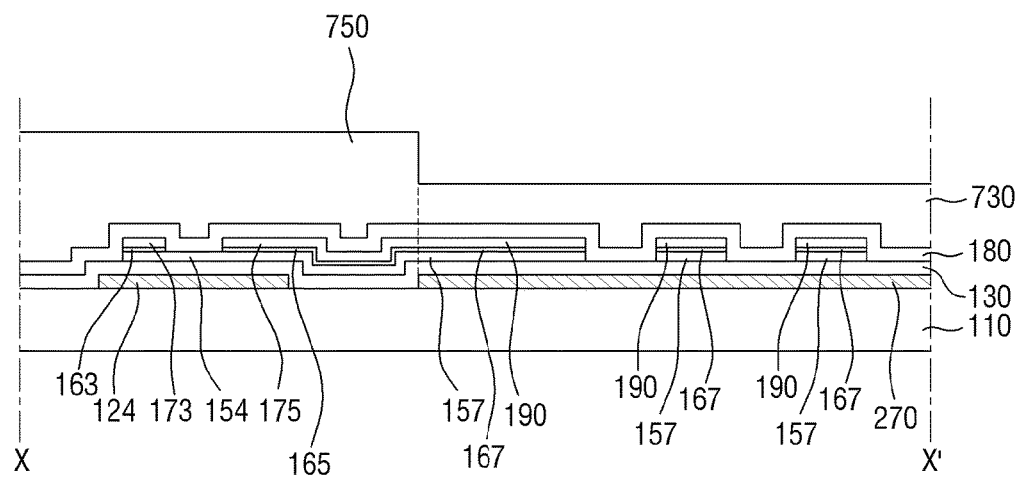
Figure 55:
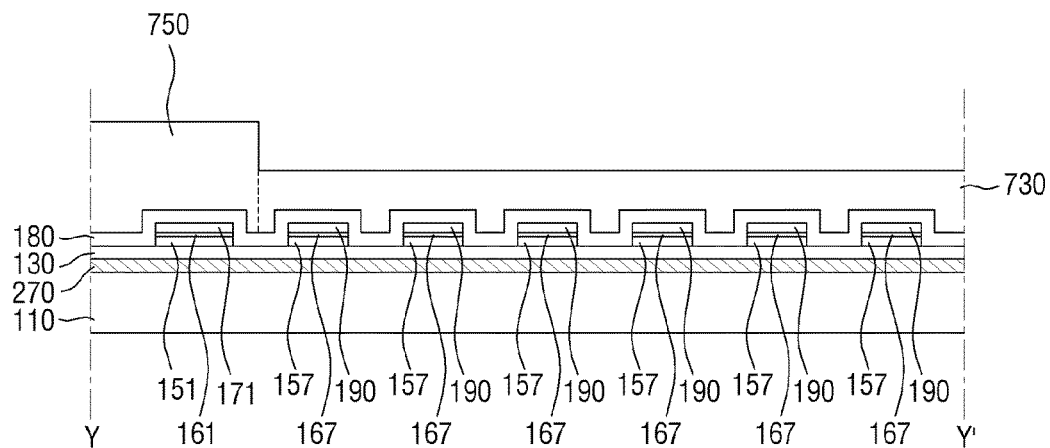
Figure 56:
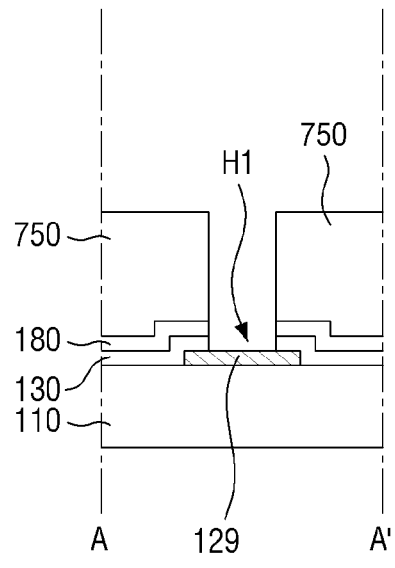
Figure 56:
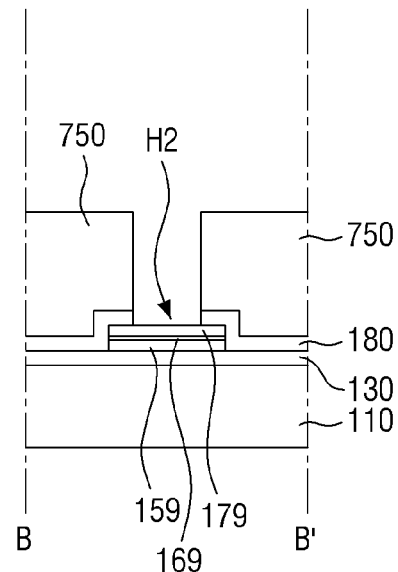
Figure 56:
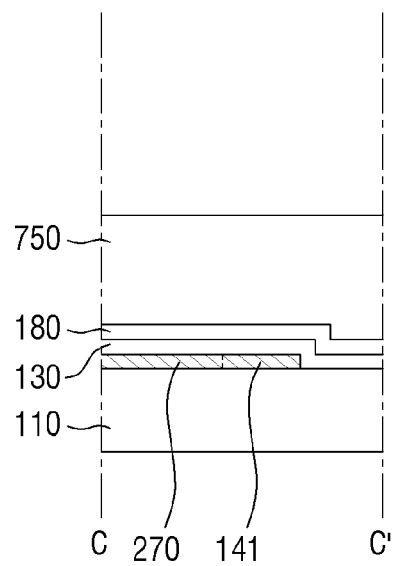
Figure 56:
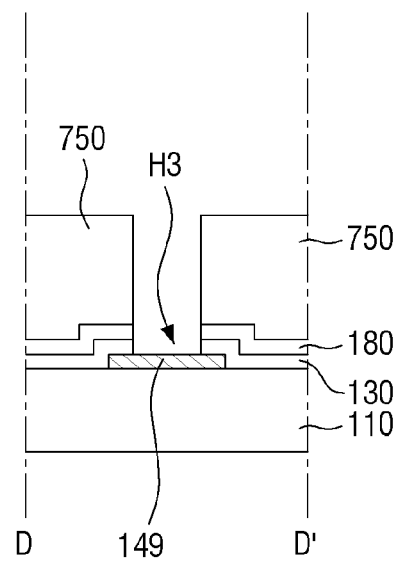
Figure 57:
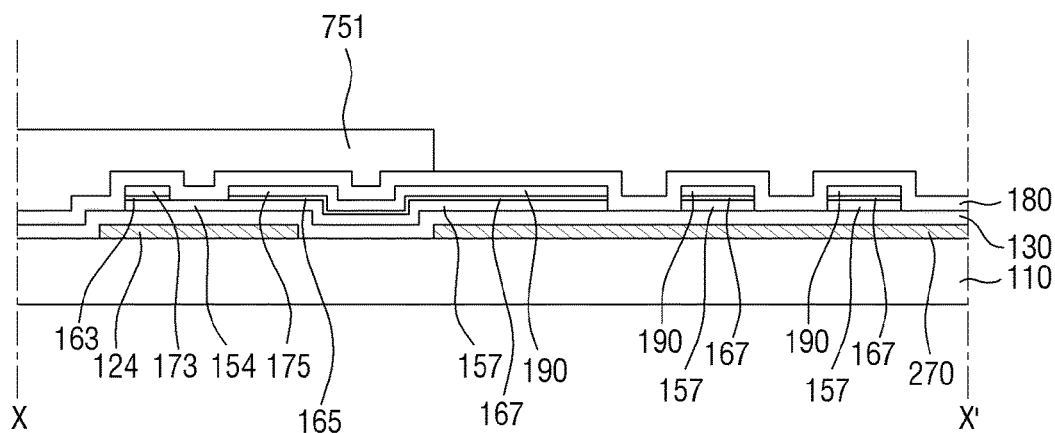
Figure 58:
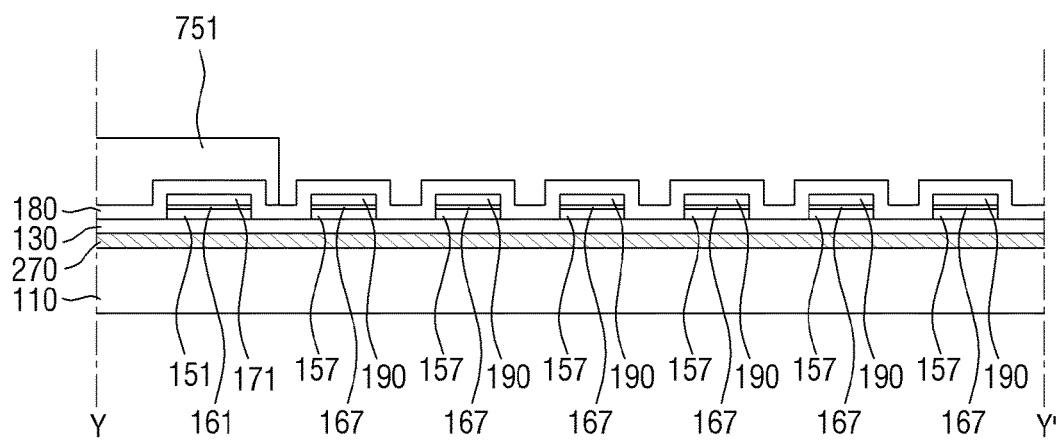
Figure 59:
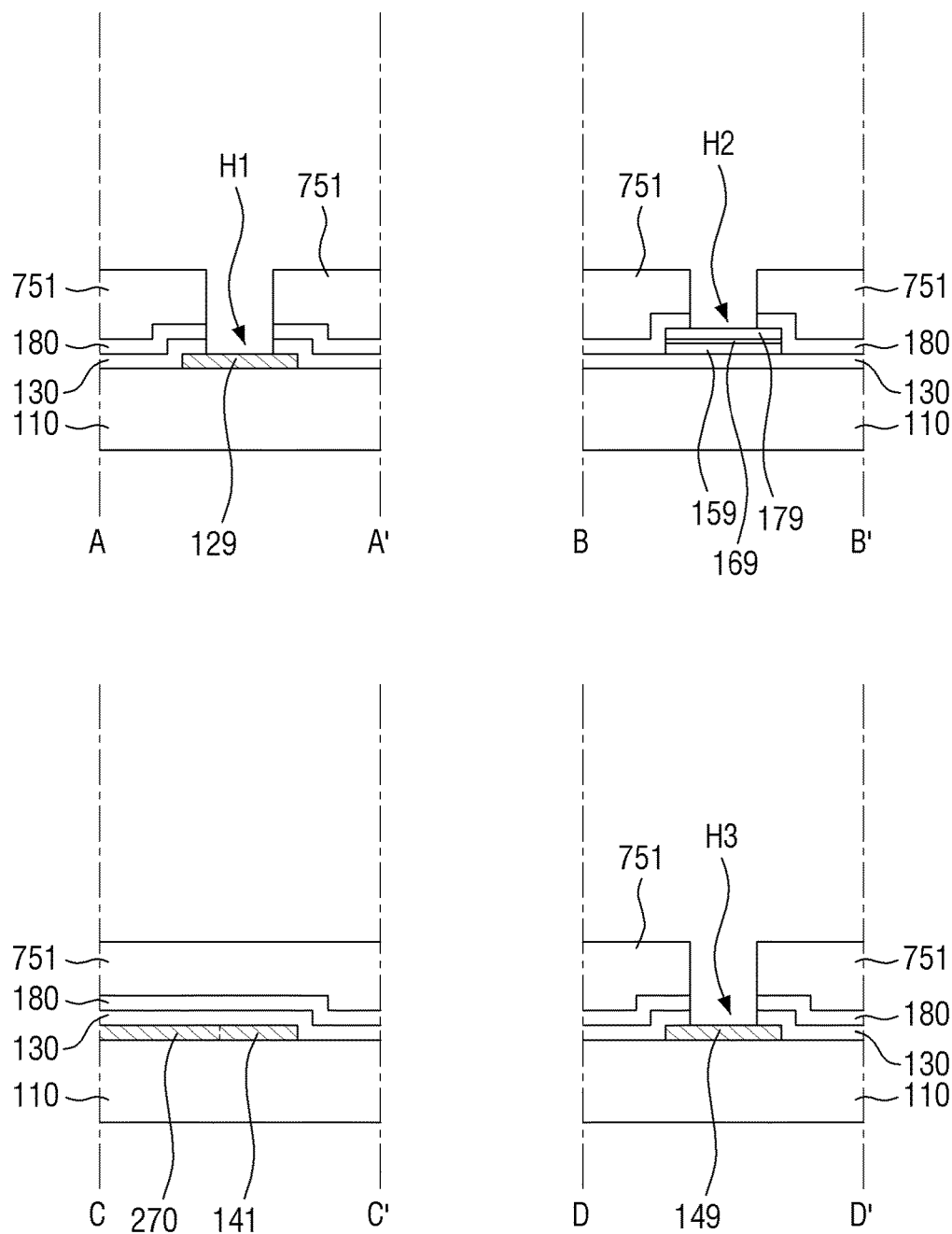

Thereafter, referring to FIGS. 54 through 56, by performing etching using the thirteenth photosensitive layer pattern 730 and the fourteenth photosensitive layer pattern 750 as masks, a first hole H1 which exposes part of the gate pad portion 129, and a third hole H3 which exposes part of the common voltage pad portion 149, may be formed in the gate insulating layer 130 and the insulating layer 180. Also, a second hole H2, which exposes part of the data pad portion 179, may be formed in the insulating layer 180.

Thereafter, the thirteenth photosensitive layer pattern 730 is removed by performing an ashing process. During the removal of the thirteenth photosensitive layer pattern 730, the thickness of the fourteenth sub-photosensitive layer pattern 750 may be reduced by as much as the thickness of the thirteenth photosensitive layer pattern 730, and as a result, a fourteenth sub-photosensitive layer pattern 751 may be formed.

Figure 60:
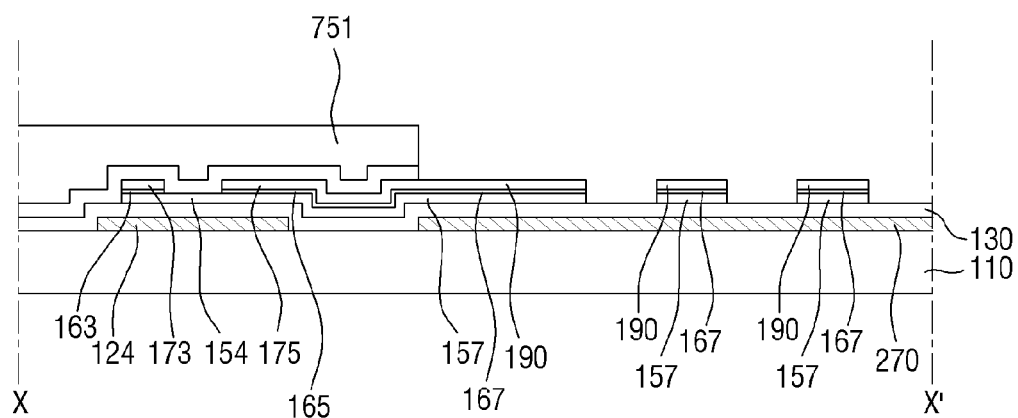
Figure 61:
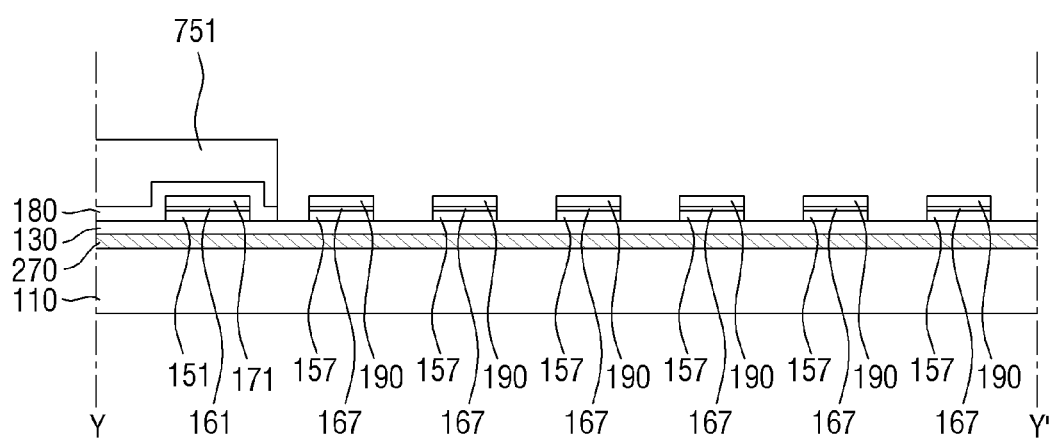
Figure 62:
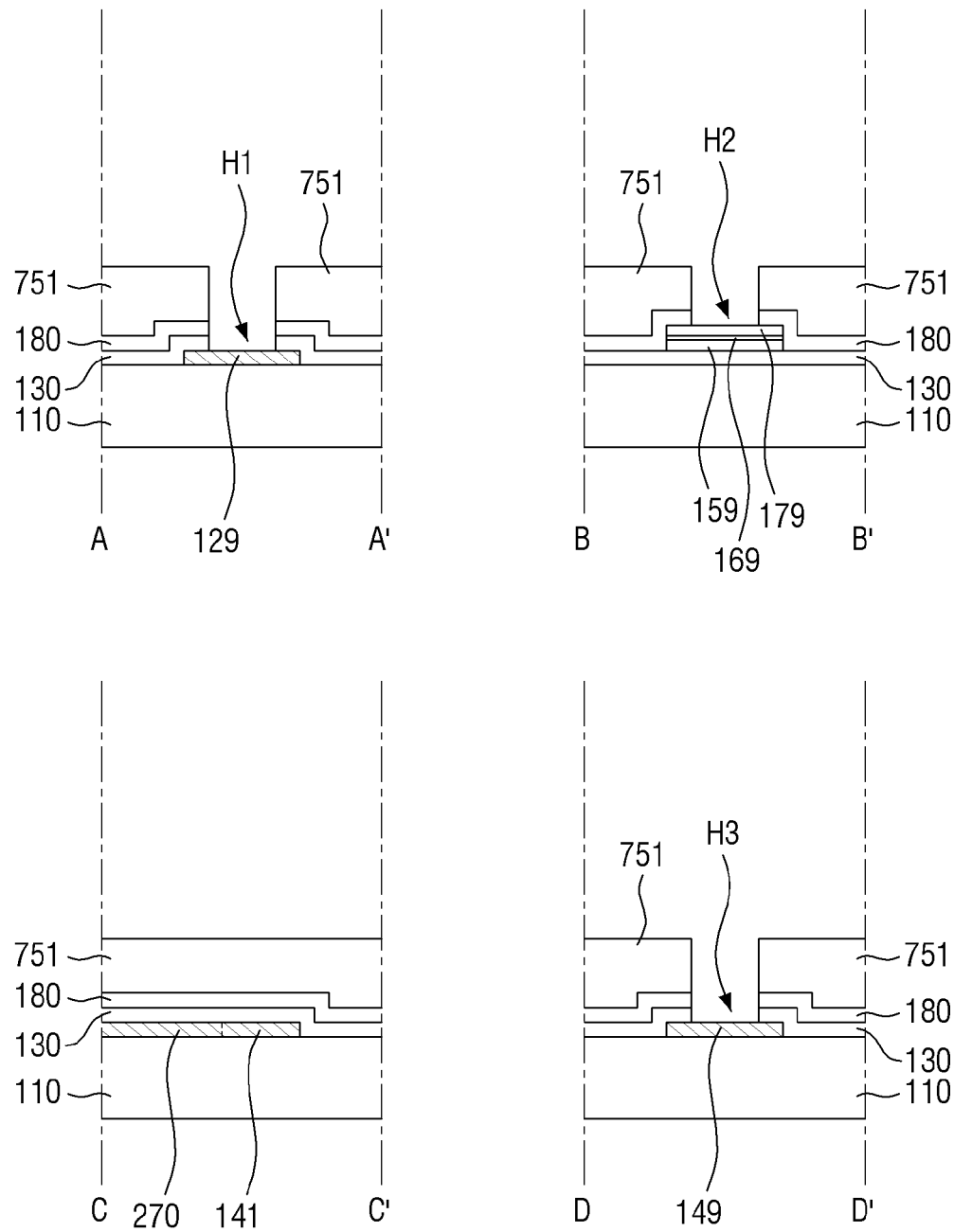
Figure 63:
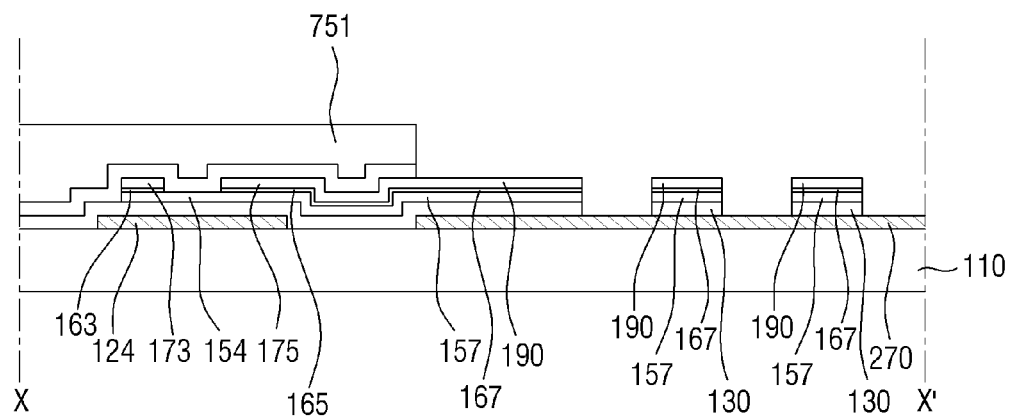
FIGS. 63 through 65 are cross-sectional views illustrating a method of fabricating the display substrate illustrated in FIGS. 9 through 11.
Figure 64:
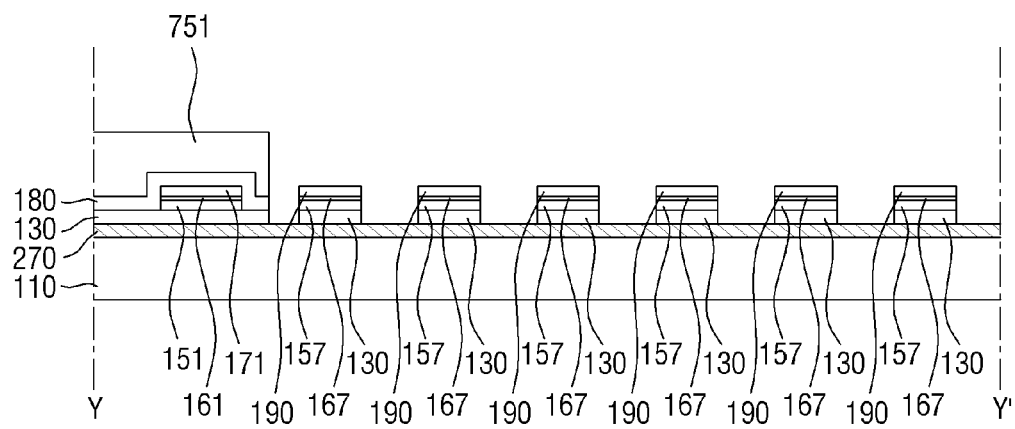
Figure 65:
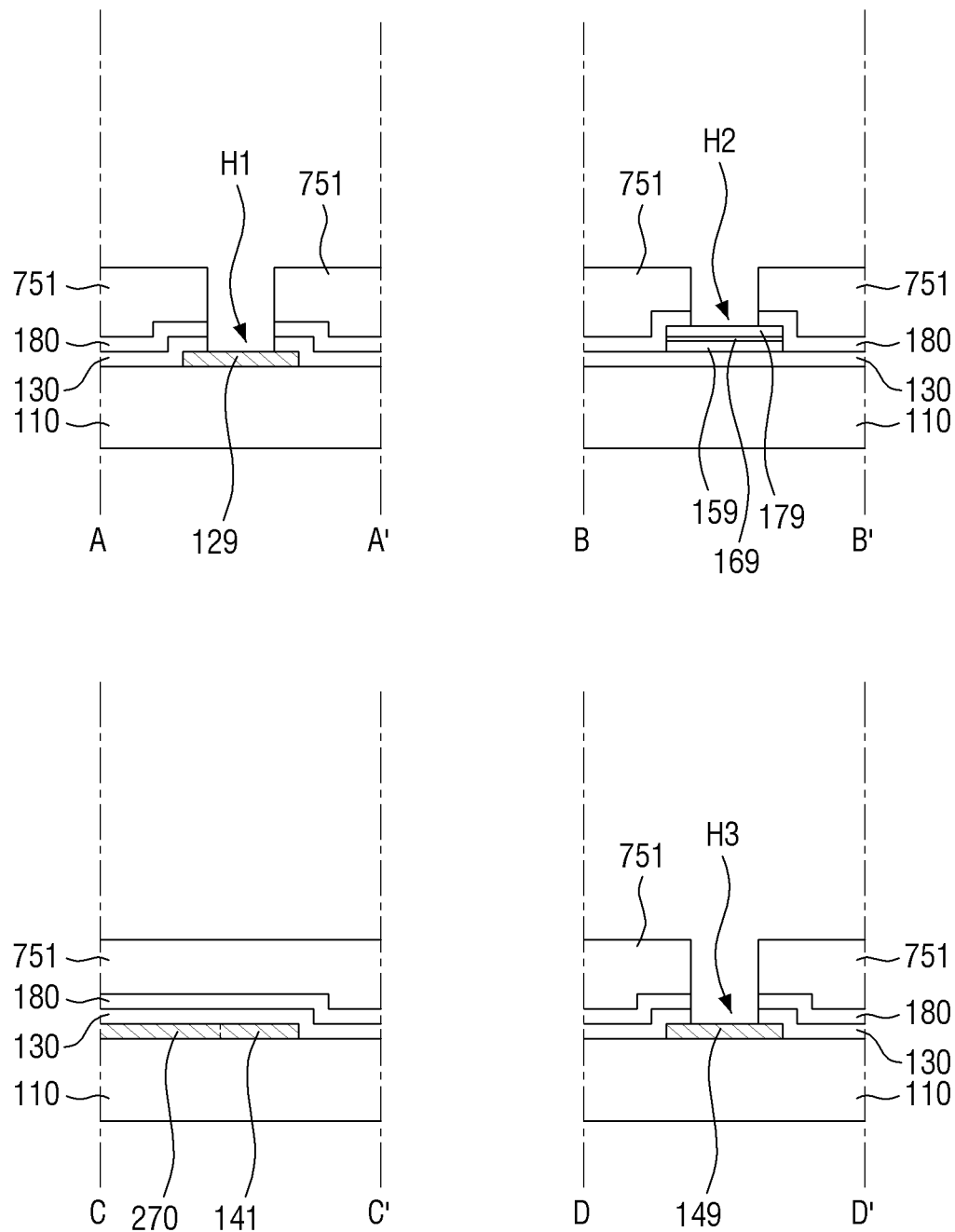

Thereafter, referring to FIGS. 60 through 62, the insulating layer 180 may be removed from above the pixel electrode 190 by etching the insulating layer 180 using the fourteenth sub-photosensitive layer pattern 751 as a mask.

Thereafter, by removing the fourteenth photosensitive layer pattern 751, the display substrate 10a of FIGS. 6 through 8 may be obtained, and the display device 1a of FIGS. 6 through 8 may be fabricated by placing the counter substrate 20 of FIGS. 6 through 8 over the display substrate 10a and inserting the liquid crystal layer 30 of FIGS. 6 through 8 between the display substrate 10a and the counter substrate 20. Since the display substrate 10a can be fabricated using only three mask processes, the manufacture of a display device can be simplified, and the manufacturing cost of a display device can be reduced. In addition, by removing the insulating layer 180 from above the pixel electrode 190, the influence of the insulating layer 180 on an electric field between the pixel electrode 190 and the common electrode 270 may be reduced.

Alternatively, an etching process may be further performed after the removal of the insulating layer 180 from above the pixel electrode 190, as illustrated in FIGS. 60 through 62. For example, referring to FIGS. 63 through 65, part of the gate insulating layer 130 not covered by the pixel electrode 190 may be removed by etching the insulating layer 180 using the fourteenth sub-photosensitive layer pattern 751 as a mask and etching the gate insulating layer 130 using the fourteenth sub-photosensitive layer pattern 751 and the pixel electrode 190 as masks. In other words, part of the gate insulating layer 130 overlapped by the pixel electrode 190 may have substantially the same pattern shape as the pixel electrode 190.

Thereafter, by removing the fourteenth photosensitive layer pattern 751, the display substrate 10b of FIGS. 9 through 11 may be obtained, and the display device 1b of FIGS. 9 through 11 may be fabricated by placing the counter substrate 20 of FIGS. 9 through 11 over the display substrate 10b and inserting the liquid crystal layer 30 of FIGS. 9 through 11 between the display substrate 10b and the counter substrate 20. Since the display substrate 10b can be fabricated using only three mask processes, the manufacture of a display device can be simplified, and the manufacturing cost of a display device can be reduced. In addition, by removing the insulating layer 180 from above the pixel electrode 190, the influence of the insulating layer 180 on an electric field between the pixel electrode 190 and the common electrode 270 may be reduced.

Figure 66:
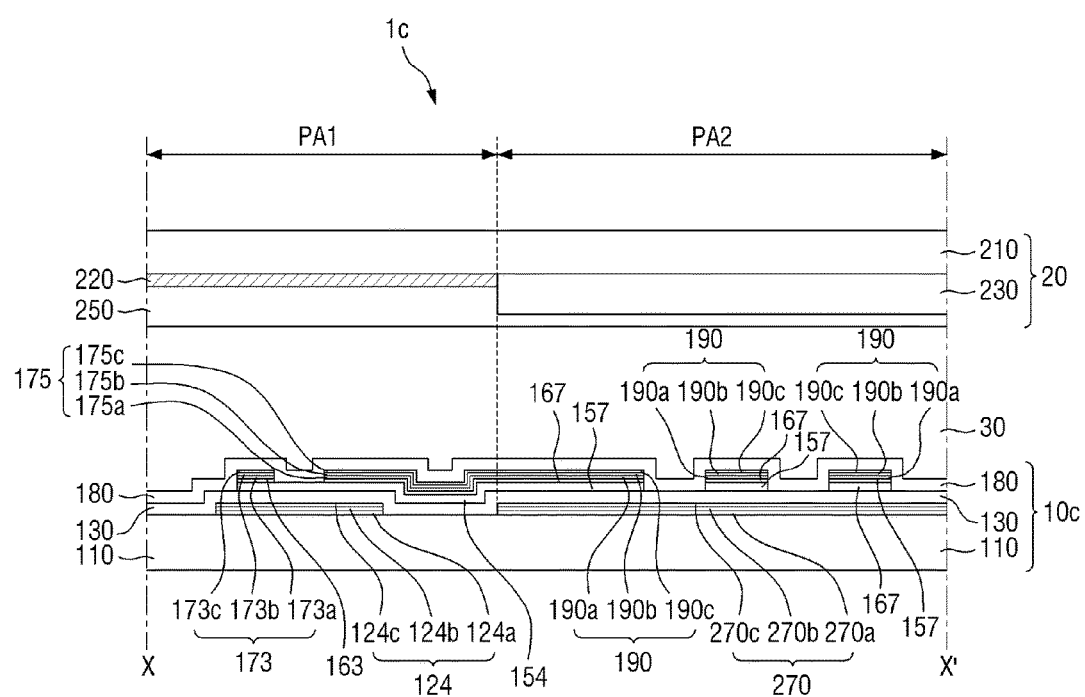
FIG. 66 is a cross-sectional view, taken along line X-X' of FIG. 2, of a display device including a display substrate according to another exemplary embodiment of the present disclosure.
Figure 67:
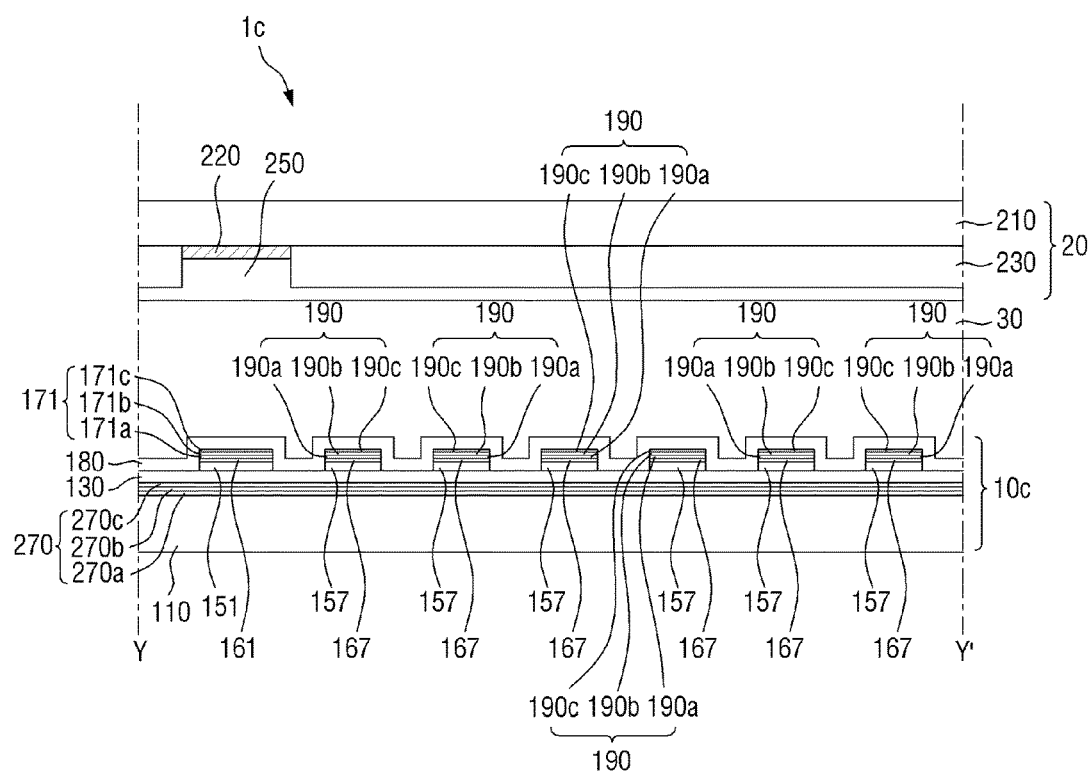
FIG. 67 is a cross-sectional view, taken along line Y-Y' of FIG. 2, of the display device including the display substrate according to the exemplary embodiment of FIG. 66.

FIG. 66 is a cross-sectional view, taken along line X-X' of FIG. 2, of a display device including a display substrate according to another exemplary embodiment of the present disclosure; FIG. 67 is a cross-sectional view, taken along line Y-Y' of FIG. 2, of the display device including the display substrate according to the exemplary embodiment of FIG. 66; and FIG. 68 is a cross-sectional view, taken along lines A-A', B-B', C-C', and D-D' of FIG. 1, of the display device including the display substrate according to the exemplary embodiment of FIG. 66.

Figure 68:
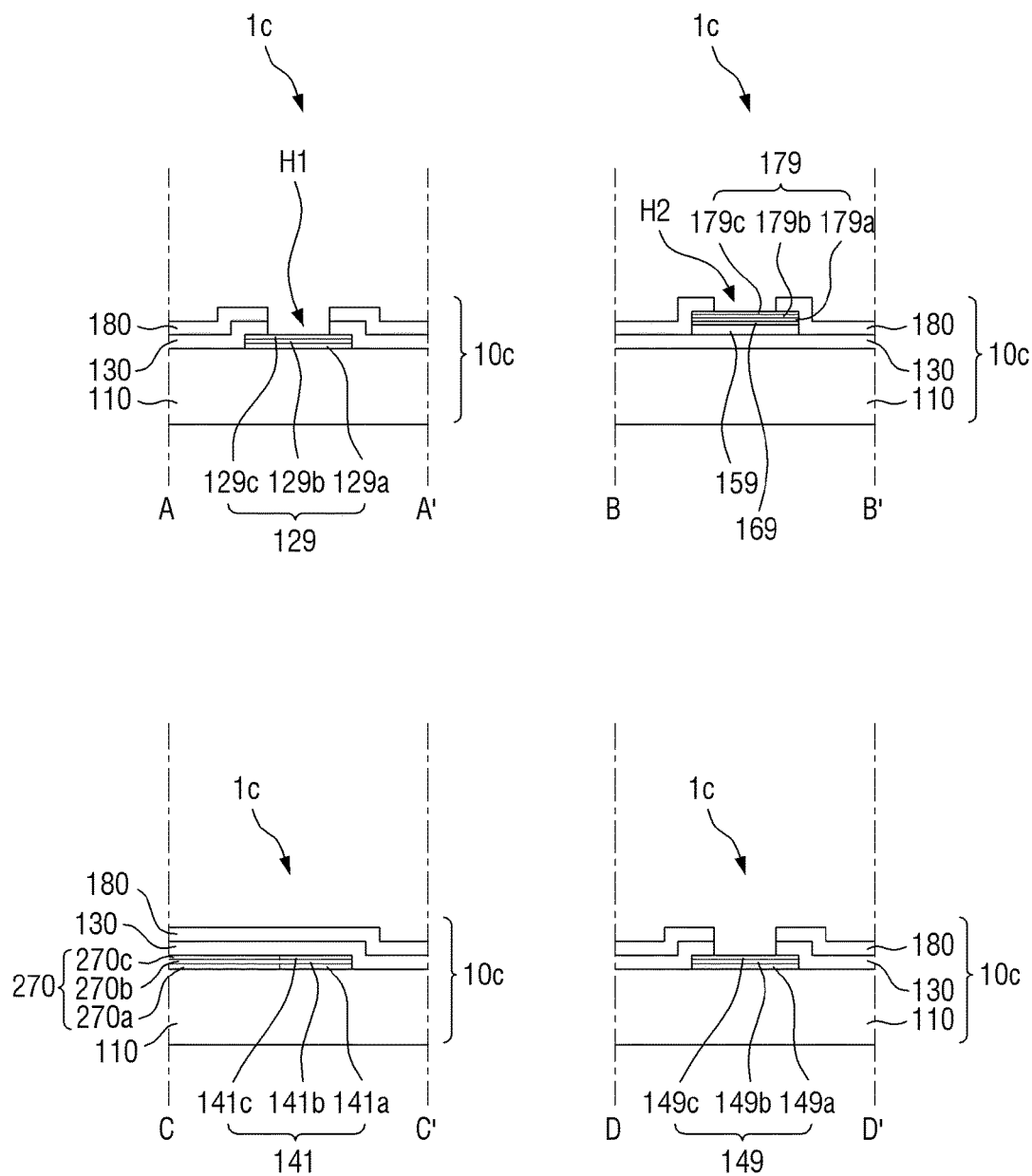
FIG. 68 is a cross-sectional view, taken along lines A-A', B-B', C-C', and D-D' of FIG. 1, of the display device including the display substrate according to the exemplary embodiment of FIG. 66.

Referring to FIGS. 66 through 68, a display device 1c may include a display substrate 10c, a counter substrate 20, and a liquid crystal layer 30.

The display substrate 10c of the display device 1c is substantially the same as the display substrate 10 of FIGS. 2 through 5 except that a data conductor (171, 173, 175, and 179), a pixel electrode 190, a common conductor (270, 141, and 149), and a gate conductor (124 and 129) including a gate line (not illustrated) have a multilayer structure. Thus, the display substrate 10c will hereinafter be described, focusing mainly on differences from the display substrate 10 of FIGS. 2 through 5.

The gate conductor (124 and 129) will hereinafter be described.

The gate conductor (124 and 129) may have a multilayer structure. For example, a gate electrode 124 may include a first sub-gate electrode 124a which is disposed on a first base 110, a second sub-gate electrode 124b which is disposed on the first sub-gate electrode 124a, and a third sub-gate electrode 124c which is disposed on the second sub-gate electrode 124b. The first sub-gate electrode 124a, the second sub-gate electrode 124b, and the third sub-gate electrode 124c may all have substantially the same pattern shape.

Similarly, the gate pad portion 129 may have a multilayer structure and may include a first sub-gate pad portion 129a which is disposed on the first base 110, a second sub-gate pad portion 129b which is disposed on the first sub-gate pad portion 129a, and a third sub-gate pad portion 129c which is disposed on the second sub-gate pad portion 129b. The first sub-gate pad portion 129a, the second sub-gate pad portion 129b, and the third sub-gate pad portion 129c may all have substantially the same pattern shape.

The first sub-gate electrode 124a and the first sub-gate pad portion 129a will hereinafter be collectively referred to as a first gate conductor (124a and 129a), the second sub-gate electrode 124b and the second sub-gate pad portion 129b will hereinafter be collectively referred to as a second gate conductor (124b and 129b), and the third sub-gate electrode 124c and the third sub-gate pad portion 129c will hereinafter be collectively referred to as a third gate conductor (124c and 129c). The first gate conductor (124a and 129a) may comprise a refractory metal such as Mo, Cr, Ti, or Ta or an alloy thereof. The second gate conductor (124b and 129b) may comprise a reflective metal such as Al, an Al-based metal such as an Al alloy, Ag, or an Ag-based metal such as an Ag alloy. In a case in which the third gate conductor (124c and 129c) is additionally provided on the second gate conductor (124b and 129b), the third gate conductor (124c and 129c) may comprise a transparent conductive material. For example, the transparent conductive material may be ITO, IZO, ZO, carbon nanotube, graphene, or AgNW. In some exemplary embodiments, the third gate conductor (124c and 129c) may not be provided.

The common conductor (270, 141, and 149) will hereinafter be described.

The common conductor (270, 141, and 149) may have a multilayer structure and may have the same stack structure as the gate conductor (124 and 129). For example, a common electrode 270 may include a first sub-common electrode 270a which is disposed on the first base 110, a second sub-common electrode 270b which is disposed on the first sub-common electrode 270a, and a third sub-common electrode 270c which is disposed on the second sub-common electrode 270b. The first sub-common electrode 270a, the second sub-common electrode 270b, and the third sub-common electrode 270c may all have substantially the same pattern shape.

Similarly, a common voltage line 141 and a common voltage pad portion 149 may have a multilayer structure. The common voltage line 141 may include a first sub-common voltage line 141a, a second sub-common voltage line 141b, and a third sub-common voltage line 141c, which are sequentially disposed on the first base 110. The first sub-common voltage line 141a, the second sub-common voltage line 141b, and the third sub-common voltage line 141c may all have substantially the same pattern shape. The common voltage pad portion 149 may include a first sub-common voltage pad portion 149a, a second sub-common voltage pad portion 149b, and a third sub-common voltage pad portion 149c, which are sequentially disposed on the first base 110. The first sub-common voltage pad portion 149a, the second sub-common voltage pad portion 149b, and the third sub-common voltage pad portion 149c may all have substantially the same pattern shape.

The first sub-common electrode 270a, the first sub-common voltage line 141a, and the first sub-common voltage pad portion 149a will hereinafter be collectively referred to as a first common conductor (270a, 141a, and 149a). Similarly, the second sub-common electrode 270b, the second sub-common voltage line 141b, and the second sub-common voltage pad portion 149b will hereinafter be collectively referred to as a second common conductor (270b, 141b, and 149b). Likewise, the third sub-common electrode 270c, the third sub-common voltage line 141c, and the third sub-common voltage pad portion 149c will hereinafter be collectively referred to as a third common conductor (270c, 141c, and 149c). The first common conductor (270a, 141a, and 149a) may comprise the same material as the first gate conductor (124a and 129a) and may have substantially the same thickness as the first gate conductor (124a and 129a). The second common conductor (270b, 141b, and 149b) may comprise the same material (for example, a reflective metal) as the second gate conductor (124b and 129b) and may have substantially the same thickness as the second gate conductor (124b and 129b). The third common conductor (270c, 141c, and 149c) may comprise the same material as the third gate conductor (124c and 129c) and may have substantially the same thickness as the third gate conductor (124c and 129c).

As mentioned above, the common conductor (270, 141, and 149) and the gate conductor (124 and 129) may be formed at the same time using a single photomask.

The second sub-common electrode 270b of the common electrode 270, like the second sub-gate electrode 124b, may comprise a reflective metal, and thus the common electrode 270 may serve as a reflective electrode. Accordingly, the display device 1c may be implemented as a reflective LCD device.

In some exemplary embodiments, in a case in which the third gate conductor (124c and 129c) is not provided, the third common conductor (270c, 141c, and 149c) may also be absent.

The data conductor (171, 173, 175, and 179) will hereinafter be described.

The data conductor (171, 173, 175, and 179) may have a multilayer structure. For example, a data line 171 may include a first sub-data line 171a, a second sub-data line 171b, and a third sub-data line 171c, which are sequentially disposed on a data ohmic contact 161 or a first semiconductor pattern 151. The first sub-data line 171a, the second sub-data line 171b, and the third sub-data line 171c may all have substantially the same pattern shape.

Similarly, a source electrode 173, a drain electrode 175, and a data pad portion 179 may have a multilayer structure. The source electrode 173 may include a first sub-source electrode 173a, a second sub-source electrode 173b, and a third sub-source electrode 173c, which are sequentially disposed on a source ohmic contact 163 or a semiconductor layer 154. The first sub-source electrode 173a, the second sub-source electrode 173b, and the third sub-source electrode 173c may all have substantially the same pattern shape. The drain electrode 175 may include a first sub-drain electrode 175a, a second sub-drain electrode 175b, and a third sub-drain electrode 175c, which are sequentially disposed on a drain ohmic contact 165 or the semiconductor layer 154. The first sub-drain electrode 175a, the second sub-drain electrode 175b, and the third sub-drain electrode 175c may all have substantially the same pattern shape. The data pad portion 179 may include a first sub-data pad portion 179a, a second sub-data pad portion 179b, and a third sub-data pad portion 179c, which are sequentially disposed on a data pad ohmic contact 169 or a semiconductor pattern 159. The first sub-data pad portion 179a, the second sub-data pad portion 179b, and the third sub-data pad portion 179c may all have substantially the same pattern shape.

The first sub-data line 171a, the first sub-source electrode 173a, the first sub-drain electrode 175a, and the first sub-data pad portion 179a will hereinafter be collectively referred to as a first data conductor (171a, 173a, 175a, and 179a). Likewise, the second sub-data line 171b, the second sub-source electrode 173b, the second sub-drain electrode 175b, and the second sub-data pad portion 179b will hereinafter be collectively referred to as a second data conductor (171b, 173b, 175b, and 179b). Similarly, the third sub-data line 171c, the third sub-source electrode 173c, the third sub-drain electrode 175c, and the third sub-data pad portion 179c will hereinafter be collectively referred to as a third data conductor (171c, 173c, 175c, and 179c). The first data conductor (171a, 173a, 175a, and 179a) may comprise a refractory metal such as Mo, Cr, Ti, or Ta or an alloy thereof. The second data conductor (171b, 173b, 175b, and 179b) may comprise a low-resistance metal. The low-resistance metal may be a reflective metal such as Al, an Al-based metal such as an Al alloy, Ag, or an Ag-based metal such as an Ag alloy. The third data conductor (171c, 173c, 175c, and 179c) may comprise a transparent conductive material such as ITO, IZO, ZO, carbon nanotube, graphene, or AgNW.

The pixel electrode 190 will hereinafter be described.

The pixel electrode 190 may have a multilayer structure and may have the same stack structure as the data conductor (171, 173, 175, and 179). For example, the pixel electrode 190 may include a first sub-pixel electrode 190a, a second sub-pixel electrode 190b, and a third sub-pixel electrode 190c, which are sequentially disposed on a pixel ohmic contact 167 or a third semiconductor pattern 157. The first sub-pixel electrode 190a, the second sub-pixel electrode 190b, and the third sub-pixel electrode 190c may all have substantially the same pattern shape.

The first sub-pixel electrode 190a may comprise the same material as the first data conductor (171a, 173a, 175a, and 179a) and may have substantially the same thickness as the first data conductor (171a, 173a, 175a, and 179a). The first sub-pixel electrode 190a may be connected to the first sub-drain electrode 175a and may extend from the first sub-drain electrode 175a. Similarly, the second sub-pixel electrode 190b may comprise the same material as the second data conductor (171b, 173b, 175b, and 179b) and may have substantially the same thickness as the second data conductor (171b, 173b, 175b, and 179b). The second sub-pixel electrode 190b may be connected to the second sub-drain electrode 175b and may extend from the second sub-drain electrode 175b. Similarly, the third sub-pixel electrode 190c may comprise the same material as the third data conductor (171c, 173c, 175c, and 179c) and may have substantially the same thickness as the third data conductor (171c, 173c, 175c, and 179c). The third sub-pixel electrode 190c may be connected to the third sub-drain electrode 175c and may extend from the third sub-drain electrode 175c.

As mentioned above, the pixel electrode 190 and the data conductor (171, 173, 175, and 179) may be formed at the same time using a single photomask.

The common conductor (270, 141, and 149), the gate conductor (124 and 129), the pixel electrode 190, and the data conductor (171, 173, 175, and 179) are each illustrated as having a multilayer structure, but the present disclosure is not limited thereto. In some other exemplary embodiments, the common conductor (270, 141, and 149) and the gate conductor (124 and 129) may have a multilayer structure, and the pixel electrode 190 and the data conductor (171, 173, 175, and 179) may have a single-layer structure. In some other exemplary embodiments, the common conductor (270, 141, and 149) and the gate conductor (124 and 129) may have a single-layer structure, and the pixel electrode 190 and the data conductor (171, 173, 175, and 179) may have a multilayer structure. The common conductor (270, 141, and 149) and the gate conductor (124 and 129) are illustrated as having a triple-layer structure, but the present disclosure is not limited thereto. That is, alternatively, the common conductor (270, 141, and 149) and the gate conductor (124 and 129) may have a multilayer structure other than a triple-layer structure. Similarly, the pixel electrode 190 and the data conductor (171, 173, 175, and 179) are illustrated as having a triple-layer structure, but the present disclosure is not limited thereto. That is, alternatively, the pixel electrode 190 and the data conductor (171, 173, 175, and 179) may have a multilayer structure other than a triple-layer structure. Any combination of single- and/or multiple-layer conductor structures is contemplated.

Figure 69:
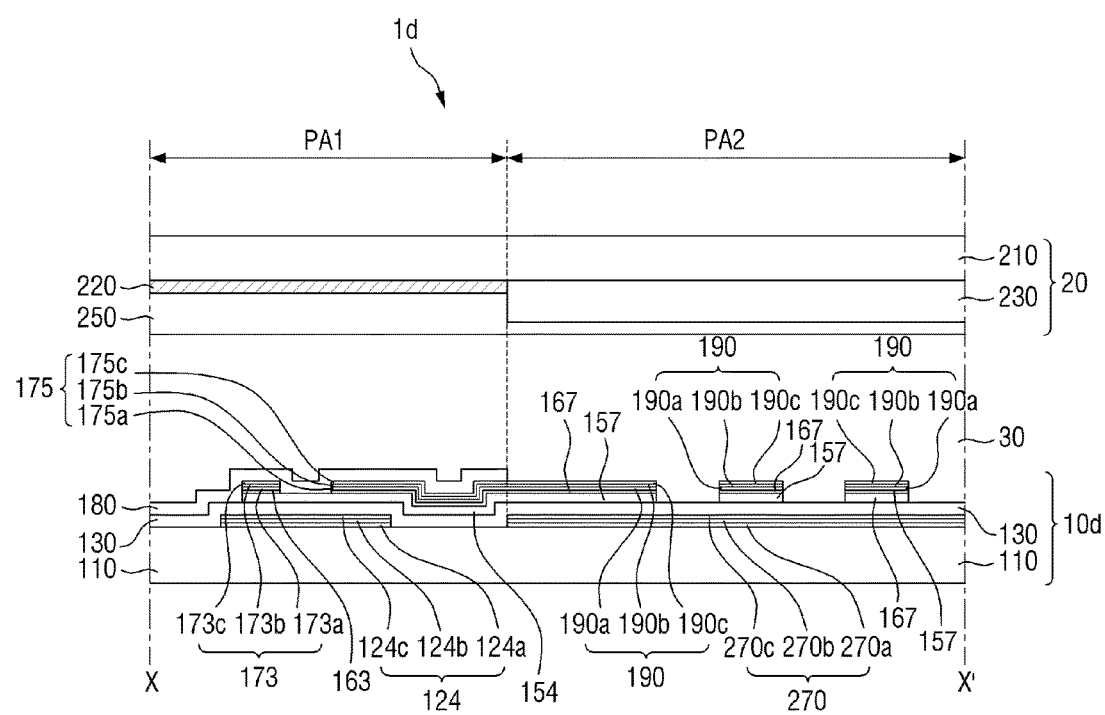
FIG. 69 is a cross-sectional view, taken along line X-X' of FIG. 2, of a display device including a display substrate according to another exemplary embodiment of the present disclosure.
Figure 70:
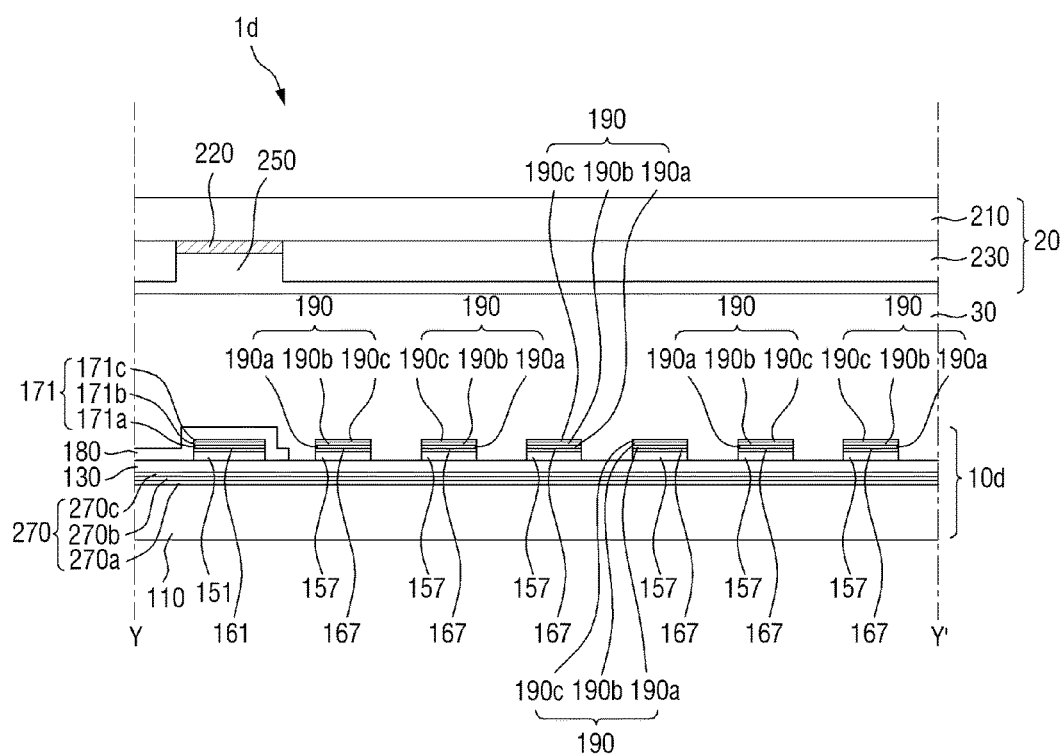
FIG. 70 is a cross-sectional view, taken along line Y-Y' of FIG. 2, of the display device including the display substrate according to the exemplary embodiment of FIG. 69.

FIG. 69 is a cross-sectional view, taken along line X-X' of FIG. 2, of a display device including a display substrate according to another exemplary embodiment of the present disclosure; FIG. 70 is a cross-sectional view, taken along line Y-Y' of FIG. 2, of the display device including the display substrate according to the exemplary embodiment of FIG. 69; and FIG. 71 is a cross-sectional view, taken along lines A-A', B-B', C-C', and D-D' of FIG. 1, of the display device including the display substrate according to the exemplary embodiment of FIG. 69.

Figure 71:
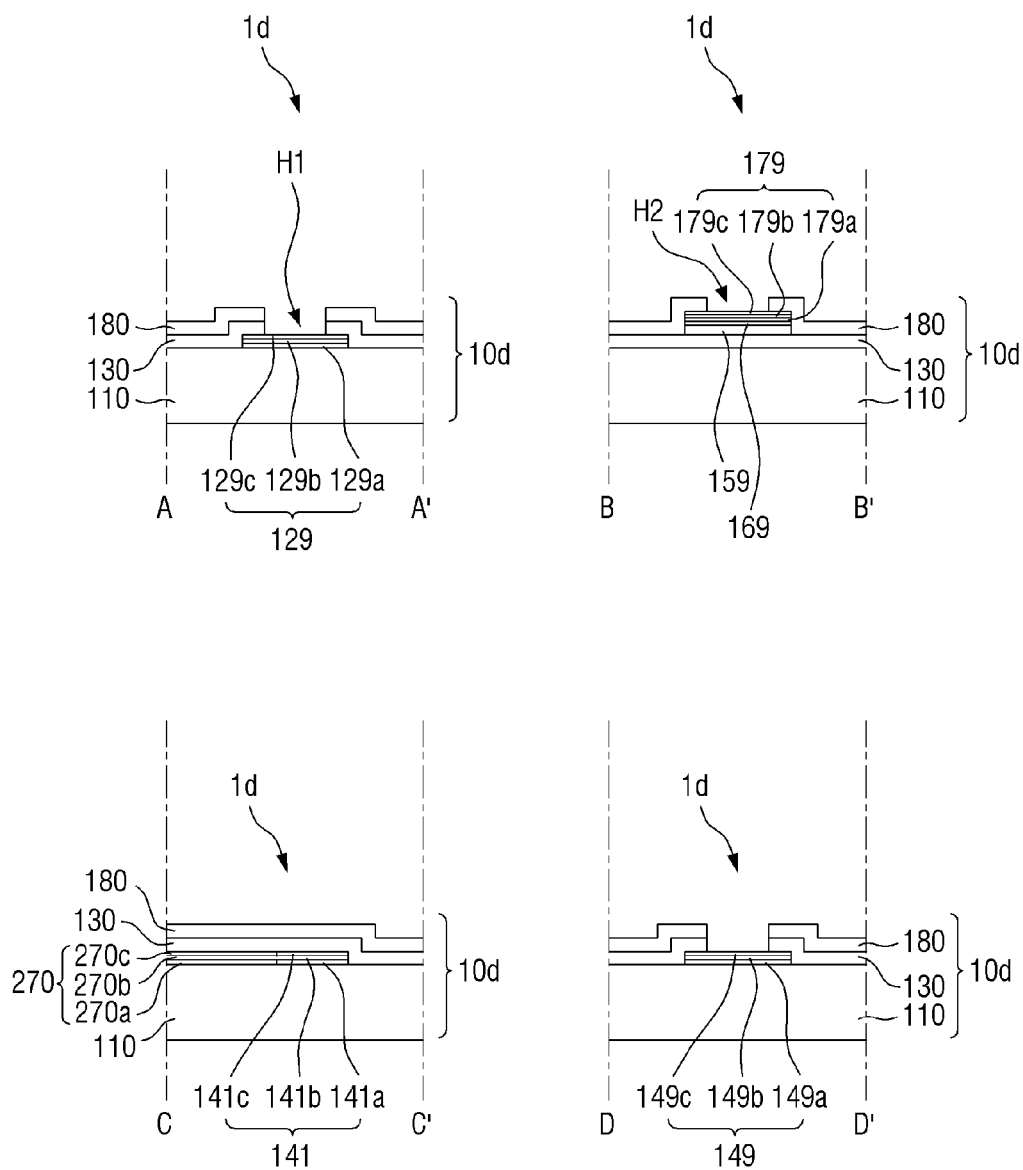
FIG. 71 is a cross-sectional view, taken along lines A-A', B-B', C-C', and D-D' of FIG. 1, of the display device including the display substrate according to the exemplary embodiment of FIG. 69.

Referring to FIGS. 69 through 71, a display device 1d may include a display substrate 10d, a counter substrate 20, and a liquid crystal layer 30.

The display substrate 10d of the display device 1d is substantially the same as the display substrate 10a of FIGS. 6 through 8 except that a data conductor (171, 173, 175, and 179), a pixel electrode 190, a common conductor (270, 141, and 149), and a gate conductor (124 and 129) including a gate line (not illustrated) have a multilayer structure. The multilayer structure of each of the data conductor (171, 173, 175, and 179), the pixel electrode 190, the common conductor (270, 141, and 149), and the gate conductor (124 and 129) including the gate line (not illustrated) is as described above with reference to FIGS. 66 through 68, and thus, a detailed description thereof will be omitted.

Figure 72:
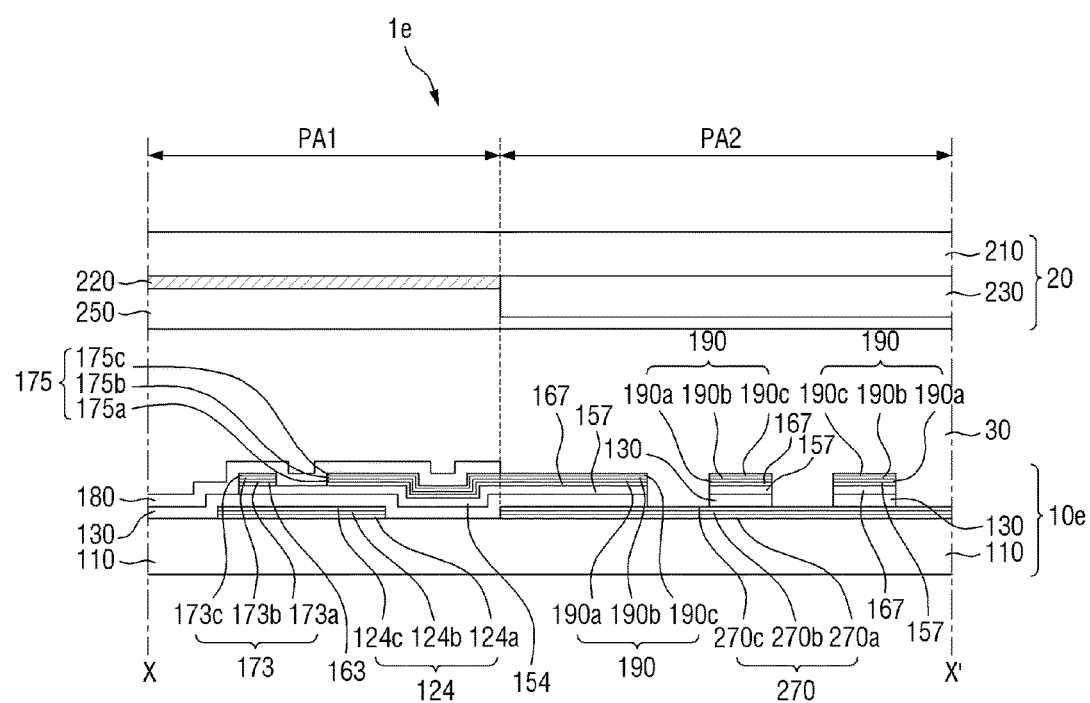
FIG. 72 is a cross-sectional view, taken along line X-X' of FIG. 2, of a display device including a display substrate according to another exemplary embodiment of the present disclosure.
Figure 73:
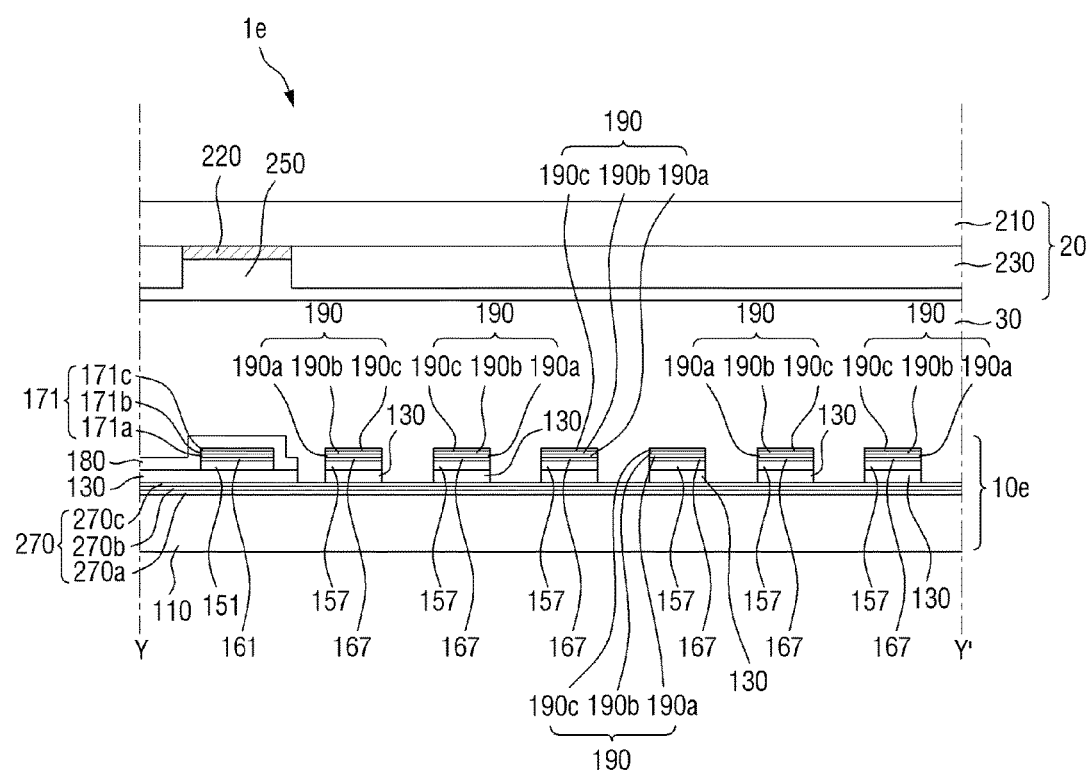
FIG. 73 is a cross-sectional view, taken along line Y-Y' of FIG. 2, of the display device including the display substrate according to the exemplary embodiment of FIG. 72.

FIG. 72 is a cross-sectional view, taken along line X-X' of FIG. 2, of a display device including a display substrate according to another exemplary embodiment of the present disclosure; FIG. 73 is a cross-sectional view, taken along line Y-Y' of FIG. 2, of the display device including the display substrate according to the exemplary embodiment of FIG. 72; and FIG. 74 is a cross-sectional view, taken along lines A-A', B-B', C-C', and D-D' of FIG. 1, of the display device including the display substrate according to the exemplary embodiment of FIG. 72.

Figure 74:
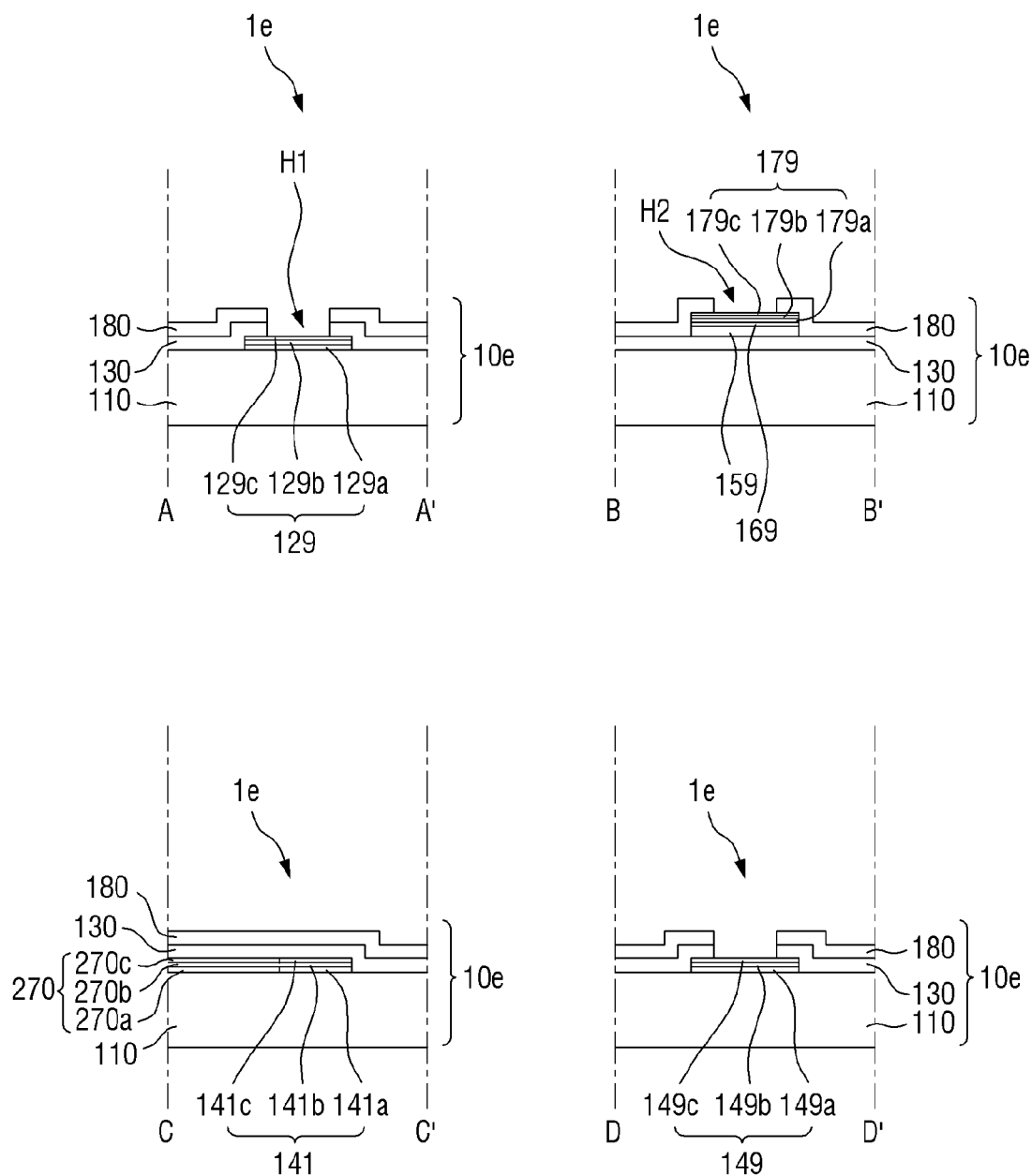
FIG. 74 is a cross-sectional view, taken along lines A-A', B-B', C-C', and D-D' of FIG. 1, of the display device including the display substrate according to the exemplary embodiment of FIG. 72.

Referring to FIGS. 72 through 74, a display device 1e may include a display substrate 10e, a counter substrate 20, and a liquid crystal layer 30.

The display substrate 10e of the display device 1e is substantially the same as the display substrate 10b of FIGS. 9 through 11 except that a data conductor (171, 173, 175, and 179), a pixel electrode 190, a common conductor (270, 141, and 149), and a gate conductor (124 and 129) including a gate line (not illustrated) have a multilayer structure. The multilayer structure of each of the data conductor (171, 173, 175, and 179), the pixel electrode 190, the common conductor (270, 141, and 149), and the gate conductor (124 and 129) including the gate line (not illustrated) is as described above with reference to FIGS. 66 through 68, and thus, a detailed description thereof will be omitted.

Figure 75:
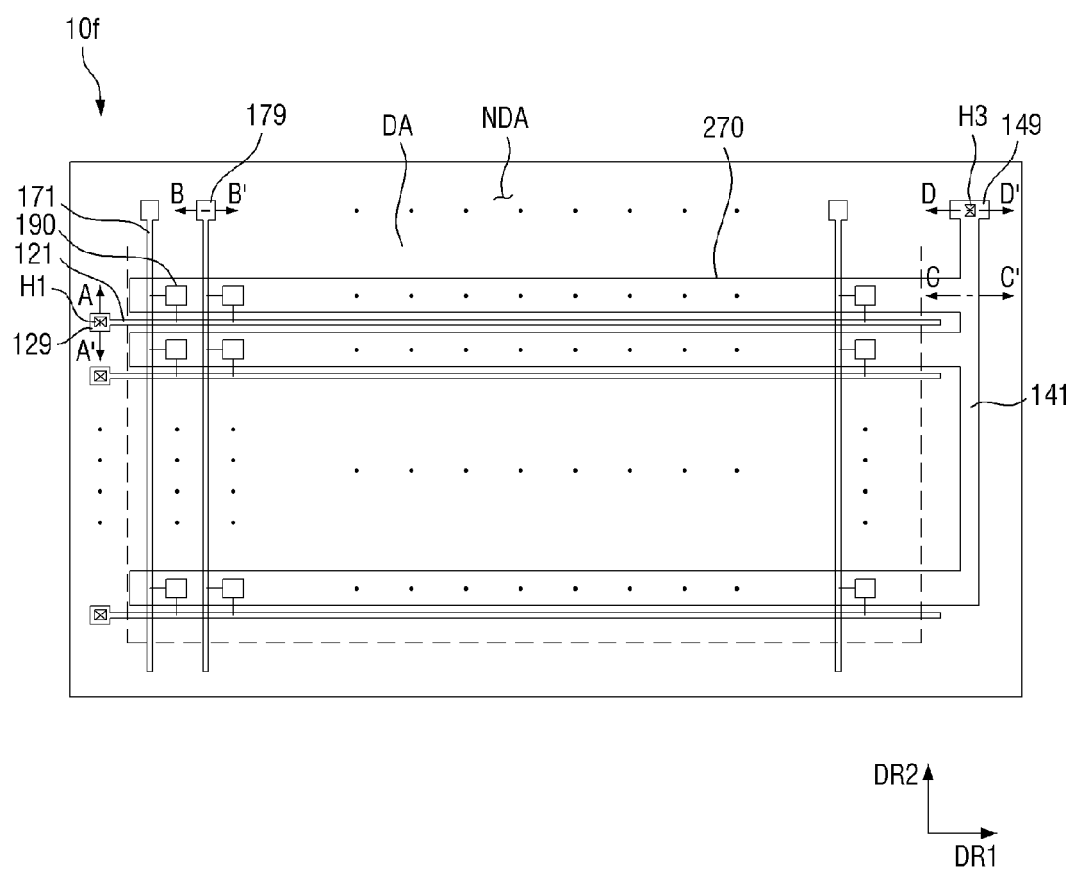
FIG. 75 is a schematic plan view of a display substrate according to another exemplary embodiment of the present disclosure.

FIG. 75 is a schematic plan view of a display substrate according to another exemplary embodiment of the present disclosure.

Referring to FIG. 75, a display substrate 10f is substantially the same as the display substrate 10 of FIG. 1 except that there exists no second hole (H2 of FIG. 1) exposing a data pad portion 179. The display substrate 10f will hereinafter be described with reference to FIGS. 76 through 78, focusing mainly on differences from the display substrate 10 of FIG. 1.

Figure 76:
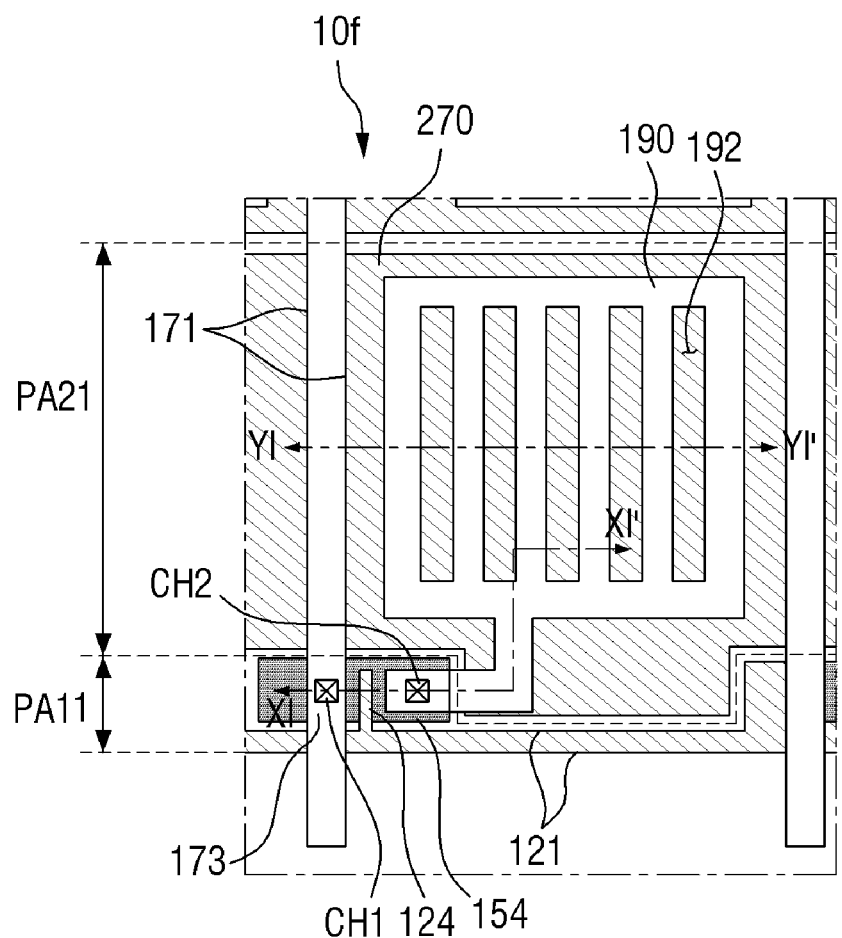
FIG. 76 is a schematic plan view of a pixel of the display substrate according to the exemplary embodiment of FIG. 75.
Figure 77:
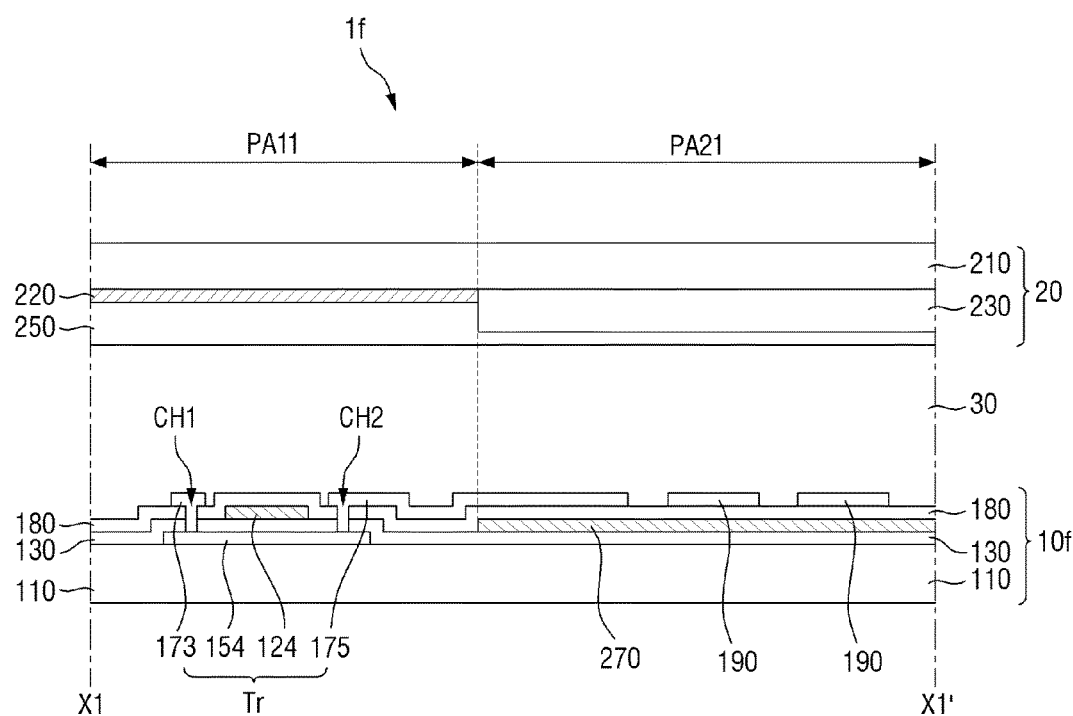
FIG. 77 is a cross-sectional view, taken along line X1-X1' of FIG. 76, of the display device including the display substrate according to the exemplary embodiment of FIG. 75.
Figure 78:
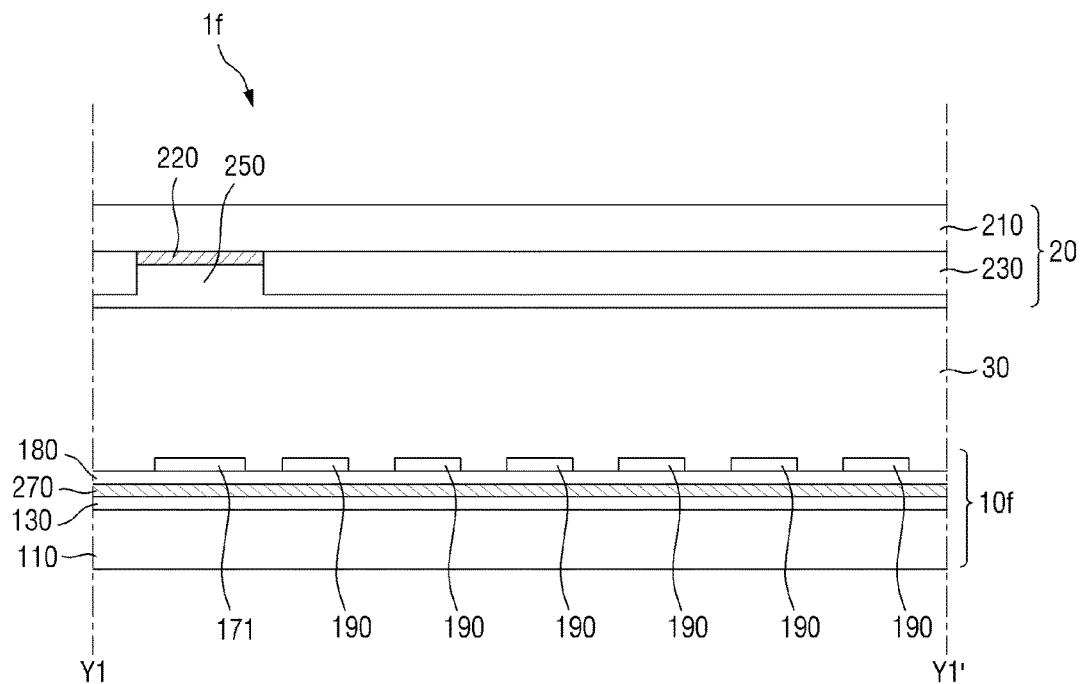
FIG. 78 is a cross-sectional view, taken along line Y1-Y1' of FIG. 76, of the display device including the display substrate according to the exemplary embodiment of FIG. 75.
Figure 79:
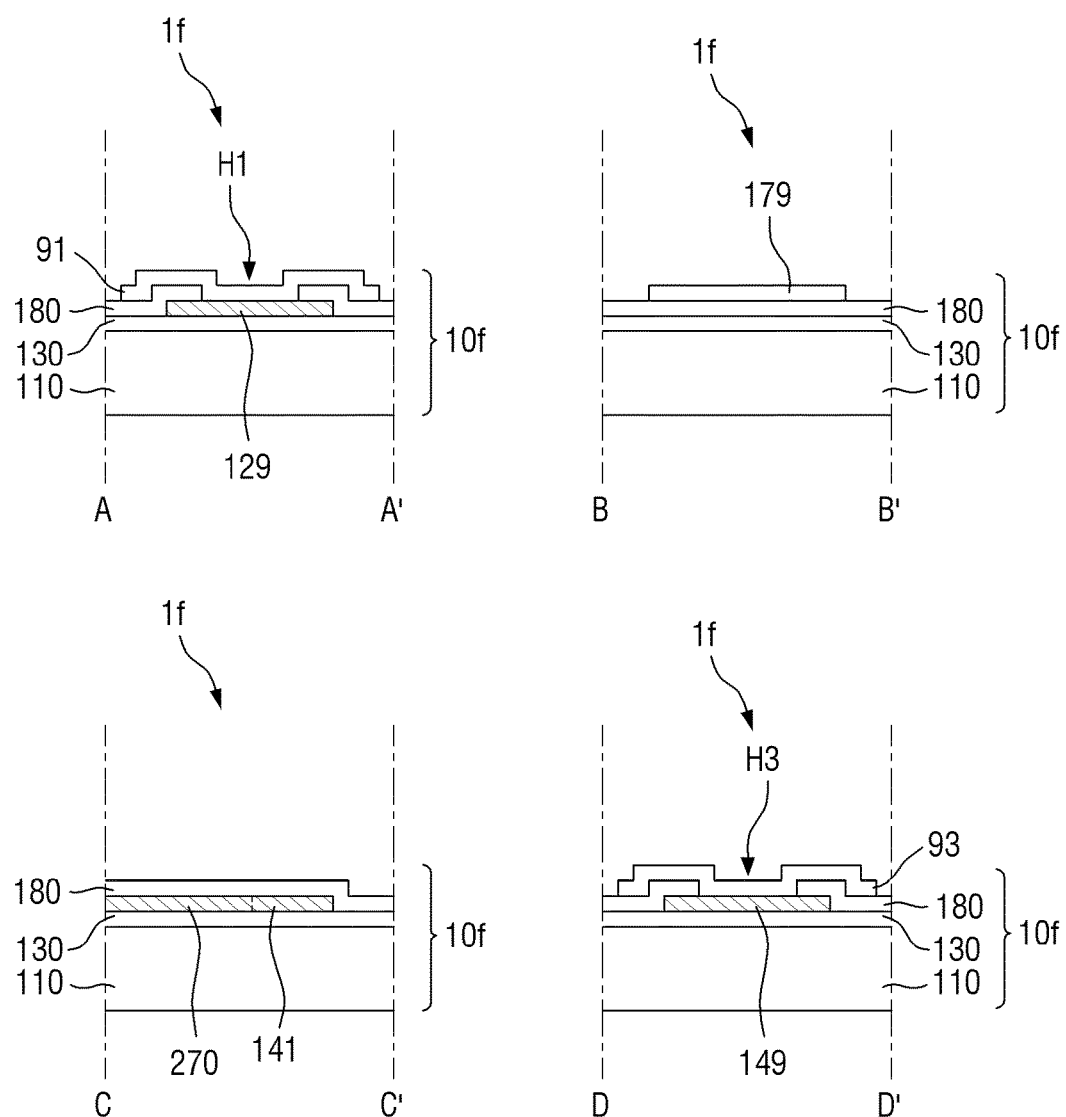
FIG. 79 is a cross-sectional view, taken along lines A-A', B-B', C-C', and D-D' of FIG. 75, of the display device including the display substrate according to the exemplary embodiment of FIG. 75.

FIG. 76 is a schematic plan view of a pixel of the display substrate according to the exemplary embodiment of FIG. 75; FIG. 77 is a cross-sectional view, taken along line X1-X1' of FIG. 76, of the display device including the display substrate according to the exemplary embodiment of FIG. 75; FIG. 78 is a cross-sectional view, taken along line Y1-Y1' of FIG. 76, of the display device including the display substrate according to the exemplary embodiment of FIG. 75; and FIG. 79 is a cross-sectional view, taken along lines A-A', B-B', C-C', and D-D' of FIG. 75, of the display device including the display substrate according to the exemplary embodiment of FIG. 75.

Referring to FIGS. 76 through 79, a display device 1f may include the display substrate 10f, a counter substrate 20 which faces the display substrate 10f, and a liquid crystal layer 30 which is disposed between the display substrate 10f and the counter substrate 20.

The display substrate 10f will hereinafter be described.

A semiconductor layer 154 may be disposed on a first base 110.

A gate insulating layer 130 may be disposed on the semiconductor layer 154. The gate insulating layer 130 may be formed on the first base 110 and may cover the semiconductor layer 154. The gate insulating layer 130 may be formed of an insulating material and may have a single- or multilayer structure.

A gate conductor (121, 124, and 129) may be disposed on the gate insulating layer 130. In some exemplary embodiments, the gate conductor (121, 124, and 129) may be disposed directly on the gate insulating layer 130.

The gate conductor (121, 124, and 129) may include a gate line 121, a gate electrode 1214, and a gate pad portion 129.

The gate conductor (121, 124, and 129) may comprise a conductive material. In some exemplary embodiments, the gate conductor (121, 124, and 129) may comprise a metal material with desirable reflectivity, i.e., a reflective material such as Al, an Al-based metal such as an Al alloy, Ag, or an Ag-based metal such as an Ag alloy. The gate conductor (121, 124, and 129) may have a single-layer structure, but the present disclosure is not limited thereto. For example, the gate conductor (121, 124, and 129) may have a multi-layer structure consisting of at least two conductive layers having different physical properties.

Part of a display area DA in and around which the gate line 121, the gate electrode 124, and the semiconductor layer 154 are disposed will hereinafter be referred to as a first area PA11, and part of the display area DA that differs from the first area PA11 will hereinafter be referred to as a second area PA21.

A common conductor (270, 141, and 149) may be disposed on the gate insulating layer 130 and may be disposed on the same layer as the gate conductor (121, 124, and 129). For example, the common conductor (270, 141, and 149) may be disposed directly on the gate insulating layer 130.

The common conductor (270, 141, and 149) may include a common electrode 270, a common voltage line 141, and a common voltage pad portion 149. As mentioned above, the common electrode 270 may be disposed in the display area DA of the display substrate 10f, and the common voltage line 141 and common voltage pad portion 149 may be disposed in a non-display area NDA of the display substrate 10f.

The common electrode 270, which has a flat or planar shape, may be disposed in the second area PA21 of the display substrate 10f, but not in the first area PA11.

The common voltage line 141, which transmits a common voltage to the common electrode 270, may be connected to the common electrode 270. Common electrodes 270 that are adjacent in a second direction DR2 may be electrically connected by the common voltage line 141.

The common voltage pad portion 149 may be connected to another layer or an external driving circuit such as a common voltage providing portion, and may thus be provided with a common voltage. In this manner, the common voltage provided to the common voltage pad portion 149 may be transmitted to the common electrode 270 through the common voltage line 141.

The common conductor (270, 141, and 149) may comprise a conductive material. In some exemplary embodiments, the common conductor (270, 141, and 149) may comprise a metal material with excellent reflectivity, i.e., a reflective metal such as an Al alloy, Ag, or an Ag-based metal such as an Ag alloy. The common conductor (270, 141, and 149) may comprise the same material as the gate conductor (121, 124, and 129). That is, the display device 1f may be a reflective LCD device.

The common conductor (270, 141, and 149) may have the same stack structure as the gate conductor (121, 124, and 129).

An insulating layer 180 may be disposed on the gate conductor (121, 124, and 129) and the common conductor (270, 141, and 149). The insulating layer 180 may be formed on the gate insulating layer 130 and may cover the gate conductor (121, 124, and 129) and the common conductor (270, 141, and 149), and the gate conductor (121, 124, and 129) and the common conductor (270, 141, and 149) may be insulated from each other by the insulating layer 180. The insulating layer 180 may be formed of an insulating material. In some exemplary embodiments, the insulating layer 180 may comprise an inorganic insulating material such as silicon oxide, silicon nitride, or silicon oxynitride.

A data conductor (171, 173, 175, and 179) may be disposed on the insulating layer 180 and may include a data line 171, a source electrode 173, a drain electrode 175, and a data pad portion 179.

The data line 171, the source electrode 173, and the drain electrode 175 may be disposed in the display area DA, and the data pad portion 179 may be disposed in the non-display area NDA. The source electrode 173 and the drain electrode 175 may be disposed in the first area PA11 of the display area DA.

The source electrode 173 may be disposed on the insulating layer 180 and may be connected to the data line 171. In some exemplary embodiments, the source electrode 173 may not project from the data line 171 and may be disposed substantially on the same line as the data line 171, as illustrated in FIG. 2. However, the present disclosure is not limited thereto. The source electrode 173 may be connected to the semiconductor layer 154 through a first contact hole CH1, which is formed in the gate insulating layer 130 and the insulating layer 180.

The drain electrode 175 may be disposed on the insulating layer 180. The drain electrode 175 may be spaced apart from the source electrode 173 over the semiconductor layer 154 and may be disposed to face the source electrode 173. The drain electrode 175 may be connected to the semiconductor layer 154 through a second contact hole CH2, which is formed in the gate insulating layer 130 and the insulating layer 180.

The data line 171 and the data pad portion 179 may be disposed on the gate insulating layer 130.

The data line 171 may transmit a data signal and may extend substantially in the second direction DR2 to intersect the gate line 121.

The data conductor (171, 173, 175, and 179) may comprise a conductive material such as Al, Cu, Ag, Mo, Cr, Ti, Ta, or an alloy thereof. Alternatively, the data conductor (171, 173, 175, and 179) may comprise a transparent conductive material such as ITO, IZO, ZO, carbon nanotube, graphene, or AgNW. The data conductor (171, 173, 175, and 179) may have a single-layer structure, but the present disclosure is not limited thereto.

The gate electrode 124, the source electrode 173, and the drain electrode 175 may form a switching device, for example, a TFT Tr, together with the semiconductor layer 154. The TFT Tr may be disposed in the first area PA11 of the display area DA.

A pixel electrode 190 with a plurality of slits 192 may be disposed on the insulating layer 180. The pixel electrode 190 may be disposed in the second area PA21 and may be overlapped by the common electrode 270, which may have a flat or planar shape. The pixel electrode 190 may be formed on the same layer as the data conductor (171, 173, 175, and 179) and may comprise the same material as the data conductor (171, 173, 175, and 179). For example, the pixel electrode 190 may comprise a conductive material such as Al, Cu, Ag, Mo, Cr, Ti, Ta, or an alloy thereof, or may comprise a transparent conductive material such as ITO, IZO, ZO, carbon nanotube, graphene, or AgNW.

The pixel electrode 190 may extend from the drain electrode 175 and may be connected to the drain electrode 175. For example, the pixel electrode 190 may be formed as one continuous body with the drain electrode 175.

The pixel electrode 190 may have the same stack structure as the data conductor (171, 173, 175, and 179). For example, in a case in which the data conductor (171, 173, 175, and 179) has a single-layer structure, the pixel electrode 190 may also have a single-layer structure. Alternatively, in a case in which the data conductor (171, 173, 175, and 179) has a multilayer structure, the pixel electrode 190 may also have a multilayer structure.

A first connecting electrode 91 and a second connecting electrode 93 may be further provided on the insulating layer 180. The first connecting electrode 91, which connects an external driving circuit such as a gate driver and the gate pad portion 129, may be connected to the gate pad portion 129 through a first hole H1 which is formed in the insulating layer 180. The second connecting electrode 93, which connects an external driving circuit such as a common voltage providing portion and the common voltage pad portion 149, may be connected to the common voltage pad portion 149 through a third hole H3 which is formed in the insulating layer 180. The first connecting electrode 91 and the second connecting electrode 93 may comprise the same material as the pixel electrode 190 and may have the same stack structure as the pixel electrode 190, but the present disclosure is not limited thereto. That is, alternatively, at least one of the first connecting electrode 91 and the second connecting electrode 92 may not be provided, or may have a different structure.

Although not illustrated in FIGS. 75 through 79, a first alignment layer may be disposed on the data conductor (171, 173, 175, and 179) and the pixel electrode 190. The first alignment layer may be a horizontal alignment layer and may be rubbed in a uniform direction, but the present disclosure is not limited thereto. The first alignment layer may comprise a photoreactive material and may be photo-aligned. In a case in which the first alignment layer is disposed on the data conductor (171, 173, 175, and 179) and the pixel electrode 190, portions of the first alignment layer corresponding to the gate pad portion 129, the data pad portion 179, and the common voltage pad portion 149 may be removed.

The counter substrate 20 may be disposed on the display substrate 10*f*, and the liquid crystal layer 30 may be disposed between the display substrate 10*f* and the counter substrate 20. Although not illustrated in FIGS. 75 through 79, a second alignment layer may be disposed on an overcoat layer 250 of the counter substrate 20.

The counter substrate 20, the liquid crystal layer 30, and the second alignment layer are the same as their respective counterparts described above with reference to FIGS. 2 through 5. Thus, detailed descriptions thereof will be omitted.

In the present exemplary embodiment, the gate conductor (121, 124, and 129) and the common conductor (270, 141, and 149) may be formed at the same time using a single photomask. That is, the gate conductor (121, 124, and 129) and the common conductor (270, 141, and 149) may be formed by the same patterning process. Also, the data conductor (171, 173, 175, and 179) and the pixel electrode 190 may be formed at the same time using a single photomask. That is, the data conductor (171, 173, 175, and 179) and the pixel electrode 190 may be formed by the same patterning process. Accordingly, the number of masks used in the fabrication of a display substrate or a display device may be reduced. That is, a display substrate may be fabricated using, for example, a total of four masks, i.e., a mask for forming the semiconductor layer 154, a mask for forming the gate conductor (121, 124, and 129) and the common conductor (270, 141, and 149), a mask for forming the first contact hole CH1, the second contact hole CH2, the first hole H1, and the third hole H3, and a mask for forming the data conductor (171, 173, 175, and 179) and the pixel electrode 190.

Figure 80:
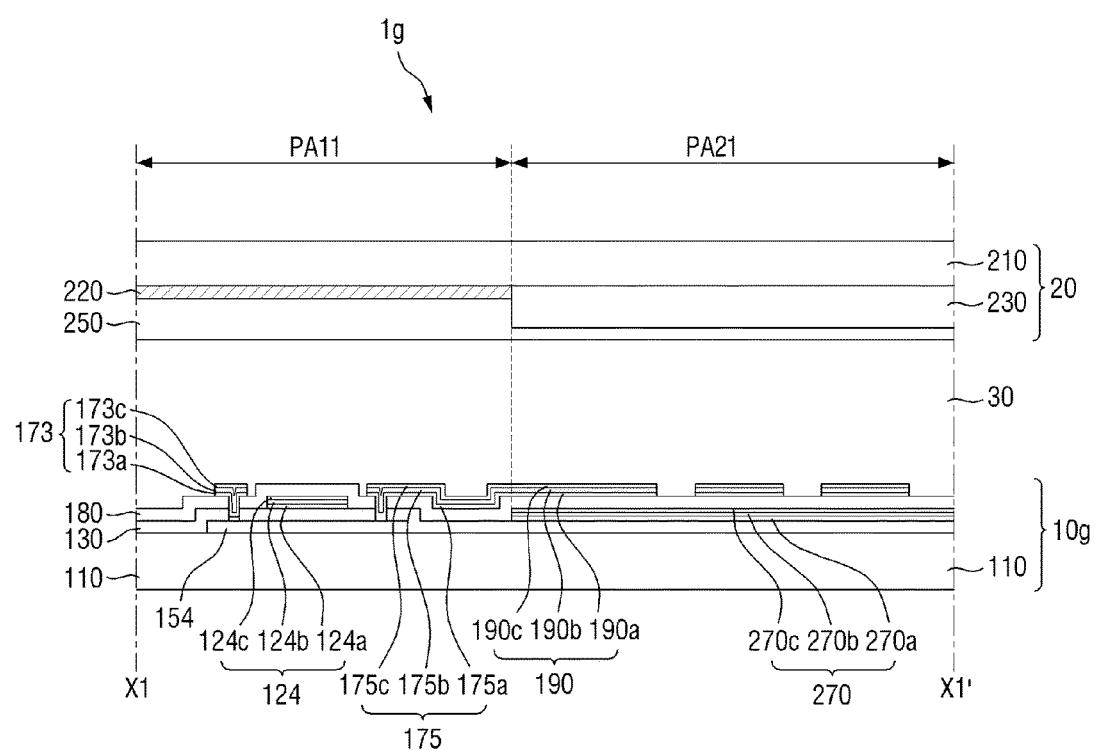
FIG. 80 is a cross-sectional view, taken along line X1-X1' of FIG. 76, of a display device including a display substrate according to another exemplary embodiment of the present disclosure.
Figure 81:
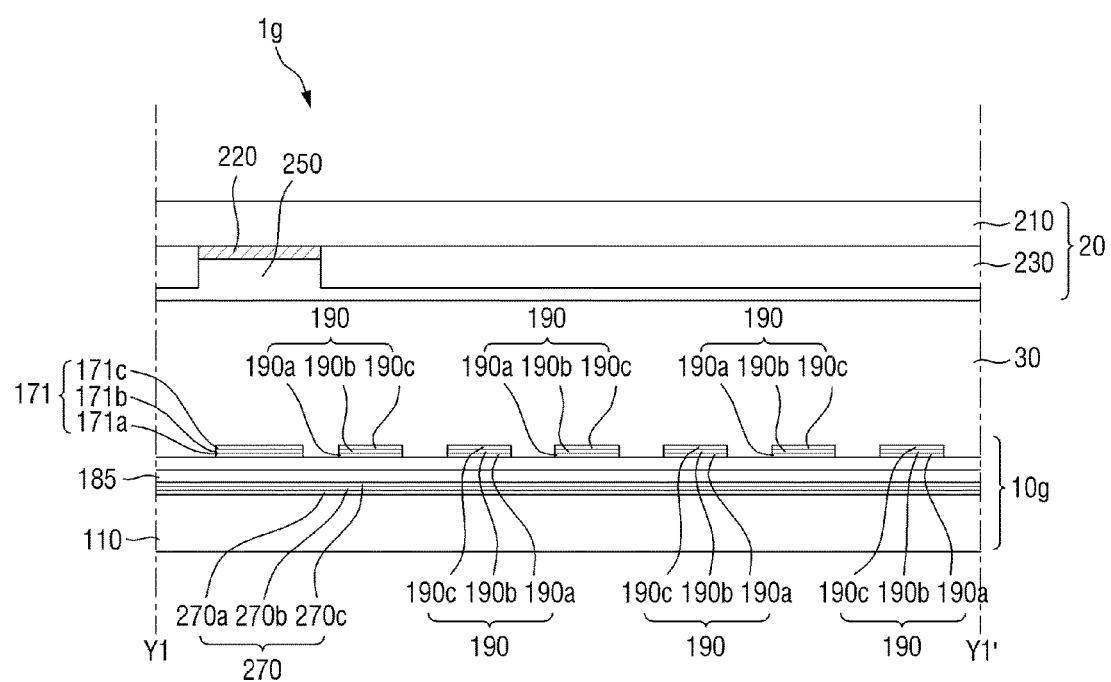
FIG. 81 is a cross-sectional view, taken along line Y1-Y1' of FIG. 76, of the display device including the display substrate according to the exemplary embodiment of FIG. 80.

FIG. 80 is a cross-sectional view, taken along line X1-X1' of FIG. 76, of a display device including a display substrate according to another exemplary embodiment of the present disclosure; FIG. 81 is a cross-sectional view, taken along line Y1-Y1' of FIG. 76, of the display device including the display substrate according to the exemplary embodiment of FIG. 80; and FIG. 82 is a cross-sectional view, taken along lines A-A', B-B', C-C', and D-D' of FIG. 75, of the display device including the display substrate according to the exemplary embodiment of FIG. 80.

Figure 82:
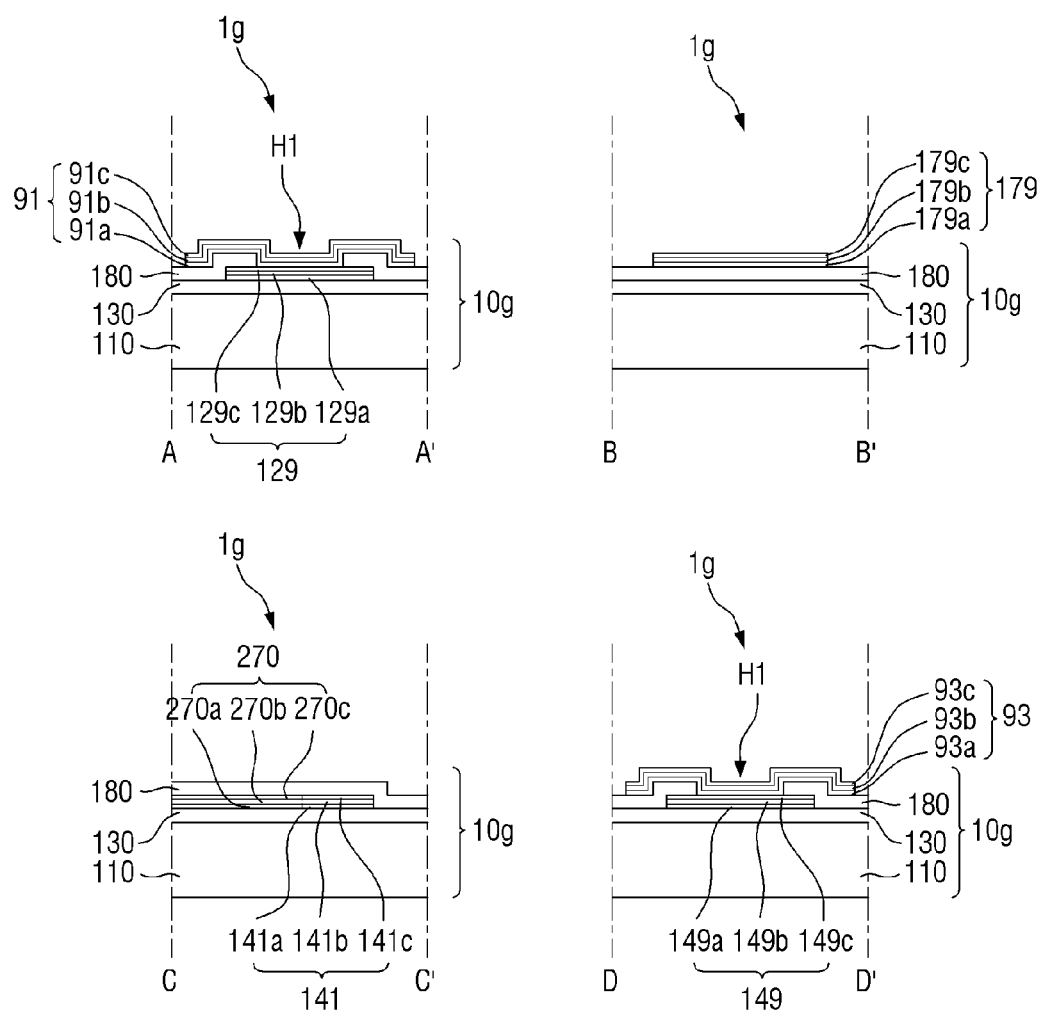
FIG. 82 is a cross-sectional view, taken along lines A-A', B-B', C-C', and D-D' of FIG. 75, of the display device including the display substrate according to the exemplary embodiment of FIG. 80.

Referring to FIGS. 80 through 82, a display device 1g may include a display substrate 10g, a counter substrate 20, and a liquid crystal layer 30.

The display substrate 10g is substantially the same as the display substrate 10f of FIGS. 77 through 79 except that a data conductor (171, 173, 175, and 179), a pixel electrode 190, a common conductor (270, 141, and 149), and a gate conductor (124 and 129) including a gate line (not illustrated) all have a multilayer structure. The multilayer structure of each of the data conductor (171, 173, 175, and 179), the pixel electrode 190, the common conductor (270, 141, and 149), and the gate conductor (124 and 129) including the gate line (not illustrated) is as described above with reference to FIGS. 66 through 68. Thus, the display substrate 10g will hereinafter be described, focusing mainly on differences from the display substrate 10f of FIGS. 66 through 68.

The gate conductor (124 and 129) may have a multilayer structure. For example, a gate electrode 124 may include a first sub-gate electrode 124a which is disposed on a gate insulating layer 130, a second sub-gate electrode 124b which is disposed on the first sub-gate electrode 124a, and a third sub-gate electrode 124c which is disposed on the second sub-gate electrode 124b. The first sub-gate electrode 124a, the second sub-gate electrode 124b, and the third sub-gate electrode 124c may all have substantially the same pattern shape.

Similarly, the gate pad portion 129 may have a multilayer structure and may include a first sub-gate pad portion 129a which is disposed on a first base 110, a second sub-gate pad portion 129b which is disposed on the first sub-gate pad portion 129a, and a third sub-gate pad portion 129c which is disposed on the second sub-gate pad portion 129b. The first sub-gate pad portion 129a, the second sub-gate pad portion 129b, and the third sub-gate pad portion 129c may all have substantially the same pattern shape.

A first gate conductor (124a and 129a) may comprise a refractory metal such as Mo, Cr, Ti, or Ta or an alloy thereof. A second gate conductor (124b and 129b) may comprise a reflective metal such as Al, an Al-based metal such as an Al alloy, Ag, or an Ag-based metal such as an Ag alloy. In a case in which a third gate conductor (124c and 129c) is additionally provided on the second gate conductor (124b and 129b), the third gate conductor (124c and 129c) may comprise a transparent conductive material.

The common conductor (270, 141, and 149) may have a multilayer structure and may have the same stack structure as the gate conductor (121, 124, and 129). For example, the common conductor (270, 141, and 149) include a first sub-common electrode 270a which is disposed on the gate insulating layer 130, a second sub-common electrode 270b which is disposed on the first sub-common electrode 270a, and a third sub-common electrode 270c which is disposed on the second sub-common electrode 270b. The first sub-common electrode 270a, the second sub-common electrode 270b, and the third sub-common electrode 270c may all have substantially the same pattern shape.

Similarly, a common voltage line 141 and a common voltage pad portion 149 may have a multilayer structure. The common voltage line 141 may include a first sub-common voltage line 141a, a second sub-common voltage line 141b, and a third sub-common voltage line 141c, which are sequentially disposed on the gate insulating layer 130. The first sub-common voltage line 141a, the second sub-common voltage line 141b, and the third sub-common voltage line 141c may all have substantially the same pattern shape. The common voltage pad portion 149 may include a first sub-common voltage pad portion 149a, a second sub-common voltage pad portion 149b, and a third sub-common voltage pad portion 149c, which are sequentially disposed on the gate insulating layer 130. The first sub-common voltage pad portion 149a, the second sub-common voltage pad portion 149b, and the third sub-common voltage pad portion 149c may all have substantially the same pattern shape.

The first common conductor (270a, 141a, and 149a) may comprise the same material as the first gate conductor (124a and 129a) and may have substantially the same thickness as the first gate conductor (124a and 129a). The second common conductor (270b, 141b, and 149b) may comprise the same material as the second gate conductor (124b and 129b) and may have substantially the same thickness as the second gate conductor (124b and 129b). The third common conductor (270c, 141c, and 149c) may comprise the same material as the third gate conductor (124c and 129c) and may have substantially the same thickness as the third gate conductor (124c and 129c). In a case in which the third gate conductor (124c and 129c) is not provided, the third common conductor (270c, 141c, and 149c) may also not be provided.

As mentioned above, the common conductor (270, 141, and 149) and the gate conductor (124 and 129) may be formed at the same time using a single photomask.

The data conductor (171, 173, 175, and 179) may have a multilayer structure. For example, a data line 171 may include a first sub-data line 171a, a second sub-data line 171b, and a third sub-data line 171c, which are sequentially disposed on an insulating layer 180. The first sub-data line 171a, the second sub-data line 171b, and the third sub-data line 171c may all have substantially the same pattern shape.

Similarly, a source electrode 173, a drain electrode 175, and a data pad portion 179 may each have a multilayer structure.

The source electrode 173 may include a first sub-source electrode 173a, a second sub-source electrode 173b, and a third sub-source electrode 173c, which are sequentially disposed on the insulating layer 180. The first sub-source electrode 173a, the second sub-source electrode 173b, and the third sub-source electrode 173c may all have substantially the same pattern shape. The first sub-source electrode 173a may directly contact a semiconductor layer 154 through a first contact hole CH1.

The drain electrode 175 may include a first sub-drain electrode 175a, a second sub-drain electrode 175b, and a third sub-drain electrode 175c, which are sequentially disposed on the insulating layer 180. The first sub-drain electrode 175a may directly contact the semiconductor layer 154 through a second contact hole CH2, and the first sub-drain electrode 175a, the second sub-drain electrode 175b, and the third sub-drain electrode 175c may all have substantially the same pattern shape.

The data pad portion 179 may include a first sub-data pad portion 179a, a second sub-data pad portion 179b, and a third sub-data pad portion 179c, which are sequentially disposed on the insulating layer 180. The first sub-data pad portion 179a, the second sub-data pad portion 179b, and the third sub-data pad portion 179c may all have substantially the same pattern shape.

A first data conductor (171a, 173a, 175a, and 179a) may comprise a refractory metal such as Mo, Cr, Ti, or Ta or an alloy thereof. A second data conductor (171b, 173b, 175b, and 179b) may comprise a reflective metal such as Al, an Al-based metal such as an Al alloy, Ag, or an Ag-based metal such as an Ag alloy. A third data conductor (171*c*, 173*c*, 175*c*, and 179*c*) may comprise a transparent conductive material such as ITO, IZO, ZO, carbon nanotube, graphene, or AgNW.

The pixel electrode 190 may have a multilayer structure and may have the same stack structure as the data conductor (171, 173, 175, and 179). For example, the pixel electrode 190 may include a first sub-pixel electrode 190*a*, a second sub-pixel electrode 190*b*, and a third sub-pixel electrode 190*c*, which are sequentially disposed on the insulating layer 180. The first sub-pixel electrode 190*a*, the second sub-pixel electrode 190*b*, and the third sub-pixel electrode 190*c* may all have substantially the same pattern shape.

The first sub-pixel electrode 190*a* may comprise the same material as the first data conductor (171*a*, 173*a*, 175*a*, and 179*a*) and may have substantially the same thickness as the first data conductor (171*a*, 173*a*, 175*a*, and 179*a*). The first sub-pixel electrode 190*a* may be connected to the first sub-drain electrode 175*a* and may extend from the first sub-drain electrode 175*a*. The second sub-pixel electrode 190*b* may comprise the same material as the second data conductor (171*b*, 173*b*, 175*b*, and 179*b*) and may have substantially the same thickness as the second data conductor (171*b*, 173*b*, 175*b*, and 179*b*). The second sub-pixel electrode 190*b* may be connected to the second sub-drain electrode 175*b* and may extend from the second sub-drain electrode 175*b*. The third sub-pixel electrode 190*c* may comprise the same material as the third data conductor (171*c*, 173*c*, 175*c*, and 179*c*) and may have substantially the same thickness as the third data conductor (171*c*, 173*c*, 175*c*, and 179*c*). The third sub-pixel electrode 190*c* may be connected to the third sub-drain electrode 175*c* and may extend from the third sub-drain electrode 175*c*.

The first connecting electrode 91, like the pixel electrode 190, may be disposed on the insulating layer 180. The first connecting electrode 91 may include a first sub-connecting electrode 91*a* which contacts the gate pad portion 129 through a first hole H1, and a second sub-connecting electrode 91*b* and a third sub-connecting electrode 91*c* which are sequentially disposed on the first sub-connecting electrode 91*a*. The second connecting electrode 93 may include a fourth sub-connecting electrode 93*a* which is disposed on the insulating layer 180 and contacts the common voltage pad portion 149 through a third hole H3, and a fifth sub-connecting electrode 93*b* and a sixth sub-connecting electrode 93*c* which are sequentially disposed on the fourth sub-connecting electrode 93*a*. The first sub-connecting electrode 91*a* and the fourth sub-connecting electrode 93*a* may comprise the same material as the first sub-pixel electrode 190*a*, the second sub-connecting electrode 91*b* and the fifth sub-connecting electrode 93*b* may comprise the same material as the second sub-pixel electrode 190*b*, and the third sub-connecting electrode 91*c* and the sixth sub-connecting electrode 93*c* may comprise the same material as the third sub-pixel electrode 190*c*.

The pixel electrode 190, the first connecting electrode 91, the second connecting electrode 93, and the data conductor (171, 173, 175, and 179) may be formed at the same time using a single photomask. That is, the pixel electrode 190, the first connecting electrode 91, the second connecting electrode 93, and the data conductor (171, 173, 175, and 179) may be formed by the same patterning process.

Figure 83:
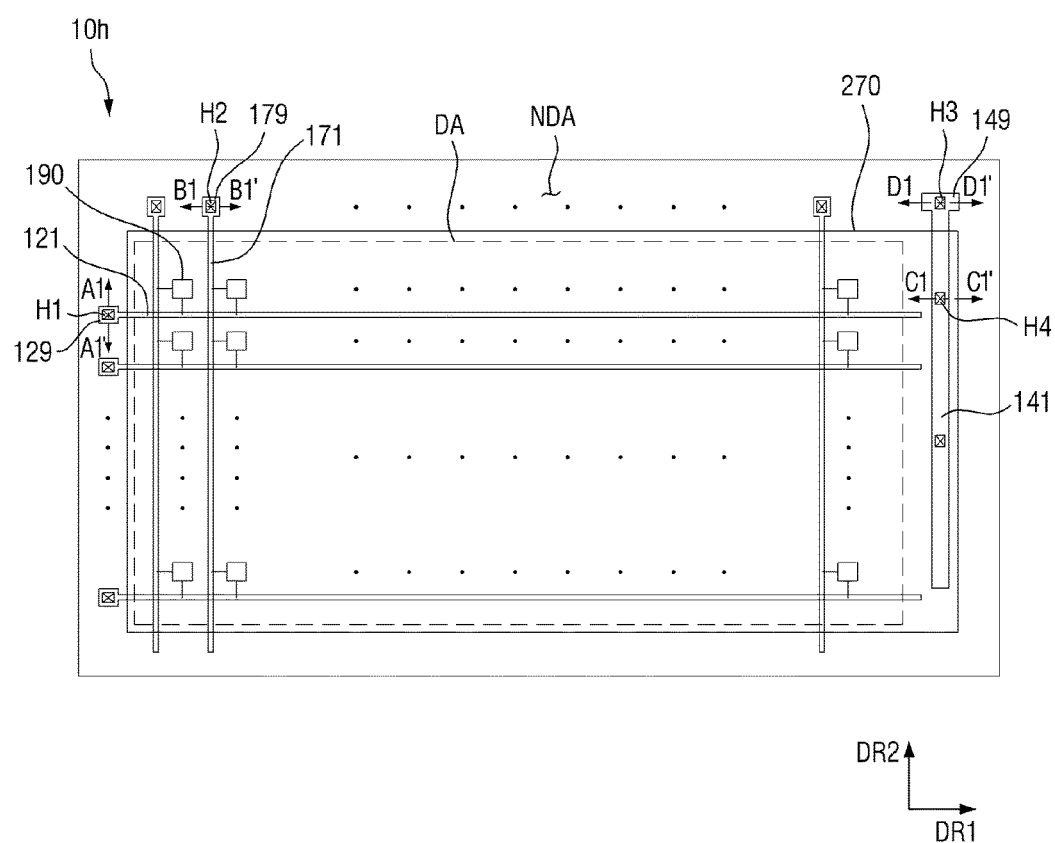
FIG. 83 is a schematic plan view of a display substrate according to another exemplary embodiment of the present disclosure.

FIG. 83 is a schematic plan view of a display substrate according to another exemplary embodiment of the present disclosure. Referring to FIG. 83, a display substrate 10*h* differs from the display substrate 10 of FIG. 1 in that a common electrode 270 is disposed on a different layer from a gate line 121, a gate pad portion 129, a common voltage line 141, and a common voltage pad portion 149. Also, the common electrode 270 is disposed to overlap the gate line 121, rather than being disposed between the gate line 121 and another gate line 121. Additionally, the common electrode 270 is connected to the common voltage line 141 through a fourth hole H4. The display substrate 10*h* will hereinafter be described in detail with reference to FIGS. 84 through 87, focusing mainly on differences from the display substrates according to the previous exemplary embodiments.

Figure 84:
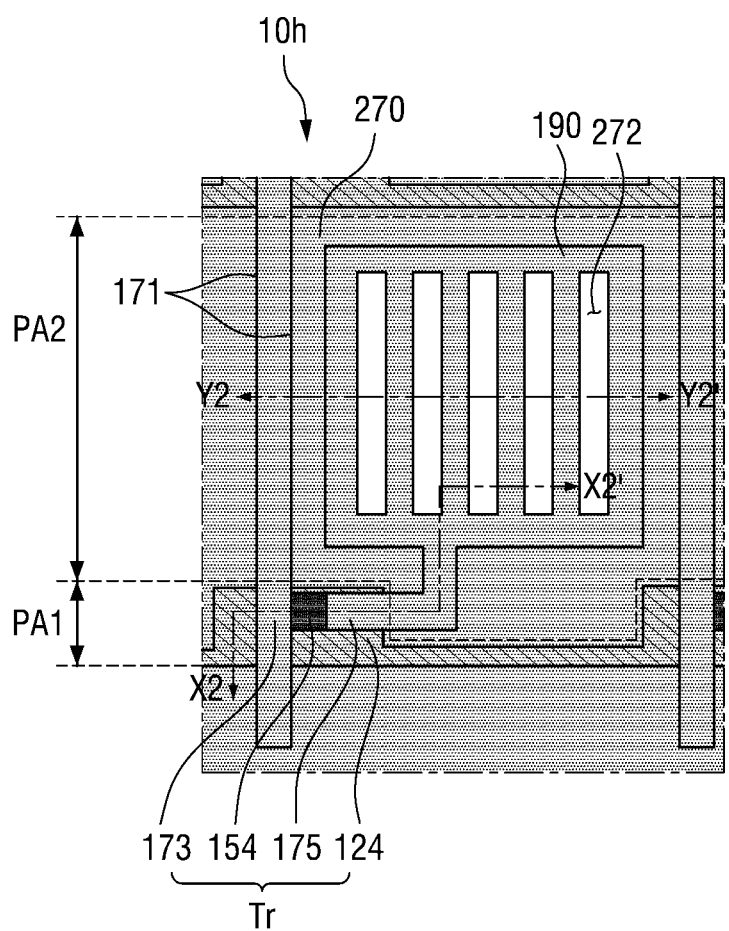
FIG. 84 is a schematic plan view of a pixel of the display substrate according to the exemplary embodiment of FIG. 83.
Figure 85:
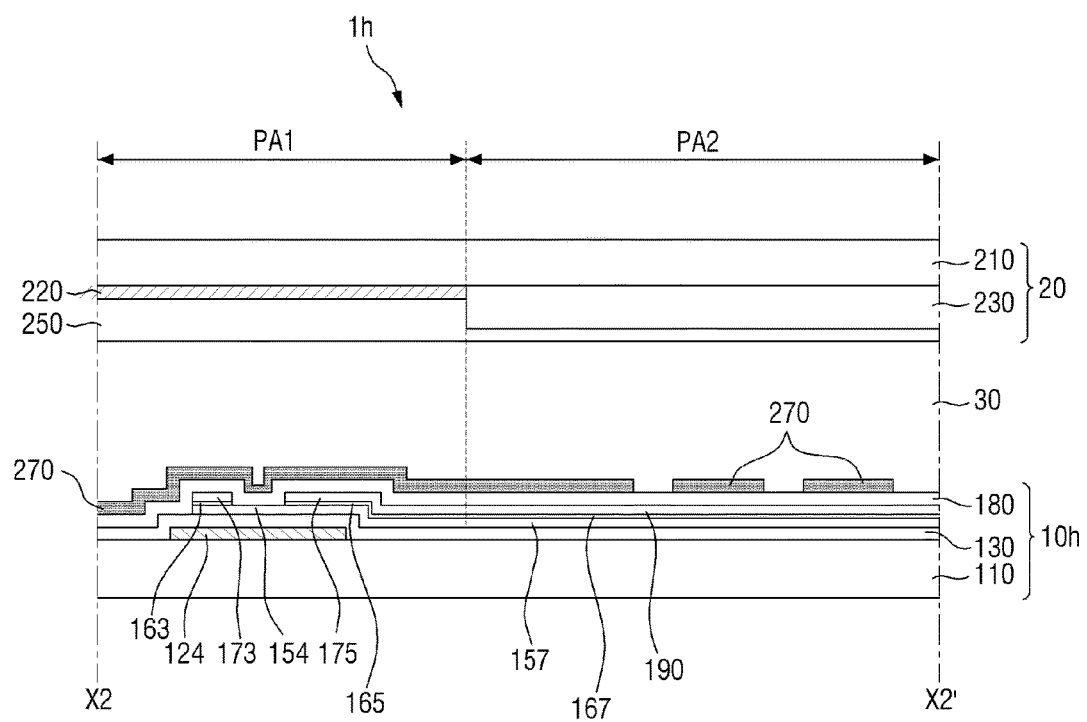
FIG. 85 is a cross-sectional view, taken along line X2-X2' of FIG. 84, of the display device including the display substrate according to the exemplary embodiment of FIG. 83.
Figure 86:
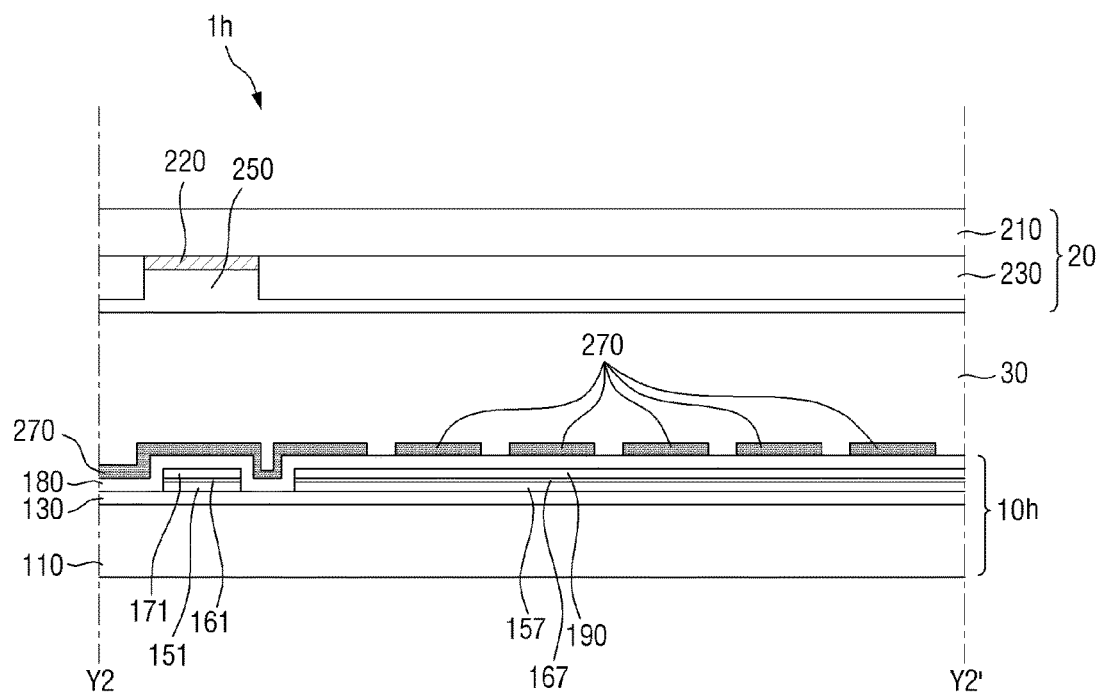
FIG. 86 is a cross-sectional view, taken along line Y2-Y2' of FIG. 84, of the display device including the display substrate according to the exemplary embodiment of FIG. 83.
Figure 87:
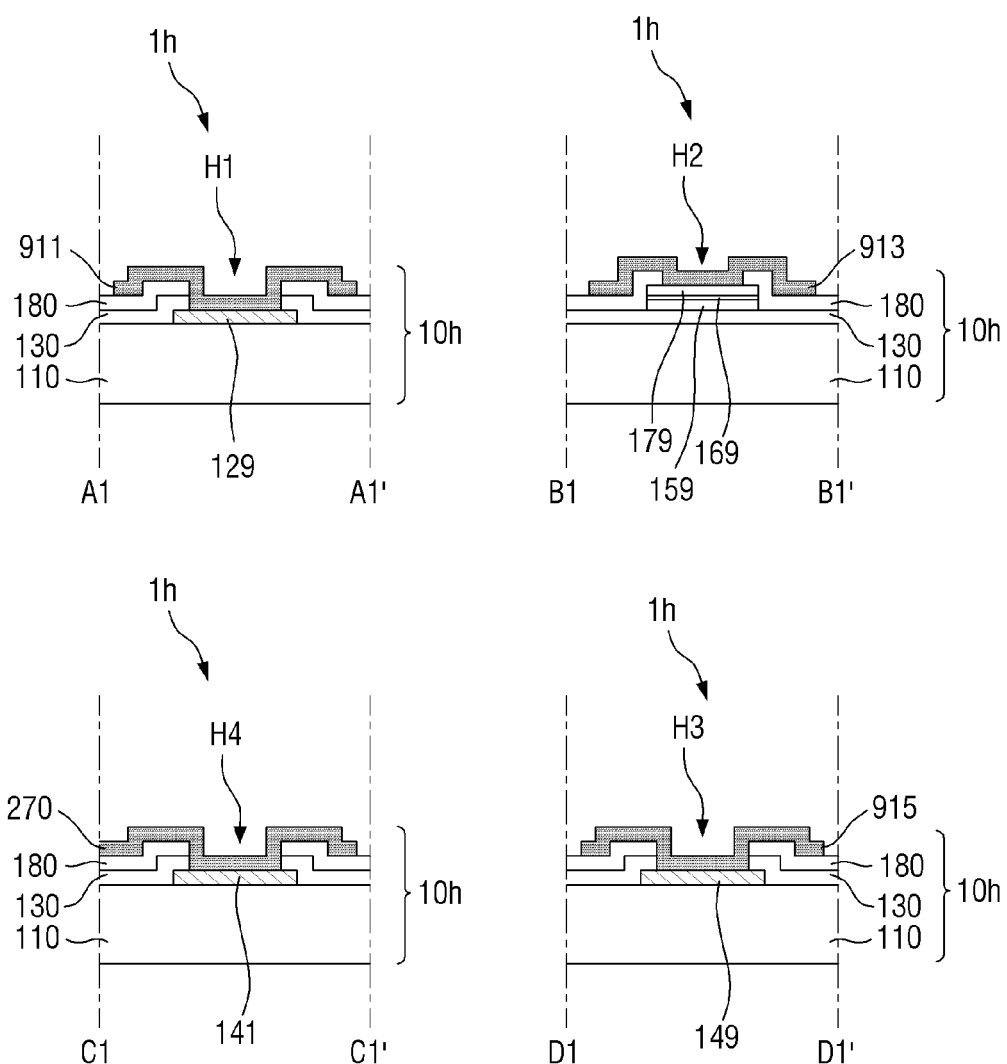
FIG. 87 is a cross-sectional view, taken along lines A1-A1', B1-B1', C1-C1', and D1-D1' of FIG. 83, of the display device including the display substrate according to the exemplary embodiment of FIG. 83.

FIG. 84 is a schematic plan view of a pixel of the display substrate according to the exemplary embodiment of FIG. 83; FIG. 85 is a cross-sectional view, taken along line X2-X2' of FIG. 84, of the display device including the display substrate according to the exemplary embodiment of FIG. 83; FIG. 86 is a cross-sectional view, taken along line Y2-Y2' of FIG. 84, of the display device including the display substrate according to the exemplary embodiment of FIG. 83; and FIG. 87 is a cross-sectional view, taken along lines A1-A1', B1-B1', C1-C1', and D1-D1' of FIG. 83, of the display device including the display substrate according to the exemplary embodiment of FIG. 83.

Referring to FIGS. 84 through 87, a display device 1*h* may include the display substrate 10*h*, a counter substrate 20 which faces the display substrate 10*h*, and a liquid crystal layer 30 which is disposed between the display substrate 10*h* and the counter substrate 20.

The display substrate 10*h* will hereinafter be described.

A gate conductor (121, 124, and 129) may be disposed on a first base 110. In some exemplary embodiments, the gate conductor (121, 124, and 129) may be disposed directly on the first base 110. The gate conductor (121, 124, and 129) may include a gate line 121, a gate electrode 124, and a gate pad portion 129.

The gate conductor (121, 124, and 129) may comprise Al, an Al-based metal such as an Al alloy, Ag, an Ag-based metal such as an Ag alloy, Cu, a Cu-based metal such as a Cu alloy, Mo, a Mo-based metal such as a Mo alloy, Cr, Ta, or Ti. The gate conductor (121, 124, and 129) may have a single-layer structure, but the present disclosure is not limited thereto. Alternatively, the gate conductor (121, 124, and 129) may have a multilayer structure consisting of at least two conductive layers having different physical properties.

The common voltage line 141 and the common voltage pad portion 149 may be disposed on the first base 110. The common voltage line 141 and the common voltage pad portion 149 may comprise the same material as the gate conductor (121, 124, and 129). In some exemplary embodiments, the common voltage line 141 and the common voltage pad portion 149 may have the same stack structure as the gate conductor (121, 124, and 129).

A gate insulating layer 130 may be disposed on the gate conductor (121, 124, and 129), the common voltage line 141, and the common voltage pad portion 149.

As mentioned above with reference to FIGS. 2 through 5, part of a display area DA in and around which the gate line 121 and the gate electrode 124 are disposed will hereinafter be referred to as a first area PA1, and part of the display area DA that differs from the first area PA1 will hereinafter be referred to as a second area PA2.

A semiconductor layer 154 may be disposed on the gate insulating layer 130. The semiconductor layer 154 may be disposed in the first area PA1 and may overlap the gate electrode 124.

A source ohmic contact 163 and a drain ohmic contact 165 may be disposed on the semiconductor layer 154.

A data conductor (171, 173, 175, and 179) may be disposed on the gate insulating layer 130 and may include a data line 171, a source electrode 173, a drain electrode 175, and a data pad portion 179.

The source electrode 173 may be disposed on a source ohmic contact 163, and the pattern shape of the source electrode 173 may be substantially the same as the pattern shape of the source ohmic contact 163.

The drain electrode 175 may be disposed on a drain ohmic contact 165, and the pattern shape of the drain electrode 175 may be substantially the same as the pattern shape of the drain ohmic contact 165.

The data line 171 may transmit a data signal and may extend substantially in a second direction DR2 to intersect the gate line 121.

A first semiconductor pattern 151 and a data ohmic contact 161 may be further provided between the data line 171 and the gate insulating layer 130, and a second semiconductor pattern 159 and a data pad ohmic contact 169 may be further provided between the data pad portion 179 and the gate insulating layer 130. The second semiconductor pattern 159 may comprise the same material as the first semiconductor pattern 151 and the semiconductor layer 154, and may be connected to the first semiconductor pattern 151. The data pad ohmic contact 169 may comprise the same material as the data ohmic contact 161, the source ohmic contact 163, and the drain ohmic contact 165, and may be connected to the data ohmic contact 161.

The data pad portion 179, which is connected to another layer or an external driving circuit such as a data driver and transmits a data voltage to the data line 171, may be connected to the data line 171.

The data conductor (171, 173, 175, and 179) may comprise a conductive material. In some exemplary embodiments, the data conductor (171, 173, 175, and 179) may comprise a metal material with excellent reflectivity, i.e., a reflective material such as Al, an Al-based metal such as an Al alloy, Ag, or an Ag-based metal such as an Ag alloy. The data conductor (171, 173, 175, and 179) may have a single-layer structure, but the present disclosure is not limited thereto. Alternatively, the data conductor (171, 173, 175, and 179) may have a multilayer structure.

The gate electrode 124, the source electrode 173, and the drain electrode 175 may form a switching device, for example, a TFT Tr, together with the semiconductor layer 154.

The pixel electrode 190 may be disposed on the gate insulating layer 130. The pixel electrode 190 may be disposed in the second area PA2 and may have a flat or planar shape. The pixel electrode 190 may be disposed on the same layer as the data conductor (171, 173, 175, and 179) and may comprise the same material as the data conductor (171, 173, 175, and 179). For example, the pixel electrode 190 may comprise a reflective metal.

The pixel electrode 190 may extend from the drain electrode 175 and may be connected to the drain electrode 175. That is, the pixel electrode 190 may be formed as one body with the drain electrode 175.

The pixel electrode 190 may have the same stack structure as the data conductor (171, 173, 175, and 179).

A third semiconductor pattern 157 and a pixel ohmic contact 167 may be further provided between the pixel electrode 190 and the gate insulating layer 130. The third semiconductor pattern 157 may comprise the same material as the semiconductor layer 154 and may be connected to the semiconductor layer 154. That is, the third semiconductor pattern 157 may extend from the semiconductor layer 154.

In some exemplary embodiments, in a case in which the semiconductor layer 154, the first semiconductor pattern 151, the second semiconductor pattern 159, and the third semiconductor pattern 157 each comprise an oxide semiconductor, the source ohmic contact 163, the drain ohmic contact 165, the data ohmic contact 161, the data pad ohmic contact 169, and the pixel ohmic contact 167 may not be provided.

An insulating layer 180 may be disposed on the gate insulating layer 130, the TFT Tr, the data conductor (171, 173, 175, and 179), and the pixel electrode 190. The insulating layer 180 may comprise an insulating material. In some exemplary embodiments, the insulating material may be an inorganic insulating material such as silicon oxide, silicon nitride, or silicon oxynitride.

A common electrode 270 with a plurality of slits 272 may be disposed on the insulating layer 180. The common electrode 270 may be disposed not only in the second area PA2, but also in the first area PA1, and the slits 272 may be disposed in the second area PA2. The common electrode 270 may overlap the pixel electrode 190. The common electrode 270 may comprise a conductive material such as Al, Cu, Ag, Mo, Cr, Ti, Ta, or an alloy thereof or a transparent conductive material such as ITO, IZO, ZO, carbon nanotube, graphene, or AgNW.

The common electrode 270 may partially extend into a non-display area NDA, and may be connected to the common voltage line 141 through a fourth hole H4 which is formed in the gate insulating layer 130 and the insulating layer 180.

A first connecting electrode 911, a second connecting electrode 913, and a third connecting electrode 915 may be further provided on the insulating layer 180. The first connecting electrode 911, which connects an external driving circuit such as a gate driver and the gate pad portion 129, may be connected to the gate pad portion 129 through a first hole H1 which is formed in the insulating layer 180. The second connecting electrode 913, which connects an external driving circuit such as a data driver and the data pad portion 179, may be connected to the data pad portion 179 through a second hole H2 which is formed in the insulating layer 180. The third connecting electrode 915, which connects an external driving circuit such as a common voltage providing portion and the common voltage pad portion 149, may be connected to the common voltage pad portion 149 through a third hole H3 which is formed in the insulating layer 180. The first connecting electrode 911, the second connecting electrode 913, and the third connecting electrode 915 may comprise the same material as the common electrode 270 and may have the same stack structure as the common electrode 270, but the present disclosure is not limited thereto. Alternatively, at least one of the first connecting electrode 911, the second connecting electrode 913, and the third connecting electrode 915 may be absent.

Although not illustrated in FIGS. 83 through 87, a first alignment layer may be disposed on the insulating layer 180. The first alignment layer may be a horizontal alignment layer and may be rubbed in a uniform direction, but the present disclosure is not limited thereto. The first alignment layer may, for example, comprise a photoreactive material and may be photo-aligned.

The counter substrate 20, the liquid crystal layer 30, and a second alignment layer (not illustrated) are substantially the same as their respective counterparts described above with reference to FIGS. 2 through 5, and thus, detailed descriptions thereof will be omitted.

In the present exemplary embodiment, the data conductor (171, 173, 175, and 179) and the pixel electrode 190 may be formed at the same time using a single photomask. Accordingly, the number of masks used in the fabrication of a display substrate or a display device may be reduced. That is, a display substrate may be fabricated using, for example, a total of four masks, i.e., a mask for forming the gate conductor (121, 124, and 129), the common voltage line 141, and the common voltage pad portion 149, a mask for forming the data conductor (171, 173, 175, and 179) and the pixel electrode 190, a mask for forming the first hole H1, the second hole H2, the third hole H3, and the fourth hole H4, and a mask for forming the common electrode 270.

Figure 88:
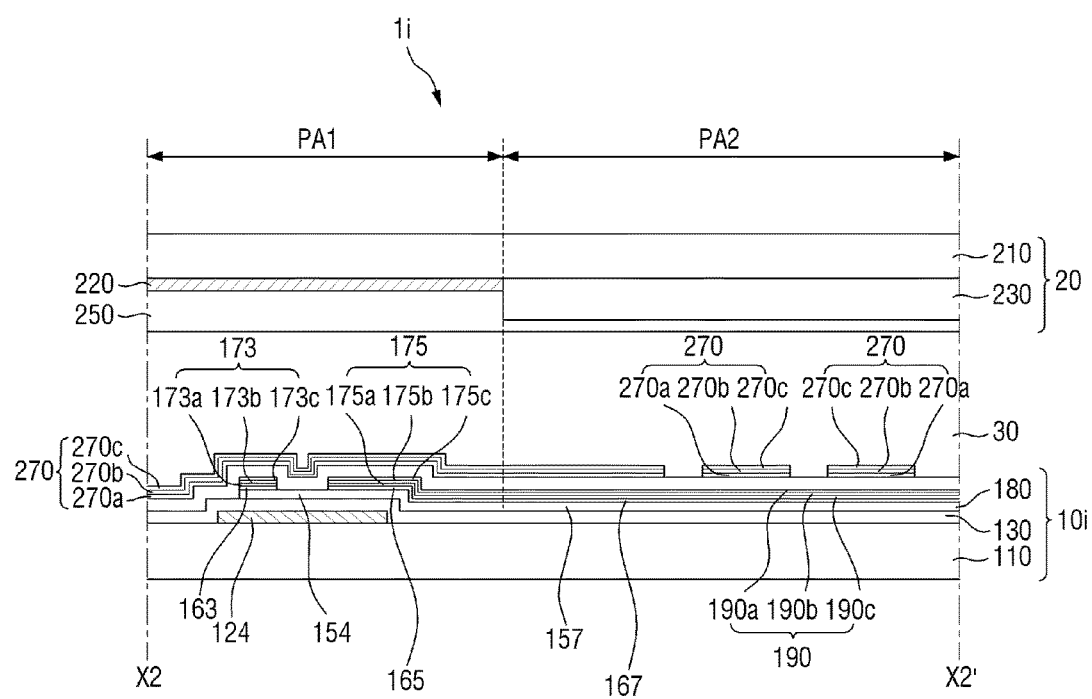
FIG. 88 is a cross-sectional view, taken along line X2-X2' of FIG. 84, of a display device including a display substrate according to another exemplary embodiment of the present disclosure.
Figure 89:
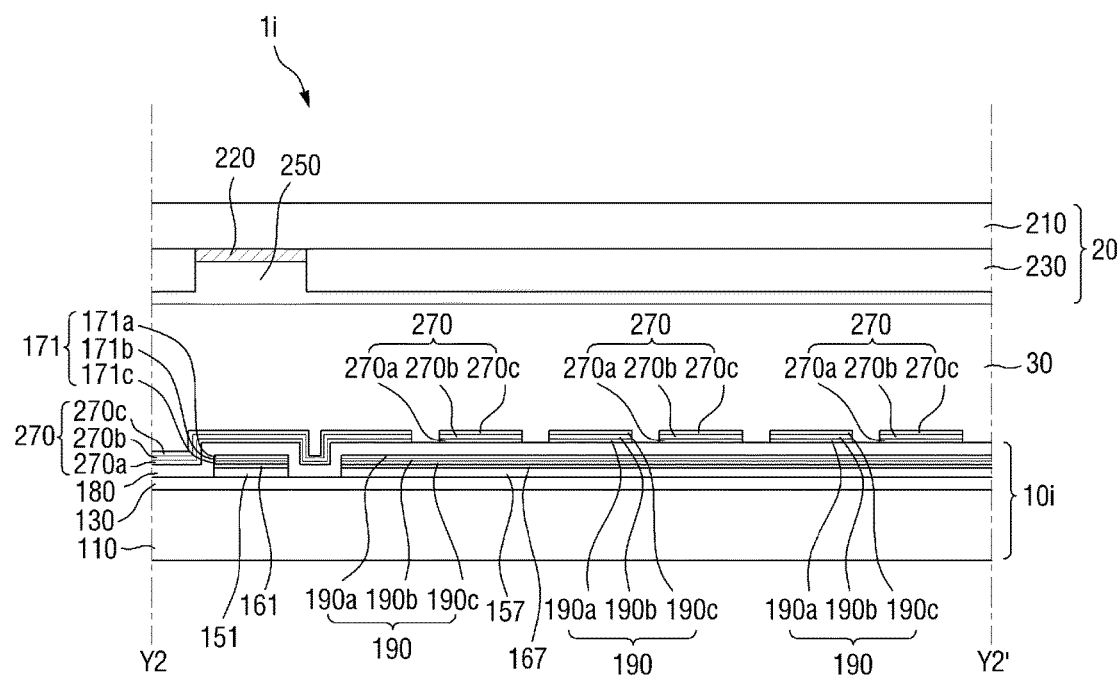
FIG. 89 is a cross-sectional view, taken along line Y2-Y2' of FIG. 84, of the display device including the display substrate according to the exemplary embodiment of FIG. 88.

FIG. 88 is a cross-sectional view, taken along line X2-X2' of FIG. 84, of a display device including a display substrate according to another exemplary embodiment of the present disclosure; FIG. 89 is a cross-sectional view, taken along line Y2-Y2' of FIG. 84, of the display device including the display substrate according to the exemplary embodiment of FIG. 88; and FIG. 90 is a cross-sectional view, taken along lines A1-A1', B1-B1', C1-C1', and D1-D1' of FIG. 83, of the display device including the display substrate according to the exemplary embodiment of FIG. 88.

Figure 90:
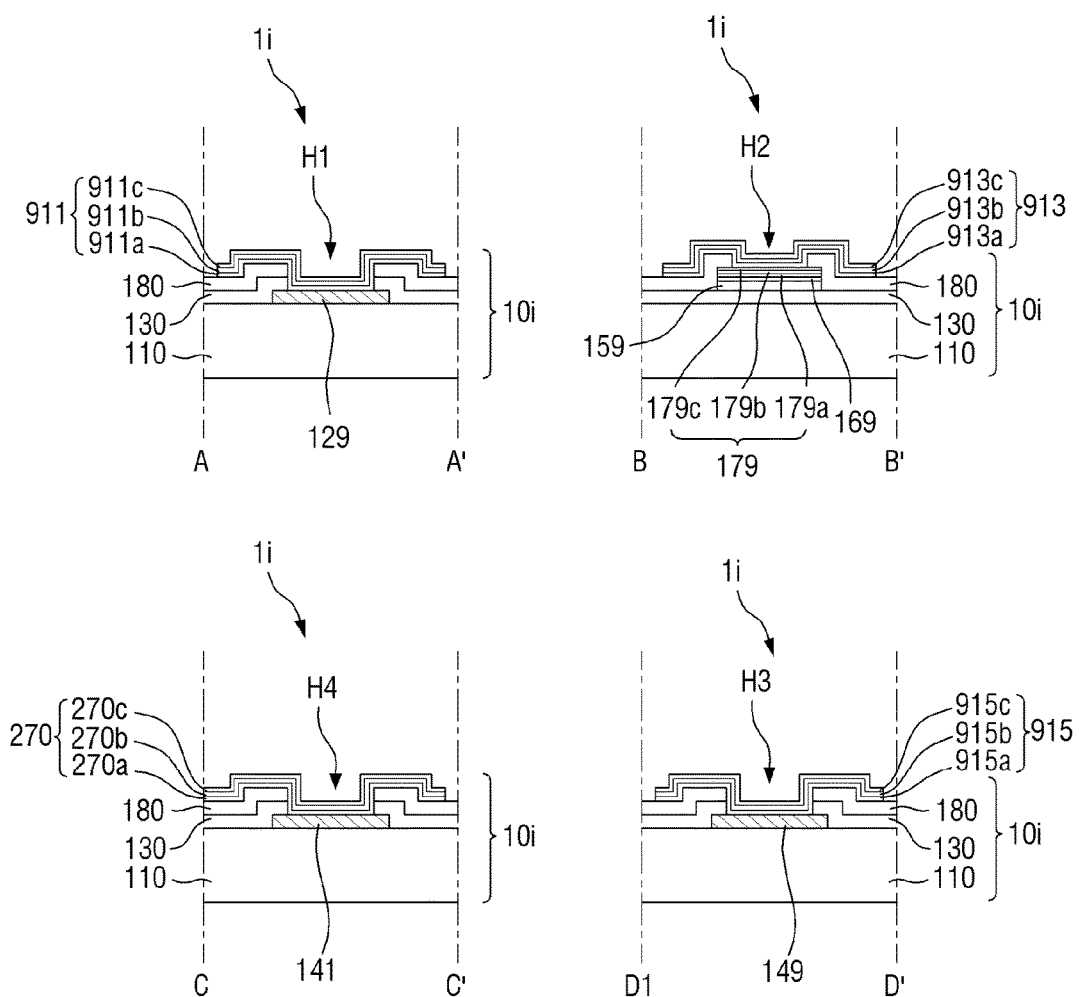
FIG. 90 is a cross-sectional view, taken along lines A1-A1', B1-B1', C1-C1', and D1-D1' of FIG. 83, of the display device including the display substrate according to the exemplary embodiment of FIG. 88.

Referring to FIGS. 88 through 90, a display substrate 10*i* of a display device 1*i* is substantially the same as the display substrate 10*h* of FIGS. 84 through 87, except that a data conductor (171, 173, 175, and 179), a pixel electrode 190, and a common electrode 270 have a multilayer structure. Thus, the display substrate 10*i* will hereinafter be described, focusing mainly on differences from the display substrate 10*h* of FIGS. 84 through 87.

The data conductor (171, 173, 175, and 179) will hereinafter be described.

The data conductor (171, 173, 175, and 179) may have a multilayer structure. For example, a data line 171 may include a first sub-data line 171*a*, a second sub-data line 171*b*, and a third sub-data line 171*c*, and a source electrode 173 may include a first sub-source electrode 173*a*, a second sub-source electrode 173*b*, and a third sub-source electrode 173*c*. A drain electrode 175 may include a first sub-drain electrode 175*a*, a second sub-drain electrode 175*b*, and a third sub-drain electrode 175*c* which are sequentially disposed on a drain ohmic contact 165 or a semiconductor layer 154, and a data pad portion 179 may include a first sub-data pad portion 179*a*, a second sub-data pad portion 179*b*, and a third sub-data pad portion 179*c*. The data line 171, the source electrode 173, the drain electrode 175, and the data pad portion 179 are substantially the same as their respective counterparts described above with reference to FIGS. 66 through 68, and thus, detailed descriptions thereof will be omitted.

A first data conductor (171*a*, 173*a*, 175*a*, and 179*a*) may comprise a refractory metal such as Mo, Cr, Ti, or Ta or an alloy thereof. A second data conductor (171*b*, 173*b*, 175*b*, and 179*b*) may comprise a reflective metal such as Al, an Al-based metal such as an Al alloy, Ag, or an Ag-based metal such as an Ag alloy. A third data conductor (171*c*, 173*c*, 175*c*, and 179*c*) may comprise a transparent conductive material such as ITO, IZO, ZO, carbon nanotube, graphene, or AgNW. The data conductor (171, 173, 175, and 179) is substantially the same as its counterpart described above with reference to FIGS. 66 through 68, and thus, a detailed description thereof will be omitted.

The pixel electrode 190 will hereinafter be described.

The pixel electrode 190 may have a multilayer structure and may have the same stack structure as the data conductor (171, 173, 175, and 179). For example, the pixel electrode 190 may include a first sub-pixel electrode 190*a*, a second sub-pixel electrode 190*b*, and a third sub-pixel electrode 190*c*, and the first sub-pixel electrode 190*a*, the second sub-pixel electrode 190*b*, and the third sub-pixel electrode 190*c* may all have substantially the same pattern shape.

The first sub-pixel electrode 190*a* may comprise the same material as the first data conductor (171*a*, 173*a*, 175*a*, and 179*a*) and may have substantially the same thickness as the first data conductor (171*a*, 173*a*, 175*a*, and 179*a*). The first sub-pixel electrode 190*a* may be connected to the first sub-drain electrode 175*a* and may extend from the first sub-drain electrode 175*a*. Similarly, the second sub-pixel electrode 190*b* may comprise the same material as the second data conductor (171*b*, 173*b*, 175*b*, and 179*b*) and may have substantially the same thickness as the second data conductor (171*b*, 173*b*, 175*b*, and 179*b*). The second sub-pixel electrode 190*b* may be connected to the second sub-drain electrode 175*b* and may extend from the second sub-drain electrode 175*b*. Similarly, the third sub-pixel electrode 190*c* may comprise the same material as the third data conductor (171*c*, 173*c*, 175*c*, and 179*c*) and may have substantially the same thickness as the third data conductor (171*c*, 173*c*, 175*c*, and 179*c*). The third sub-pixel electrode 190*c* may be connected to the third sub-drain electrode 175*c* and may extend from the third sub-drain electrode 175*c*.

The second sub-pixel electrode 190*b* of the pixel electrode 190, like the second data conductor (171*b*, 173*b*, 175*b*, and 179*b*), may comprise a reflective metal. Accordingly, the pixel electrode 190 may serve as a reflective electrode, and the display device 1*i* may be implemented as a reflective LCD device.

The common electrode 270 will hereinafter be described.

The common electrode 270 may have a multilayer structure. For example, the common electrode 270 may include a first sub-common electrode 270*a* which is disposed on an insulating layer 180, a second sub-common electrode 270*b* which is disposed on the first sub-common electrode 270*a*, and a third sub-common electrode 270*c* which is disposed on the second sub-common electrode 270*b*, and the first sub-common electrode 270*a* may contact a common voltage line 141 through a fourth hole H4. The first sub-common electrode 270*a*, the second sub-common electrode 270*b*, and the third sub-common electrode 270*c* may all have substantially the same pattern shape.

Similarly, a first connecting electrode 911, a second connecting electrode 913, and a third connecting electrode 915, like the common electrode 270, may have a multilayer structure and may have the same stack structure as the common electrode 270. For example, the first connecting electrode 911 may include a first sub-connecting electrode 911*a* which is disposed on the insulating layer 180 and contacts the gate pad portion 129 through a first hole H1, and a second sub-connecting electrode 911*b* and a third sub-connecting electrode 911*c* which are sequentially disposed on the first sub-connecting electrode 911*a*. The first sub-connecting electrode 911*a*, the second sub-connecting electrode 911*b*, and the third sub-connecting electrode 911*c* may all have substantially the same pattern shape. Similarly, the second connecting electrode 913 may include a fourth sub-connecting electrode 913*a* which is disposed on the insulating layer 180 and contacts the data pad portion 179 through a second hole H2, and a fifth sub-connecting electrode 913*b* and a sixth sub-connecting electrode 913*c* which are sequentially disposed on the fourth sub-connecting electrode 913a. The fourth sub-connecting electrode 913a, the fifth sub-connecting electrode 913b, and the sixth sub-connecting electrode 913c may all have the same pattern shape. Similarly, the third connecting electrode 915 may include a seventh sub-connecting electrode 915a which is disposed on the insulating layer 180 and contacts the common voltage pad portion 149 through a third hole H3, and an eighth sub-connecting electrode 915b and a ninth sub-connecting electrode 915c which are sequentially disposed on the seventh sub-connecting electrode 915a. The seventh sub-connecting electrode 915a, the eighth sub-connecting electrode 915b, and the ninth sub-connecting electrode 915c may all have the same pattern shape.

The first sub-common electrode 270a, the first sub-connecting electrode 911a, the fourth sub-connecting electrode 913a, and the seventh sub-connecting electrode 915a will hereinafter be collectively referred to as a first common conductor (270a, 911a, 913a, and 915a); the second sub-common electrode 270b, the second sub-connecting electrode 911b, the fifth sub-connecting electrode 913b, and the eighth sub-connecting electrode 915b will hereinafter be collectively referred to as a second common conductor (270b, 911b, 913b, and 915b); and the third sub-common electrode 270c, the third sub-connecting electrode 911c, the sixth sub-connecting electrode 913c, and the ninth sub-connecting electrode 915c will hereinafter be collectively referred to as a third common conductor (270c, 911c, 913c, and 915c). The first common conductor (270a, 911a, 913a, and 915a) may comprise a refractory metal such as Mo, Cr, Ti, or Ta or an alloy thereof. The second common conductor (270b, 911b, 913b, and 915b) may comprise a low-resistance metal such as, for example, Al, an Al-based metal such as an Al alloy, Ag, or an Ag-based metal such as an Ag alloy. The third common conductor (270c, 911c, 913c, and 915c) may comprise a transparent conductive material such as ITO, IZO, ZO, carbon nanotube, graphene, or AgNW.

The common electrode 270, the first connecting electrode 911, the second connecting electrode 913, the third connecting electrode 915, the pixel electrode 190, and the data conductor (171, 173, 175, and 179) are illustrated as having a multilayer structure, but the present disclosure is not limited thereto. In some other exemplary embodiments, the common electrode 270, the first connecting electrode 911, the second connecting electrode 913, and the third connecting electrode 914 may have a multilayer structure, and the pixel electrode 190 and the data conductor (171, 173, 175, and 179) may have a single-layer structure. In some other exemplary embodiments, the common electrode 270, the first connecting electrode 911, the second connecting electrode 913, and the third connecting electrode 915 may have a single-layer structure, and the pixel electrode 190 and the data conductor (171, 173, 175, and 179) may have a multilayer structure.

The exemplary embodiments of the present disclosure have been described with reference to the accompanying drawings. However, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation. Various features of the above described and other embodiments can thus be mixed and matched in any manner, to produce further embodiments consistent with the invention.

What is claimed is:

1. A display substrate, comprising:
a base;
a gate electrode disposed on the base;
a gate insulating layer disposed on the base and covering the gate electrode;
a semiconductor layer disposed on the gate insulating layer and overlapping the gate electrode;
a source electrode and a drain electrode disposed on the semiconductor layer and connected to the semiconductor layer;
a pixel electrode disposed on the gate insulating layer, connected to the drain electrode, and extending from the drain electrode;
a common electrode insulated from the pixel electrode and overlapping the pixel electrode; and
a semiconductor pattern disposed between the gate insulating layer and the pixel electrode, the semiconductor pattern overlapping the pixel electrode,
wherein the semiconductor pattern comprises a same material as the semiconductor layer and extends from the semiconductor layer.

2. The display substrate of claim 1, wherein a shape of the semiconductor pattern is substantially the same as a shape of the pixel electrode.

3. The display substrate of claim 1, wherein the pixel electrode comprises a same material as the drain electrode, and
wherein the pixel electrode does not contact an upper surface of the drain electrode.

4. The display substrate of claim 3, wherein:
the drain electrode includes a first sub-drain electrode which is disposed on the semiconductor layer, and a second sub-drain electrode which is disposed on the first sub-drain electrode; and
the pixel electrode includes a first sub-pixel electrode which is disposed on the gate insulating layer and which comprises a same material as the first sub-drain electrode, and a second sub-pixel electrode which is disposed on the first sub-pixel electrode and which comprises a same material as the second sub-drain electrode.

5. The display substrate of claim 4, wherein:
a shape of the first sub-drain electrode is substantially the same as a shape of the second sub-drain electrode; and
a shape of the first sub-pixel electrode is substantially the same as a shape of the second sub-pixel electrode.

6. The display substrate of claim 4, wherein:
the first sub-pixel electrode extends from the first sub-drain electrode; and
the second sub-pixel electrode extends from the second sub-drain electrode.

7. The display substrate of claim 4, wherein:
the drain electrode further includes a third sub-drain electrode, the third sub-drain electrode being disposed on the second sub-drain electrode and comprising a transparent conductive material; and
the pixel electrode further includes a third sub-pixel electrode, the third sub-pixel electrode being disposed on the second sub-pixel electrode and comprising a same material as the third sub-drain electrode.

8. The display substrate of claim 7, wherein:
a shape of the first sub-drain electrode, a shape of the second sub-drain electrode, and a shape of the third sub-drain electrode are substantially the same; and a shape of the first sub-pixel electrode, a shape of the second sub-pixel electrode, and a shape of the third sub-pixel electrode are substantially the same.

9. The display substrate of claim 1, wherein:
at least one slit is formed in the pixel electrode; and
the common electrode has a planar shape, is disposed on the same layer as the gate electrode, and comprises a same material as the gate electrode.

10. The display substrate of claim 9, wherein the common electrode comprises a reflective metal.

11. The display substrate of claim 10, wherein:
the gate electrode includes a first sub-gate electrodes disposed on the base, and a second sub-gate electrode disposed on the first sub-gate electrode; and
the common electrode includes a first sub-common electrode disposed on the base and comprising a same material as the first sub-gate electrode, and a second sub-common electrode disposed on the first sub-common electrode and comprising a same material as the second sub-gate electrode.

12. The display substrate of claim 11, wherein:
a shape of the first sub-gate electrode is substantially the same as a shape of the second sub-gate electrode; and
a shape of the first sub-common electrode is substantially the same as a shape of the second sub-common electrode.

13. The display substrate of claim 11, wherein:
the gate electrode further includes a third sub-gate electrode disposed on the second sub-gate electrode; and
the common electrode further includes a third sub-common electrode disposed on the second sub-common electrode and comprising a same material as the third sub-gate electrode.

14. The display substrate of claim 9, further comprising:
an insulating layer disposed on the source electrode and the drain electrode, the insulating layer covering the semiconductor layer; and
a common voltage pad portion disposed on the same layer as the common electrode and electrically connected to the common electrode,
wherein a hole is formed in the gate insulating layer and the insulating layer so as to expose the common voltage pad portion.

15. The display substrate of claim 9, wherein the gate insulating layer has a portion having the same shape as the pixel electrode.

16. The display substrate of claim 1, further comprising:
an insulating layer disposed on the pixel electrode,
wherein:
the common electrode is disposed on the insulating layer and has one or more slits; and
the pixel electrode has a planar shape.

17. The display substrate of claim 16, wherein the pixel electrode comprises a reflective metal.

18. The display substrate of claim 16, further comprising:
a common voltage line disposed on the same layer as the gate electrode,
wherein:
a hole is formed in the gate insulating layer and the insulating layer so as to expose a portion of the common voltage line; and
the common electrode is electrically connected to the common voltage line through the hole.

19. A display substrate, comprising:
a base;
a semiconductor layer disposed on the base;
a gate insulating layer disposed on the base and covering the semiconductor layer;
a gate electrode disposed on the gate insulating layer and overlapping the semiconductor layer;
a common electrode disposed on the gate insulating layer and comprising a same material as the gate electrode;
an insulating layer disposed on the gate insulating layer and covering the gate electrode and the common electrode;
a source electrode and a drain electrode disposed on the insulating layer and connected to the semiconductor layer; and
a pixel electrode disposed on the insulating layer to overlap the common electrode, the pixel electrode being connected to the drain electrode so as to extend therefrom.

20. The display substrate of claim 19, wherein:
the common electrode has a planar shape; and
the pixel electrode has one or more slits.

21. The display substrate of claim 20, wherein the common electrode comprises a reflective metal.

22. The display substrate of claim 21, wherein:
the gate electrode includes a first sub-gate electrode disposed on the gate insulating layer, and a second sub-gate electrode disposed on the first sub-gate electrode; and
the common electrode includes a first sub-common electrode disposed on the gate insulating layer and comprising a same material as the first sub-gate electrode, and a second sub-common electrode disposed on the first sub-common electrode and comprising a same material as the second sub-gate electrode.

23. The display substrate of claim 22, wherein:
the gate electrode further includes a third sub-gate electrode disposed on the second sub-gate electrode and comprising a transparent conductive material; and
the common electrode further includes a third sub-common electrode disposed on the second sub-common electrode and comprising a same material as the third sub-gate electrode.

24. The display substrate of claim 19, wherein the pixel electrode comprises a same material as the drain electrode.

25. The display substrate of claim 24, wherein:
the drain electrode includes a first sub-drain electrode disposed on the insulating layer and connected to the semiconductor layer, and a second sub-drain electrode disposed on the first sub-drain electrode; and
the pixel electrode includes a first sub-pixel electrode disposed on the insulating layer and comprising a same material as the first sub-drain electrode, and a second sub-pixel electrode disposed on the first sub-pixel electrode and comprising a same material as the second sub-drain electrode.

26. The display substrate of claim 25, wherein:
a shape of the first sub-drain electrode is substantially the same as a shape of the second sub-drain electrode; and
a shape of the first sub-pixel electrode is substantially the same as a shape of the second sub-pixel electrode.

27. The display substrate of claim 25, wherein:
the first sub-pixel electrode extends from the first sub-drain electrode; and
the second sub-pixel electrode extends from the second sub-drain electrode.

28. The display substrate of claim 25, wherein:
the drain electrode further includes a third sub-drain electrode disposed on the second sub-drain electrode and comprising a transparent conductive material; and
the pixel electrode further includes a third sub-pixel electrode disposed on the second sub-pixel electrode and comprising a same material as the third sub-drain electrode.

29. The display substrate of claim 28, wherein:
a shape of the first sub-drain electrode, a shape of the second sub-drain electrode, and a shape of the third sub-drain electrode are substantially the same; and
a shape of the first sub-pixel electrode, a shape of the second sub-pixel electrode, and a shape of the third sub-pixel electrode are substantially the same.

* * * * *